(12) United States Patent
Priest

(10) Patent No.: US 12,039,230 B2
(45) Date of Patent: Jul. 16, 2024

(54) SYSTEMS AND METHODS FOR COORDINATING INITIATION, PREPARING, VETTING, SCHEDULING, CONSTRUCTING, AND IMPLEMENTING A POWER PLANT IMPLEMENTATION

(71) Applicant: ETAK Systems, LLC, Huntersville, NC (US)

(72) Inventor: Lee Priest, Charlotte, NC (US)

(73) Assignee: ETAK Systems, LLC, Huntersville, NC (US)

(*) Notice: Subject to any disclaimer, the term of this patent is extended or adjusted under 35 U.S.C. 154(b) by 795 days.

(21) Appl. No.: 17/140,553

(22) Filed: Jan. 4, 2021

(65) Prior Publication Data

US 2021/0124851 A1    Apr. 29, 2021

Related U.S. Application Data

(63) Continuation-in-part of application No. 16/881,623, filed on May 22, 2020, and a continuation-in-part of application No. 16/881,510, filed on May 22, 2020, now Pat. No. 11,184,780, and a continuation-in-part of application No. 16/881,565, filed on May 22, 2020, now Pat. No. 11,082,865, and a continuation-in-part of application No. 16/861,537, filed on Apr. 29, 2020, now Pat. No. 10,893,419, and a continuation-in-part of application No. 16/750,301, filed on Jan. 23, 2020, now Pat. No. 10,827,363, and a continuation-in-part (Continued)

(51) Int. Cl.
*G06T 17/00*   (2006.01)
*B64C 39/02*   (2023.01)
*G06F 30/13*   (2020.01)
*G06Q 50/08*   (2012.01)
*G06T 17/05*   (2011.01)
*H04W 4/24*   (2018.01)

(52) U.S. Cl.
CPC ............ *G06F 30/13* (2020.01); *B64C 39/024* (2013.01); *G06Q 50/08* (2013.01); *G06T 17/05* (2013.01); *H04W 4/24* (2013.01)

(58) Field of Classification Search
CPC ........ G06F 30/13; G06T 17/05; B64C 39/024
USPC ....................................................... 345/427
See application file for complete search history.

(56) References Cited

U.S. PATENT DOCUMENTS 4,818,990 A    4/1989   Fernandes
6,868,314 B1   3/2005   Frink
(Continued)

*Primary Examiner* — Thomas J Lett
(74) *Attorney, Agent, or Firm* — Baratta Law PLLC; Lawrence A. Baratta, Jr.; Ryan Odessa

(57) ABSTRACT

A method for constructing and implementing a power plant at a telecommunications site is disclosed. The method includes receiving data responsive to an initial site visit with the data representing field conditions of the telecommunications site. The method also includes generating a model of the existing infrastructure and generating a model of the power plant and inserting the model of the power plant into the model of the existing infrastructure. The method further includes obtaining a bill of materials for the power plant and validating the bill of materials based on the model of the power plant combined with the model of the telecommunications site and identifying type, quantity, and location of materials for acquisition. The method also includes developing a project plan for the power plant at least partially based on the model.

16 Claims, 50 Drawing Sheets

Related U.S. Application Data of application No. 15/968,131, filed on May 1, 2018, now Pat. No. 10,959,107, and a continuation-in-part of application No. 15/926,533, filed on Mar. 20, 2018, now Pat. No. 10,650,582, and a continuation-in-part of application No. 15/898,695, filed on Feb. 19, 2018, now Pat. No. 10,580,199, and a continuation-in-part of application No. 15/877,555, filed on Jan. 23, 2018, now Pat. No. 10,255,719, and a continuation-in-part of application No. 15/815,786, filed on Nov. 17, 2017, now Pat. No. 10,354,441, and a continuation-in-part of application No. 15/675,930, filed on Aug. 14, 2017, now Pat. No. 10,334,164, and a continuation-in-part of application No. 15/283,699, filed on Oct. 3, 2016, now Pat. No. 9,881,416, and a continuation-in-part of application No. 15/241,239, filed on Aug. 19, 2016, now Pat. No. 10,183,761, and a continuation-in-part of application No. 15/235,686, filed on Aug. 12, 2016, now Pat. No. 10,150,661, and a continuation-in-part of application No. 15/168,503, filed on May 31, 2016, now Pat. No. 9,704,292, and a continuation-in-part of application No. 15/160,890, filed on May 20, 2016, now Pat. No. 10,231,133, and a continuation-in-part of application No. 14/685,720, filed on Apr. 14, 2015, now Pat. No. 9,596,617.

(56) References Cited

U.S. PATENT DOCUMENTS

| | | | |
|---|---|---|---|
| 7,583,275 | B2 | 9/2009 | Neumann et al. |
| 8,346,578 | B1 | 1/2013 | Hopkins et al. |
| 9,085,363 | B2 | 7/2015 | Tofte et al. |
| 9,162,753 | B1 | 10/2015 | Panto et al. |
| 10,150,281 | B2 | 12/2018 | Sagawa et al. |
| 2001/0055013 | A1 | 12/2001 | Fuki |
| 2002/0193914 | A1 | 12/2002 | Talbert et al. |
| 2003/0144821 | A1 | 7/2003 | Lendriet |
| 2003/0210244 | A1 | 11/2003 | Sasago et al. |
| 2004/0148230 | A1 | 7/2004 | Matsui et al. |
| 2008/0140357 | A1 | 6/2008 | Bussey et al. |
| 2009/0141020 | A1 | 6/2009 | Freund et al. |
| 2009/0174703 | A1 | 7/2009 | Hermanson et al. |
| 2010/0091015 | A1 | 4/2010 | Heidel |
| 2010/0215212 | A1 | 8/2010 | Flakes, Jr. |
| 2010/0231687 | A1 | 9/2010 | Armory et al. |
| 2010/0321391 | A1 | 12/2010 | Rubin et al. |
| 2011/0069071 | A1 | 3/2011 | Karlsson |
| 2011/0221692 | A1 | 9/2011 | Seydoux et al. |
| 2011/0256886 | A1 | 10/2011 | Velusamy |
| 2011/0316855 | A1 | 12/2011 | Mejdrich et al. |
| 2012/0250010 | A1 | 10/2012 | Hannay |
| 2012/0262708 | A1 | 10/2012 | Connolly |
| 2012/0310699 | A1 | 12/2012 | McKenna et al. |
| 2013/0096873 | A1* | 4/2013 | Rosengaus ........... G01C 15/002 702/155 |
| 2013/0120367 | A1 | 5/2013 | Miller et al. |
| 2013/0120369 | A1 | 5/2013 | Miller et al. |
| 2013/0173088 | A1 | 7/2013 | Callou et al. |
| 2013/0233964 | A1 | 9/2013 | Woodworth et al. |
| 2013/0275174 | A1 | 10/2013 | Bennett et al. |
| 2013/0325217 | A1 | 12/2013 | Seydoux et al. |
| 2014/0018976 | A1 | 1/2014 | Goossen et al. |
| 2014/0032034 | A1 | 1/2014 | Raptopoulos et al. |
| 2014/0125651 | A1* | 5/2014 | Sharp .................... G01C 15/00 345/419 |
| 2014/0131510 | A1 | 5/2014 | Wang et al. |
| 2014/0277854 | A1 | 9/2014 | Jones et al. |
| 2014/0298181 | A1 | 10/2014 | Rezvan |
| 2014/0316636 | A1 | 10/2014 | Hong et al. |
| 2014/0340489 | A1 | 11/2014 | Medioni et al. |
| 2015/0029184 | A1 | 1/2015 | Masumoto |
| 2015/0088916 | A1 | 3/2015 | Stokoe et al. |
| 2015/0154786 | A1 | 6/2015 | Furukawa et al. |
| 2015/0193561 | A1 | 7/2015 | Lindberg et al. |
| 2015/0243073 | A1 | 8/2015 | Chen et al. |
| 2015/0304869 | A1 | 10/2015 | Johnson et al. |
| 2015/0347638 | A1 | 12/2015 | Patwari et al. |
| 2016/0086258 | A1 | 3/2016 | Romes et al. |
| 2016/0127712 | A1 | 5/2016 | Alfredsson et al. |
| 2016/0133049 | A1 | 5/2016 | Hill et al. |
| 2018/0150270 | A1 | 5/2018 | Harayama et al. |
| 2018/0260503 | A1 | 9/2018 | Dweik et al. |

* cited by examiner

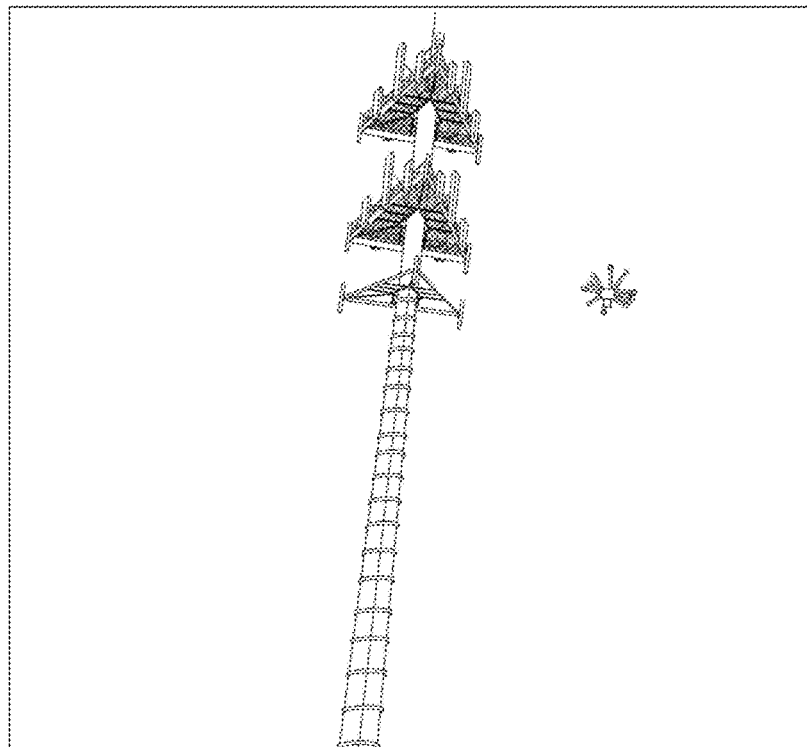

CAUSING THE UAV TO FLY A GIVEN FLIGHT PATH ABOUT A CELL TOWER AT THE CELL SITE, WHEREIN A LAUNCH LOCATION AND LAUNCH ORIENTATION IS DEFINED FOR THE UAV TO TAKE OFF AND LAND AT THE CELL SITE SUCH THAT EACH FLIGHT AT THE CELL SITE HAS THE SAME LAUNCH LOCATION AND LAUNCH ORIENTATION — 852

OBTAINING A PLURALITY OF PHOTOGRAPHS OF THE CELL SITE DURING ABOUT THE FLIGHT PLANE, WHEREIN EACH OF THE PLURALITY OF PHOTOGRAPHS IS ASSOCIATED WITH ONE OR MORE LOCATION IDENTIFIERS — 854

SUBSEQUENT TO THE OBTAINING, PROCESSING THE PLURALITY OF PHOTOGRAPHS TO DEFINE A THREE DIMENSIONAL (3D) MODEL OF THE CELL SITE BASED ON THE ASSOCIATED WITH ONE OR MORE LOCATION IDENTIFIERS AND ONE OR MORE OBJECTS OF INTEREST IN THE PLURALITY OF PHOTOGRAPHS — 856

FIG. 22

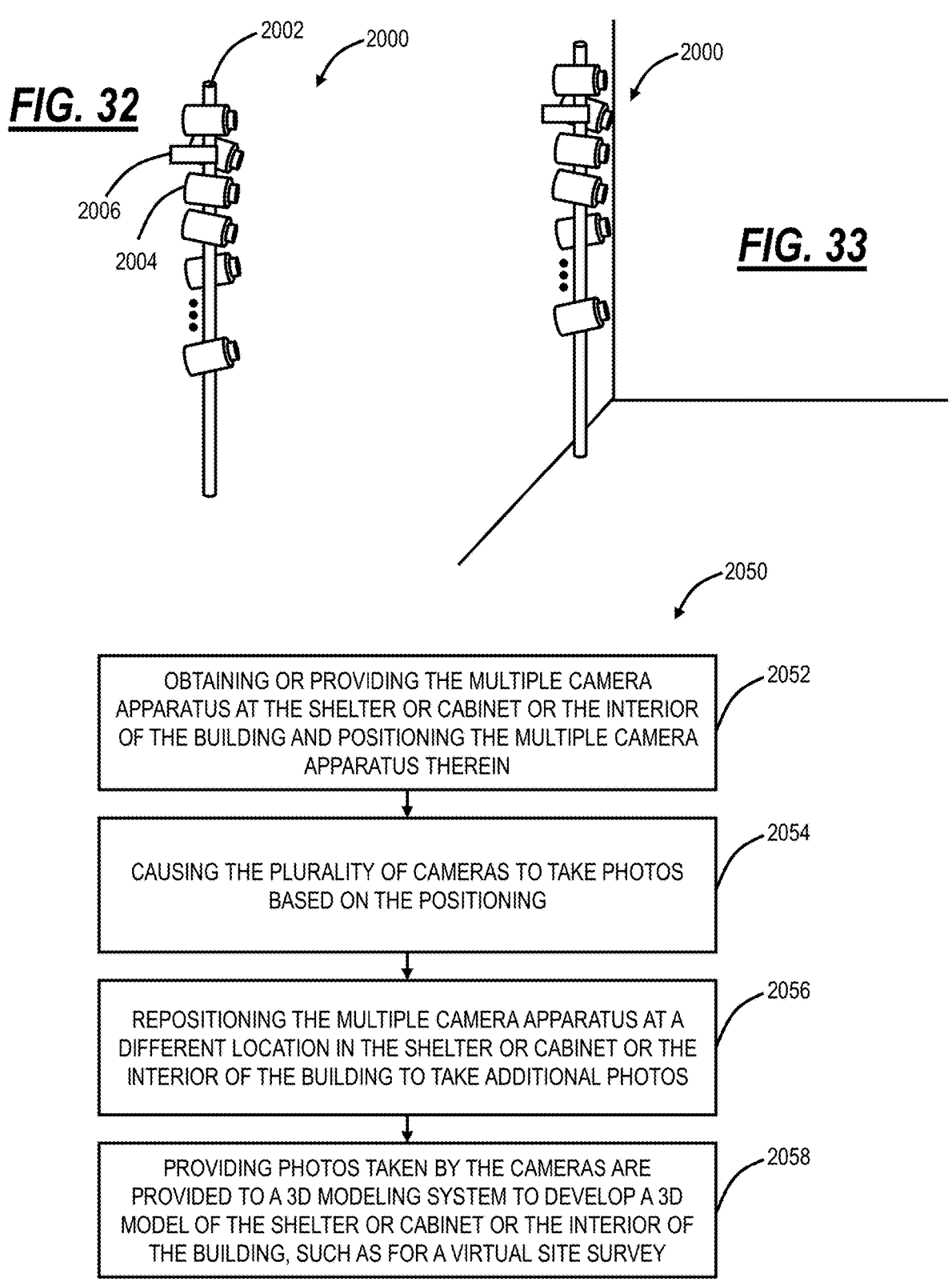

SYSTEMS AND METHODS FOR COORDINATING INITIATION, PREPARING, VETTING, SCHEDULING, CONSTRUCTING, AND IMPLEMENTING A POWER PLANT IMPLEMENTATION

CROSS-REFERENCE TO RELATED APPLICATION(S)

The present patent/application is continuation-in-part of and the content of each are incorporated by reference herein:

| Filing Date | Serial No. | Title |
| --- | --- | --- |
| May 22, 2020 | 16/881,623 | Systems and methods for coordinating initiation, preparing, vetting, scheduling, constructing, and implementing a small cell implementation |
| May 22, 2020 | 16/881,565 | Systems and methods for coordinating initiation, preparing, vetting, scheduling, constructing, and implementing a small cell implementation |
| May 22, 2020 | 16/881,510 | Systems and methods for coordinating initiation, preparing, vetting, scheduling, constructing, and implementing a small cell implementation |
| Mar. 29, 2020 | 16/861,537 | Systems and methods for coordinating initiation, preparing, vetting, scheduling, constructing, and implementing a small cell implementation |
| Jan. 23, 2020 | 16/750,301 | Systems and methods for performing a Passive Intermodulation mitigation audit at a wireless site |
| May 1, 2018 | 15/968,131 | Systems and methods for delivering a close out package for work done at a telecommunications site |
| Mar. 20, 2018 | 15/926,533 | Systems and methods for closing out maintenance or installation work at a telecommunications site |
| Feb. 19, 2018 | 15/898,695 | Systems and methods for data capture for telecommunications site modeling via a telescoping apparatus |
| Aug. 12, 2016 | 15/235,686 | Telescoping platform for operations on cell towers |
| Jan. 23, 2018 | 15/877,555 | Systems and methods for satellite data capture for telecommunications site modeling |
| Nov. 17, 2017 | 15/815,786 | Augmented reality systems and methods for telecommunications site modeling |
| Aug. 14, 2017 | 15/675,930 | Virtual 360-degree view of a telecommunications site |
| Oct. 3, 2016 | 15/283,699 | Obtaining 3D modeling data using UAVs for cell sites |
| Aug. 19, 2016 | 15/241,239 | 3D modeling of cell sites to detect configuration and site changes |
| May 31, 2016 | 15/168,503 | Virtualized site survey systems and methods for cell sites |
| May 20, 2016 | 15/160,890 | 3D modeling of cell sites and cell towers with unmanned aerial vehicles |
| Apr.14, 2015 | 14/685,720 | Unmanned aerial vehicle-based systems and methods associated with cell sites and cell towers |

FIELD OF THE DISCLOSURE

The present disclosure relates generally to telecommunication site planning and modeling. More particularly, the present disclosure relates to systems and methods for coordinating initiation of a small cell, preparing and vetting a small cell for implementation, scheduling construction of a small cell, and constructing and implementing a small cell.

BACKGROUND OF THE DISCLOSURE

Due to the geographic coverage nature of wireless service, there are hundreds of thousands of cell towers in the United States. For example, in 2014, it was estimated that there were more than 310,000 cell towers in the United States. Cell towers can have heights up to 1,500 feet or more. Furthermore, with the move to fifth generation cellular technology, a significant number of small cells are being integrated into cellular networks and installed on various forms of new and existing infrastructure. There are various requirements for cell site workers (also referred to as tower climbers or transmission tower workers) to climb cell towers and to access small cells to perform maintenance, installation, audit, and repair work for cellular phone and other wireless communications companies. This is both a dangerous and costly endeavor. For example, between 2003 and 2011, 50 tower climbers died working on cell sites (see, e.g., www.pbs.org/wgbh/pages/frontline/social-issues/cell-tower-deaths/in-race-for-better-cell-service-men-who-climb-towers-pay-with-their-lives/). Also, OSHA estimates that working on cell sites is times more dangerous than construction work, generally (see, e.g., www.propublica.org/article/cell-tower-work-fatalities-methodology). Furthermore, the tower climbs also can lead to service disruptions caused by accidents. Thus, there is a strong desire, from both a cost and safety perspective, to reduce the number of tower climbs, to shorten the access times of cellular sites including small cells, and to improve design and installation times for cellular components at cell sites and for small cells.

BRIEF DESCRIPTION OF THE DRAWINGS

The present disclosure is illustrated and described herein with reference to the various drawings, in which like reference numbers are used to denote like system components/method steps, as appropriate, and in which:

FIG. 21 is a photo of the UAV in flight at the top of a cell tower;

FIG. 22 is a flowchart of a method for modeling a cell site with an Unmanned Aerial Vehicle (UAV);

FIGS. 32 and 33 are diagrams of a multiple camera apparatus and use of the multiple camera apparatus in a shelter or cabinet or the interior of a building;

FIG. 34 is a flowchart of a data capture method in the interior of a building using the multiple camera apparatus;

DETAILED DESCRIPTION OF THE DISCLOSURE

Figure 1:
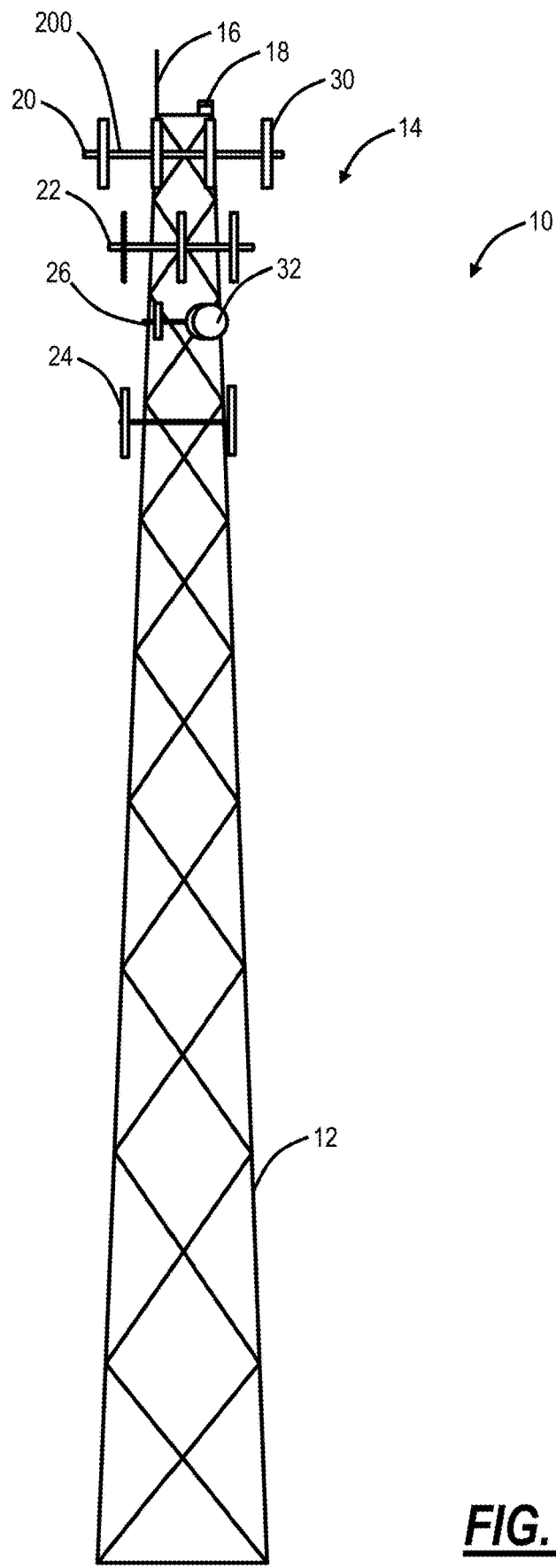
FIG. 1 is a diagram of a side view of an example cell site.

The present disclosure relates to systems and methods for coordinating initiation of a power plant at a telecommunications site, preparing and vetting a power plant for implementation, scheduling construction of a power plant, and constructing and implementing a power plant. In embodiments, data of the infrastructure can be captured and used to coordinate and validate the initiation of a power plant, to prepare for and vet power plant implementation, scheduling, and construction thereof.

The present disclosure relates to systems and methods for coordinating initiation of a small cell, preparing and vetting a small cell for implementation, scheduling construction of a small cell, and constructing and implementing a small cell. In embodiments, data of the infrastructure can be captured and used to coordinate and validate the initiation of a small cell, to prepare for and vet small cell implementation, scheduling, and construction thereof.

Further, present disclosure relates to systems and methods for performing a Passive Intermodulation (PIM) mitigation audit at a wireless site. The PIM mitigation audit can be performed based on various measurements that can be obtained via data capture through an Unmanned Aerial Vehicle (UAV) ("drones"), satellite data capture, plane data capture, ground-based data capture, etc. along with a three-dimensional (3D) model. The objective of such a PIM mitigation audit is to determine PIM risks, without requiring physical testing, without requiring tower climbs, etc.

Further, the present disclosure relates to systems and methods for an augmented reality add-in of equipment and structures at a telecommunications site. Further, the present disclosure relates to systems and methods for data capture for telecommunication site modeling such as three-dimensional (3D) modeling for engineering and planning via a telescoping apparatus. The systems and methods utilize the telescoping apparatus with a camera attached thereto to obtain data capture for a 3D model. Specifically, the systems and methods include a telescoping apparatus, a mobile unit with the telescoping apparatus, and an associated method for 3D modeling. Conventional approaches rely on ground-based data capture, i.e., high-performance digital cameras with zoom. However, this data capture at the top or middle of the cell tower is at an angle which is the same angle around a 360-degree view of the cell tower. This causes difficulty in creating the 3D model as the camera is not parallel to the object of interest or able to change the angle of the data capture of the object of interest.

Further, the present disclosure relates to systems and methods for satellite data capture for telecommunication site modeling such as 3D modeling for engineering and planning. Specifically, the systems and methods can utilize satellites to obtain photos/video of a cell site. With this data capture and optionally with other data capture such as via Unmanned Aerial Vehicles (UAVs), site visits, etc., the data capture is used to develop a 3D model of the telecommunications site. Advantageously, the satellite data capture can provide highly detailed photographs and removes the requirement for site visits which is key given the number of cell sites. The 3D model can be used for various functions related to planning, engineering, installation, and the like.

Further, the present disclosure relates to augmented reality systems and methods for telecommunication site engineering and planning. With the augmented reality systems and methods, a user can incorporate 3D objects into a virtual model via data capture from a phone, a tablet, a digital camera, etc. including a digital camera on a UAV, small Unmanned Aircraft System (sUAS), etc. The systems and methods include techniques to scan objects to create virtual objects and to incorporate the virtual objects in existing views. For example, a cell tower and the like can be virtually placed in an augmented reality view. The systems and methods also include techniques for 3D model creation.

Variously, the systems and methods can be used for a cell site or other telecommunication sites for planning, engineering, installation, and the like.

Further, the present disclosure relates to systems and methods for a virtual 360-degree view modification of a telecommunications site, such as a cell site, for purposes of planning, engineering, and installation, and the like. The systems and methods include a 3D model of the telecommunications site, including exterior and surrounding geography as well as internal facilities. Various techniques are utilized for data capture including the use of a UAV. With the 3D model, various modifications and additions are added after the fact, i.e., to a preexisting environment, for the purposes of planning, engineering, and installation. Advantageously, the modified 3D model saves time in site inspection and engineering, improves the accuracy of planning and installation, and decreases the after installation changes increasing the overall planning phase of construction and telecommunication operations.

Further, the present disclosure relates to systems and methods for a virtual 360-degree view of a telecommunications site, such as a cell site, for purposes of site surveys, site audits, and the like. The objective of the virtual 360 view is to provide an environment, viewable via a display, where personnel can be within the telecommunications site remotely. That is, the purpose of the virtual 360 view creation is to allow industry workers to be within the environment of the location captured (i.e., cellular telecommunications site). Within this environment, there is an additional augmented reality where a user can call information from locations of importance. This environment can serve as a bid walk, pre-construction verification, post-installation verification, or simply as an inventory measurement for companies. The information captured with the virtual 360 view captures the necessary information to create action with respect to maintenance, upgrades, or the like. This actionable information creates an environment that can be passed from tower owner, carrier owner, construction company, and installation crews with the ease of an email with a Uniform Resource Locator (URL) link to the web. This link can be sent to a user's phone, Virtual Reality (VR) headset, computer, tablet, etc. This allows for a telecom engineer to be within the reality of the cell site or telecommunications site from their desk. For example, the engineer can click on an Alternating Current (AC) panel and a photo is overlaid in the environment showing the engineer the spaces available for additional breakers or the sizes of breakers being used.

Further, the present disclosure relates to systems and methods for verifying cell sites using accurate 3D modeling data. In an embodiment, systems and method for verifying a cell site utilizing an UAV include providing an initial point cloud related to the cell site to the UAV; developing a second point cloud based on current conditions at the cell site, wherein the second point cloud is based on data acquisition using the UAV at the cell site; detecting variations between the initial point cloud and the second point cloud; and, responsive to detecting the variations, determining whether the variations are any of compliance related, load issues, and defects associated with any equipment or structures at the cell site.

Further, the present disclosure relates to systems and methods for obtaining accurate 3D modeling data using a multiple camera apparatus. Specifically, the multiple camera apparatus contemplates use in a shelter or the like to simultaneously obtain multiple photos for purposes of developing a 3D model of the shelter for use in a cell site audit or the like. The multiple camera apparatus can be portable or mounted within the shelter. The multiple camera apparatus includes a support beam with a plurality of cameras associated therewith. The plurality of cameras each face a different direction, angle, zoom, etc. and are coordinated to simultaneously obtain photos. Once obtained, the photos can be used to create a 3D model. Advantageously, the multiple camera apparatus streamlines data acquisition time as well as ensures the proper angles and photos are obtained. The multiple camera apparatus also is simple to use allowing untrained technicians the ability to easily perform data acquisition.

Further, the present disclosure relates to systems and methods for obtaining 3D modeling data using UAVs (also referred to as "drones") or the like at cell sites, cell towers, etc. Variously, the systems and methods describe various techniques using UAVs or the like to obtain data, i.e., pictures and/or video, used to create a 3D model of a cell site subsequently. Various uses of the 3D model are also described including site surveys, site monitoring, engineering, etc.

Further, the present disclosure relates to virtualized site survey systems and methods using 3D) modeling of cell sites and cell towers with and without unmanned aerial vehicles. The virtualized site survey systems and methods utilizing photo data capture along with location identifiers, points of interest, etc. to create 3D modeling of all aspects of the cell sites, including interiors of buildings, cabinets, shelters, huts, hardened structures, etc. As described herein, a site survey can also include a site inspection, cell site audit, or anything performed based on the 3D model of the cell site including building interiors. With the data capture, 3D modeling can render a completely virtual representation of the cell sites. The data capture can be performed by on-site personnel, automatically with fixed, networked cameras, or a combination thereof. With the data capture and the associated 3D model, engineers and planners can perform site surveys, without visiting the sites leading to significant efficiency in cost and time. From the 3D model, any aspect of the site survey can be performed remotely including determinations of equipment location, accurate spatial rendering, planning through drag and drop placement of equipment, access to actual photos through a Graphical User Interface, indoor texture mapping, and equipment configuration visualization mapping the equipment in a 3D view of a rack.

Further, the present disclosure relates to 3D modeling of cell sites and cell towers with unmanned aerial vehicles. The present disclosure includes UAV-based systems and methods for 3D modeling and representing of cell sites and cell towers. The systems and methods include obtaining various pictures via a UAV at the cell site, flying around the cell site to obtain various different angles of various locations, tracking the various pictures (i.e., enough pictures to produce an acceptable 3D model, usually hundreds, but could be more) with location identifiers, and processing the various pictures to develop a 3D model of the cell site and the cell tower. Additionally, the systems and methods focus on precision and accuracy ensuring the location identifiers are as accurate as possible for the processing by using multiple different location tracking techniques as well as ensuring the UAV is launched from the same location and/or orientation for each flight. The same location and/or orientation, as described herein, was shown to provide more accurate location identifiers versus arbitrary location launches and orientations for different flights. Additionally, once the 3D model is constructed, the systems and methods include an application which enables cell site owners and cell site operators to "click" on any location and obtain associated photos, something extremely useful in the ongoing maintenance and operation thereof. Also, once constructed, the 3D model is capable of various measurements including height, angles, thickness, elevation, even Radio Frequency (RF), and the like.

§ 1.0 Example Cell Site

FIG. 1 is a diagram of a side view of an example cell site 10. The cell site 10 includes a cell tower 12. The cell tower 12 can be any type of elevated structure, such as 100-200 feet/30-60 meters tall. Generally, the cell tower 12 is an elevated structure for holding cell site components 14. The cell tower 12 may also include a lightning rod 16 and a warning light 18. Of course, there may various additional components associated with the cell tower 12 and the cell site 10 which are omitted for illustration purposes. In this embodiment, there are four sets 20, 22, 24, 26 of cell site components 14, such as for four different wireless service providers. In this example, the sets 20, 22, 24 include various antennas 30 for cellular service. The sets 20, 22, 24 are deployed in sectors, e.g., there can be three sectors for the cell site components—alpha, beta, and gamma. The antennas 30 are used to both transmit a radio signal to a mobile device and receive the signal from the mobile device. The antennas 30 are usually deployed as a single, groups of two, three or even four per sector. The higher the frequency of spectrum supported by the antenna 30, the shorter the antenna 30. For example, the antennas 30 may operate around 850 MHz, 1.9 GHz, and the like. The set 26 includes a microwave dish 32 which can be used to provide other types of wireless connectivity, besides cellular service. There may be other embodiments where the cell tower 12 is omitted and replaced with other types of elevated structures such as roofs, water tanks, etc.

§ 2.0 Example Small Cells

Figure 2:
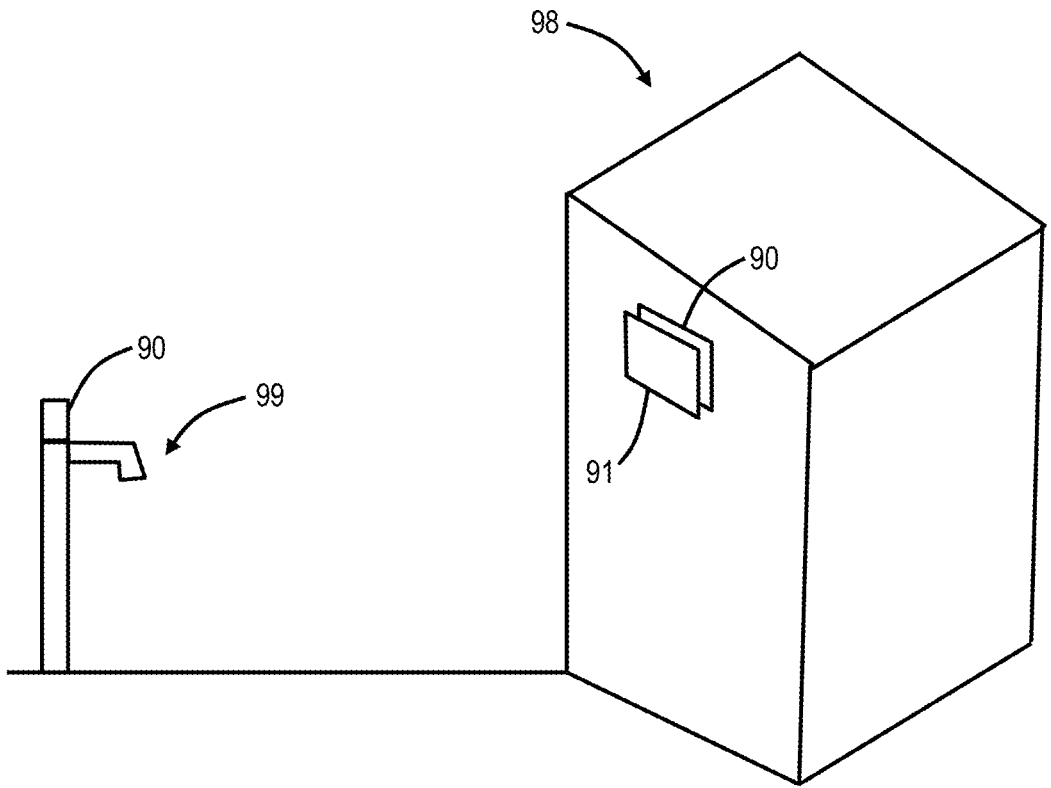
FIG. 2 is a perspective diagram of example small cells mounted to existing infrastructure.

FIG. 2 is a perspective diagram of example small cells mounted to existing infrastructure. To address the increasing demand of mobile broadband data subscribers and the increase of bandwidth-intensive services used by those subscribers, networks operators are expanding the networks heterogeneously. These heterogenous networks including large cells, such as the cell site components 14 on cell towers 12, such as the cell tower shown in FIG. 1, and small cells 90. Small cells 90 include similar components to those of the cell site components 14, but at a smaller scale with a series of small low-powered antennas. These antennas operate at higher frequencies with shorter ranges. With the transition to fifth generation cellular technology, these small cells are becoming an integral aspect of mobile broadband networks. As can be seen in FIG. 2, small cells 90 can be attached to existing infrastructure, such as light poles 99, buildings 98, and other structures. Small cells 90 have a variety of shapes and sizes, which can be selected based on the infrastructure the small cell 90 are mounted on. In embodiments, small cells 90 include one or more panels 91 that are opened to access the components therein. In some embodiments, the one or more panels 91 are configured to be opened mechanically by an unmanned aerial vehicle (UAV), or by the small cell 90 upon detection of or based on instructions received from the UAV.

While much of the description below is described with regards to large cells, such as cell site 10 shown in FIG. 1, the methods and disclosure below is equally applicable to small cells 90 and the infrastructure that small cells 90 are mounted on.

§ 3.0 Cell Site Audits Via UAV

Figure 3:
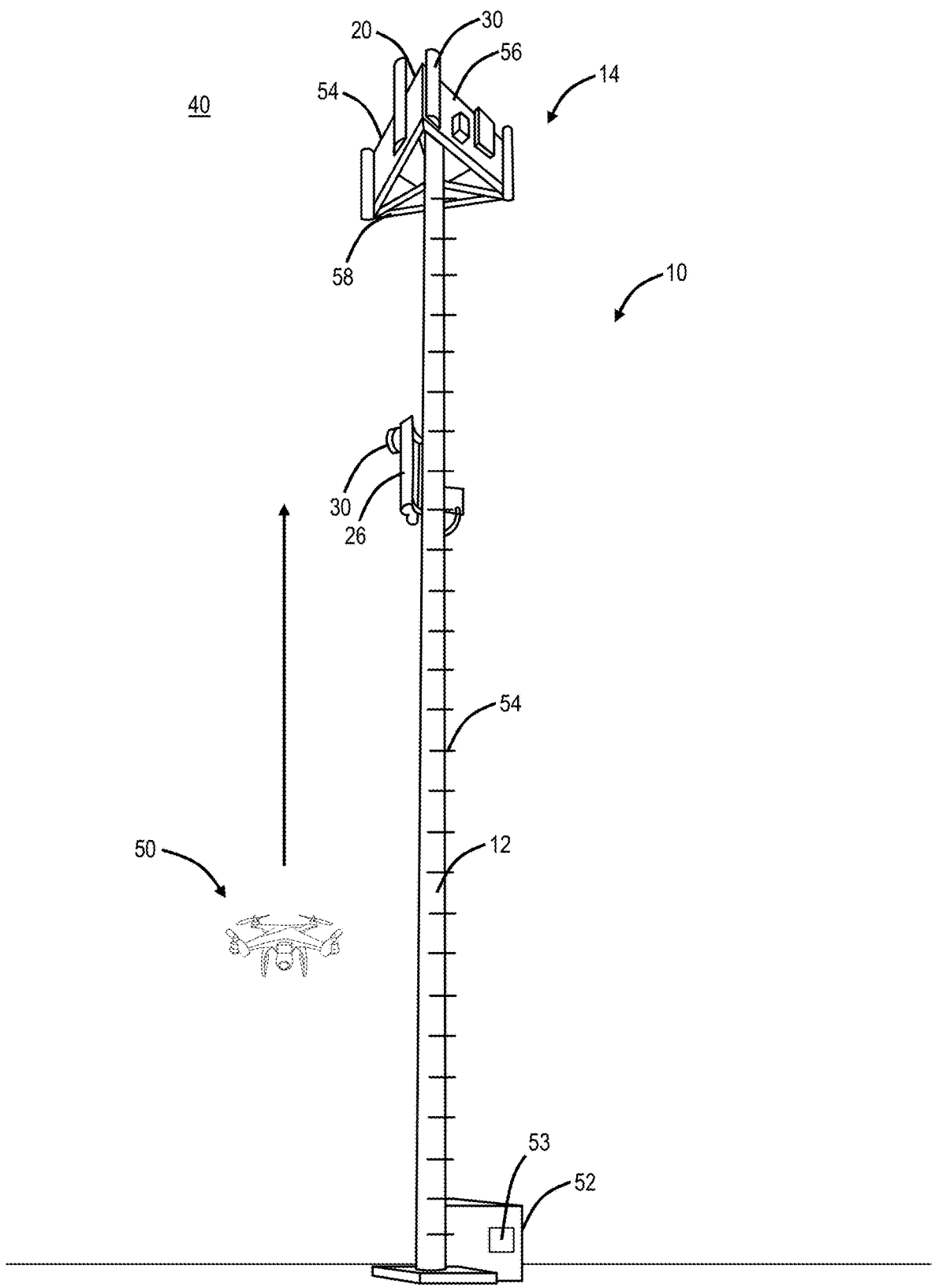
FIG. 3 is a diagram of a cell site audit performed with a UAV.

FIG. 3 is a diagram of a cell site audit 40 performed with a UAV 50. As described herein, the cell site audit 40 is used by service providers, third-party engineering companies, tower operators, etc. to check and ensure proper installation, maintenance, and operation of the cell site components 14 and shelter or cabinet 52 equipment as well as the various interconnections between them. From a physical accessibility perspective, the cell tower 12 includes a climbing mechanism 54 for tower climbers to access the cell site components 14. FIG. 3 includes a perspective view of the cell site 10 with the sets 20, 26 of the cell site components 14. The cell site components 14 for the set 20 include three sectors—alpha sector 54, beta sector 56, and gamma sector 58.

In an embodiment, the UAV 50 is utilized to perform the cell site audit 40 in lieu of a tower climber access the cell site components 14 via the climbing mechanism 54. In the cell site audit 40, an engineer/technician is local to the cell site 10 to perform various tasks. The systems and methods described herein eliminate a need for the engineer/technician to climb the cell tower 12. Of note, it is still important for the engineer/technician to be local to the cell site 10 as various aspects of the cell site audit 40 cannot be done remotely as described herein. Furthermore, the systems and methods described herein provide an ability for a single engineer/technician to perform the cell site audit 40 without another person handling the UAV 50 or a person with a pilot's license operating the UAV 50 as described herein.

§ 3.1 Cell Site Audit

In general, the cell site audit 40 is performed to gather information and identify a state of the cell site 10. This is used to check the installation, maintenance, and/or operation of the cell site 10. Various aspects of the cell site audit 40 can include, without limitation:

Verify the cell site 10 is built according to a current revision
Verify Equipment Labeling
Verify Coax Cable ("Coax") Bend Radius
Verify Coax Color Coding/Tagging
Check for Coax External Kinks & Dents
Verify Coax Ground Kits
Verify Coax Hanger/Support
Verify Coax Jumpers
Verify Coax Size
Check for Connector Stress & Distortion
Check for Connector Weatherproofing
Verify Correct Duplexers/Diplexers Installed
Verify Duplexer/Diplexer Mounting
Verify Duplexers/Diplexers Installed Correctly
Verify Fiber Paper
Verify Lacing & Tie Wraps
Check for Loose or Cross-Threaded Coax Connectors
Verify Return ("Ret") Cables
Verify Ret Connectors
Verify Ret Grounding
Verify Ret Installation
Verify Ret Lightning Protection Unit (LPI)
Check for Shelter/Cabinet Penetrations
Verify Surge Arrestor Installation/Grounding
Verify Site Cleanliness
Verify LTE GPS Antenna Installation Of note, the cell site audit 40 includes gathering information at and inside the shelter or cabinet 52, on the cell tower 12, and at the cell site components 14. Note, it is not possible to perform all of the above items solely with the UAV 50 or remotely.

Infrastructure mounted small cells 90 generally do not include any type of climbing mechanism attached thereto, but rather require the use of further equipment that must be brought by the technician to access the small cells 90. The use of the UAV 50 to audit small cells 90 limits the equipment needed to audit the small cells 90, limits or eliminates the time a technician is in an elevated position next to the small cells 90, and allows for capture of images at a variety of angles in order to sufficiently inspect the small cells 90. In embodiments, the small cells 90 are audited with one or more of the cover of the small cells 90 on, the cover removed by the technician, the cover removed by the UAV 90 (where the UAV 90 is controlled or programmed to do so), one or more panels 91 of the small cells 90 opened by the UAV 90, and one or more of the panels 91 of the small cells 90 opened by the small cells 90.

§ 4.0 Piloting the UAV at the Cell Site

It is important to note that the Federal Aviation Administration (FAA) is in the process of regulating commercial UAV (drone) operation. It is expected that these regulations would not be complete until 2016 or 2017. In terms of these regulations, commercial operation of the UAV 50, which would include the cell site audit 40, requires at least two people, one acting as a spotter and one with a pilot's license. These regulations, in the context of the cell site audit 40, would make use of the UAV 50 impractical. To that end, the systems and methods described herein propose operation of the UAV 50 under FAA exemptions which allow the cell site audit 40 to occur without requiring two people and without requiring a pilot's license. Here, the UAV 50 is constrained to fly up and down at the cell site 10 and within a three-dimensional (3D) rectangle at the cell site components. These limitations on the flight path of the UAV 50 make the use of the UAV 50 feasible at the cell site 10.

Figure 4:
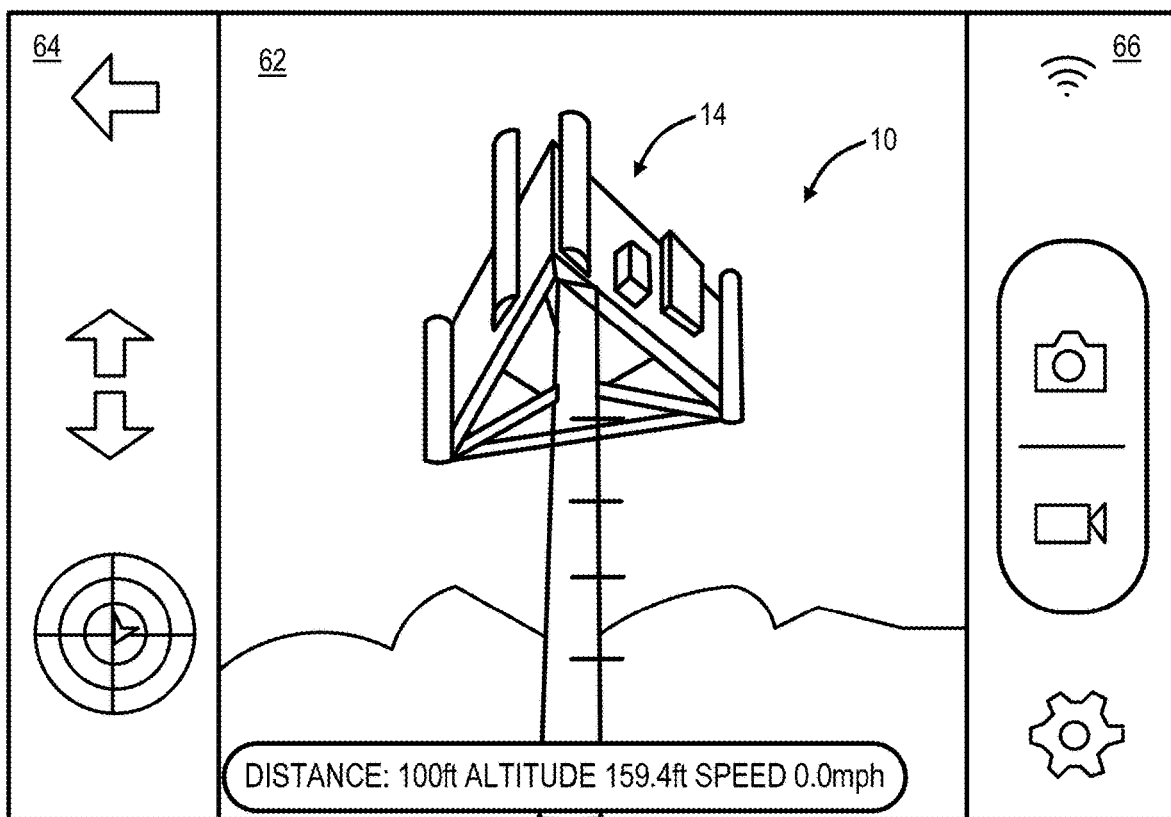
FIG. 4 is a screen diagram of a view of a graphical user interface (GUI) on a mobile device while piloting the UAV.

FIG. 4 is a screen diagram of a view of a graphical user interface (GUI) 60 on a mobile device 100 while piloting the UAV 50. The GUI 60 provides a real-time view to the engineer/technician piloting the UAV 50. That is, a screen 62 provides a view from a camera on the UAV 50. As shown in FIG. 4, the cell site 10 is shown with the cell site components 14 in the view of the screen 62. Also, the GUI 60 has various controls 64, 66. The controls 64 are used to pilot the UAV 50, and the controls 66 are used to perform functions in the cell site audit 40 and the like.

§ 4.1 FAA Regulations

The FAA is overwhelmed with applications from companies interested in flying drones, but the FAA is intent on keeping the skies safe. Currently, approved exemptions for flying drones include tight rules. Once approved, there is some level of certification for drone operators along with specific rules such as speed limit of 100 mph, height limitations such as 400 ft, no-fly zones, day only operation, documentation, and restrictions on aerial filming. Accordingly, flight at or around cell towers is constrained, and the systems and methods described herein fully comply with the relevant restrictions associated with drone flights from the FAA.

§ 5.0 Example Hardware

Figure 5:
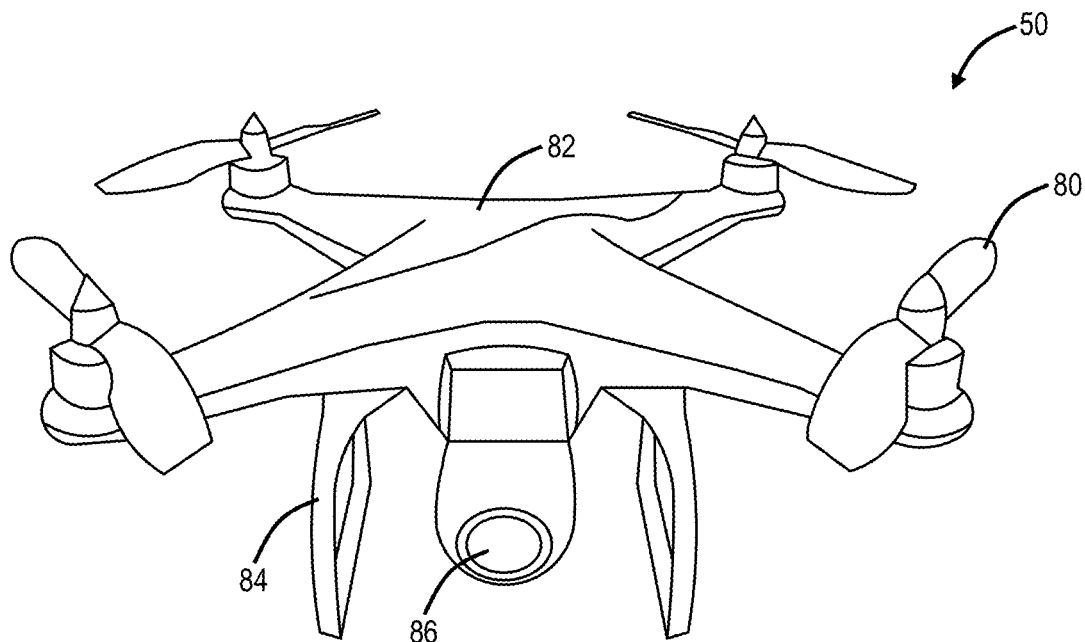
FIG. 5 is a perspective view of an example UAV.

FIG. 5 is a perspective view of an example UAV 50 for use with the systems and methods described herein. Again, the UAV 50 may be referred to as a drone or the like. The UAV 50 may be a commercially available UAV platform that has been modified to carry specific electronic components as described herein to implement the various systems and methods. The UAV 50 includes rotors 80 attached to a body 82. A lower frame 84 is located on a bottom portion of the body 82, for landing the UAV 50 to rest on a flat surface and absorb impact during landing. The UAV 50 also includes a camera 86 which is used to take still photographs, video, and the like. Specifically, the camera 86 is used to provide the real-time display on the screen 62. The UAV 50 includes various electronic components inside the body 82 and/or the camera 86 such as, without limitation, a processor, a data store, memory, a wireless interface, and the like. Also, the UAV 50 can include additional hardware, such as robotic arms or the like that allow the UAV 50 to attach/detach components for the cell site components 14. Specifically, it is expected that the UAV 50 will get bigger and more advanced, capable of carrying significant loads, and not just a wireless camera. The present disclosure contemplates using the UAV 50 for various aspects at the cell site 10, including participating in construction or deconstruction of the cell tower 12, the cell site components 14, etc.

These various components are now described with reference to a mobile device 100. Those of ordinary skill in the art will recognize the UAV 50 can include similar components to the mobile device 100. Of note, the UAV 50 and the mobile device 100 can be used cooperatively to perform various aspects of the cell site audit 40 described herein. In other embodiments, the UAV 50 can be operated with a controller instead of the mobile device 100. The mobile device 100 may solely be used for real-time video from the camera 86 such as via a wireless connection (e.g., IEEE 802.11 or variants thereof). Some portions of the cell site audit 40 can be performed with the UAV 50, some with the mobile device 100, and others solely by the operator through a visual inspection. In some embodiments, all of the aspects can be performed in the UAV 50. In other embodiments, the UAV 50 solely relays data to the mobile device 100 which performs all of the aspects. Other embodiments are also contemplated.

Figure 6:
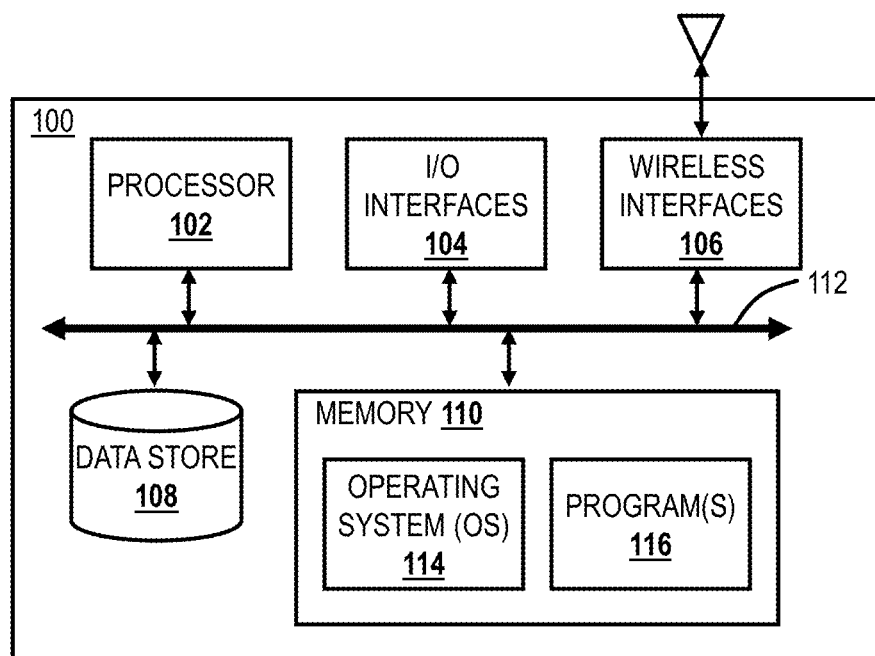
FIG. 6 is a block diagram of a mobile device.

FIG. 6 is a block diagram of a mobile device 100 or a general computing device, which may be used for the cell site audit 40, cell site modeling, cell site coordination, cell site vetting, cell site scheduling, or the like. The mobile device 100 can be a digital device that, in terms of hardware architecture, generally includes a processor 102, input/output (I/O) interfaces 104, wireless interfaces 106, a data store 108, and memory 110. It should be appreciated by those of ordinary skill in the art that FIG. 6 depicts the mobile device 100 in an oversimplified manner, and a practical embodiment may include additional components and suitably configured processing logic to support known or conventional operating features that are not described in detail herein. The components (102, 104, 106, 108, and 102) are communicatively coupled via a local interface 112. The local interface 112 can be, for example, but not limited to, one or more buses or other wired or wireless connections, as is known in the art. The local interface 112 can have additional elements, which are omitted for simplicity, such as controllers, buffers (caches), drivers, repeaters, and receivers, among many others, to enable communications. Further, the local interface 112 may include address, control, and/or data connections to enable appropriate communications among the aforementioned components.

The processor 102 is a hardware device for executing software instructions. The processor 102 can be any custom made or commercially available processor, a central processing unit (CPU), an auxiliary processor among several processors associated with the mobile device 100, a semiconductor-based microprocessor (in the form of a microchip or chip set), or generally any device for executing software instructions. When the mobile device 100 is in operation, the processor 102 is configured to execute software stored within the memory 110, to communicate data to and from the memory 110, and to generally control operations of the mobile device 100 pursuant to the software instructions. In an embodiment, the processor 102 may include a mobile-optimized processor such as optimized for power consumption and mobile applications. The I/O interfaces 104 can be used to receive user input from and/or for providing system output. User input can be provided via, for example, a keypad, a touch screen, a scroll ball, a scroll bar, buttons, barcode scanner, and the like. System output can be provided via a display device such as a liquid crystal display (LCD), touch screen, and the like. The I/O interfaces 104 can also include, for example, a serial port, a parallel port, a small computer system interface (SCSI), an infrared (IR) interface, a radio frequency (RF) interface, a universal serial bus (USB) interface, and the like. The I/O interfaces 104 can include a graphical user interface (GUI) that enables a user to interact with the mobile device 100. Additionally, the I/O interfaces 104 may further include an imaging device, i.e., camera, video camera, etc.

The wireless interfaces 106 enable wireless communication to an external access device or network. Any number of suitable wireless data communication protocols, techniques, or methodologies can be supported by the wireless interfaces 106, including, without limitation: RF; IrDA (infrared); Bluetooth; ZigBee (and other variants of the IEEE 802.15 protocol); IEEE 802.11 (any variation); IEEE 802.16 (WiMAX or any other variation); Direct Sequence Spread Spectrum; Frequency Hopping Spread Spectrum; Long Term Evolution (LTE); cellular/wireless/cordless telecommunication protocols (e.g. 3G/4G, etc.); wireless home network communication protocols; paging network protocols; magnetic induction; satellite data communication protocols; wireless hospital or health care facility network protocols such as those operating in the WMTS bands; GPRS; proprietary wireless data communication protocols such as variants of Wireless USB; and any other protocols for wireless communication. The wireless interfaces 106 can be used to communicate with the UAV 50 for command and control as well as to relay data therebetween. The data store 108 may be used to store data. The data store 108 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 108 may incorporate electronic, magnetic, optical, and/or other types of storage media.

The memory 110 may include any of volatile memory elements (e.g., random access memory (RAM, such as DRAM, SRAM, SDRAM, etc.)), nonvolatile memory elements (e.g., ROM, hard drive, etc.), and combinations thereof. Moreover, the memory 110 may incorporate electronic, magnetic, optical, and/or other types of storage media. Note that the memory 110 may have a distributed architecture, where various components are situated remotely from one another but can be accessed by the processor 102. The software in memory 110 can include one or more software programs, each of which includes an ordered listing of executable instructions for implementing logical functions. In the example of FIG. 6, the software in the memory 110 includes a suitable operating system (O/S) 114 and programs 116. The operating system 114 essentially controls the execution of other computer programs and provides scheduling, input-output control, file and data management, memory management, and communication control and related services. The programs 116 may include various applications, add-ons, etc. configured to provide end-user functionality with the mobile device 100, including performing various aspects of the systems and methods described herein.

It will be appreciated that some embodiments described herein may include one or more generic or specialized processors ("one or more processors") such as microprocessors, digital signal processors, customized processors, and field programmable gate arrays (FPGAs) and unique stored program instructions (including both software and firmware) that control the one or more processors to implement, in conjunction with certain non-processor circuits, some, most, or all of the functions of the methods and/or systems described herein. Alternatively, some or all functions may be implemented by a state machine that has no stored program instructions, or in one or more application specific integrated circuits (ASICs), in which each function or some combinations of certain of the functions are implemented as custom logic. Of course, a combination of the aforementioned approaches may be used. Moreover, some embodiments may be implemented as a non-transitory computer-readable storage medium having computer readable code stored thereon for programming a computer, server, appliance, device, etc. each of which may include a processor to perform methods as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, the software can include instructions executable by a processor that, in response to such execution, cause a processor or any other circuitry to perform a set of operations, steps, methods, processes, algorithms, etc.

§ 5.1 RF Sensors in the UAV

In an embodiment, the UAV 50 can also include one or more RF sensors disposed therein. The RF sensors can be any device capable of making wireless measurements related to signals associated with the cell site components 14, i.e., the antennas. In an embodiment, the UAV 50 can be further configured to fly around a cell zone associated with the cell site 10 to identify wireless coverage through various measurements associated with the RF sensors.

§ 6.0 Cell Site Audit with UAV and/or Mobile Device

Figure 7:
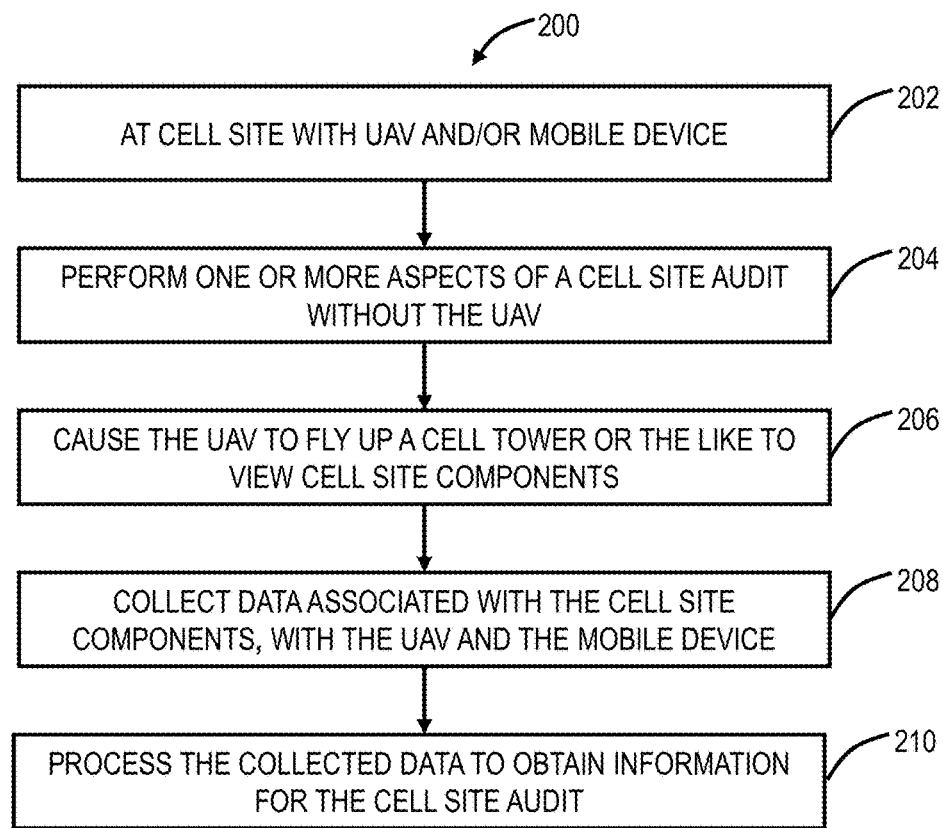
FIG. 7 is a flowchart of a cell site audit method utilizing the UAV and the mobile device.

FIG. 7 is a flowchart of a cell site audit method 200 utilizing the UAV 50 and the mobile device 100. Again, in various embodiments, the cell site audit 40 can be performed with the UAV 50 and the mobile device 100. In other embodiments, the cell site audit 40 can be performed with the UAV 50 and an associated controller. In other embodiments, the mobile device 100 is solely used to relay real-time video from the camera 86. While the steps of the cell site audit method 200 are listed sequentially, those of ordinary skill in the art will recognize some or all of the steps may be performed in a different order. The cell site audit method 200 includes an engineer/technician at a cell site with the UAV 50 and the mobile device 100 (step 202). Again, one aspect of the systems and methods described herein is the usage of the UAV 50, in a commercial setting, but with constraints such that only one operator is required and such that the operator does not have to hold a pilot's license. As described herein, the constraints can include a flight of the UAV 50 at or near the cell site 10 only, a flight pattern up and down in a 3D rectangle at the cell tower 12, a maximum height restriction (e.g., 500 feet or the like), and the like. For example, the cell site audit 40 is performed by one of i) a single operator flying the UAV 50 without a license or ii) two operators including one with a license and one to spot the UAV 50.

The engineer/technician performs one or more aspects of the cell site audit 40 without the UAV 50 (step 204). Note, there are many aspects of the cell site audit 40 as described herein. It is not possible for the UAV 50 to perform all of these items such that the engineer/technician could be remote from the cell site 10. For example, access to the shelter or cabinet 52 for audit purposes requires the engineer/technician to be local. In this step, the engineer/technician can perform any audit functions as described herein that do not require climbing.

The engineer/technician can cause the UAV 50 to fly up the cell tower 12 or the like to view cell site components 14 (step 206). Again, this flight can be based on the constraints, and the flight can be through a controller and/or the mobile device 100. The UAV 50 and/or the mobile device 100 can collect data associated with the cell site components 14 (step 208), and process the collected data to obtain information for the cell site audit 40 (step 210). As described herein, the UAV 50 and the mobile device 100 can be configured to collect data via video and/or photographs. The engineer/technician can use this collected data to perform various aspects of the cell site audit 40 with the UAV 50 and the mobile device 100 and without a tower climb.

The foregoing descriptions detail specific aspects of the cell site audit 40 using the UAV 50 and the mobile device 100. In these aspects, data can be collected—generally, the data is video or photographs of the cell site components 14. The processing of the data can be automated through the UAV 50 and/or the mobile device 100 to compute certain items as described herein. Also, the processing of the data can be performed either at the cell site 10 or afterward by the engineer/technician.

In an embodiment, the UAV 50 can be a commercial, "off-the-shelf" drone with a Wi-Fi enabled camera for the camera 86. Here, the UAV 50 is flown with a controller pad which can include a joystick or the like. Alternatively, the UAV 50 can be flown with the mobile device 100, such as with an app installed on the mobile device 100 configured to control the UAV 50. The Wi-Fi enabled camera is configured to communicate with the mobile device 100—to both display real-time video and audio as well as to capture photos and/or video during the cell site audit 40 for immediate processing or for later processing to gather relevant information about the cell site components 14 for the cell site audit 40.

In another embodiment, the UAV 50 can be a so-called "drone in a box" which is preprogrammed/configured to fly a certain route, such as based on the flight constraints described herein. The "drone in a box" can be physically transported to the cell site 10 or actually located there. The "drone in a box" can be remotely controlled as well.

§ 6.1 Antenna Down Tilt Angle

In an aspect of the cell site audit 40, the UAV 50 and/or the mobile device 100 can be used to determine a down tilt angle of individual antennas 30 of the cell site components 14. The down-tilt angle can be determined for all of the antennas 30 in all of the sectors 54, 56, 58. The down-tilt angle is the mechanical (external) down tilt of the antennas 30 relative to a support bar 200. In the cell site audit 40, the down-tilt angle is compared against an expected value, such as from a Radio Frequency (RF) data sheet, and the comparison may check to ensure the mechanical (external) down tilt is within ±1.0° of specification on the RF data sheet.

Using the UAV 50 and/or the mobile device 100, the down-tilt angle is determined from a photo taken from the camera 86. In an embodiment, the UAV 50 and/or the mobile device 100 is configured to measure three points—two defined by the antenna 30 and one by the support bar 200 to determine the down tilt angle of the antenna 30. For example, the down-tilt angle can be determined visually from the side of the antenna 30—measuring a triangle formed by a top of the antenna 30, a bottom of the antenna 30, and the support bar 200.

In some embodiments for inspecting small cells 90, the cover of the small cells 90 is removed prior to using the UAV 50 to determine the down tilt angle of individual antennas 30.

In other embodiments for inspecting small cells 90, one or more panels 91 of the cover is opened prior to using the UAV 50. In some of these embodiments, the UAV 50 mechanically interfaces with the cover to cause the one or more panels 91 to open. In one embodiment, the cover includes a screw drive that the UAV 50 interfaces with and turns to cause the one or more panels 91 to open. The screw drive is one of a slotted drive, a cruciform drive, a square drive, an internal hex drive, and the like. Optionally, the screw drive is a non-standard proprietary screw drive used to prevent tampering with the small cells 90.

In some embodiments, the small cells 90 are configured to open the one or more panels based on one of wireless communication with and detection of the UAV 50. In embodiments, the wireless communication includes a passkey exchange to authenticate the UAV 50 prior to the small cells 90 causing the one or more panels 91 to open. In some of these embodiments, the small cells 90 receive instructions from the UAV 50 to open the one or more panels 91 after authentication. In other embodiments, the small cells 90 detect the UAV 50 based on an identifier provided via one of a wireless signal, a radio frequency identification tag of the UAV 50, and the like.

§ 6.2 Antenna Plumb

In an aspect of the cell site audit 40 and similar to determining the down tilt angle, the UAV 50 and/or the mobile device 100 can be used to visually inspect the antenna 30 including its mounting brackets and associated hardware. This can be done to verify appropriate hardware installation, to verify the hardware is not lose or missing, and to verify that antenna 30 is plumb relative to the support bar 200.

§ 6.3 Antenna Azimuth

In an aspect of the cell site audit 40, the UAV 50 and/or the mobile device 100 can be used to verify the antenna azimuth, such as verifying the antenna azimuth is oriented within ±5° as defined on the RF data sheet. The azimuth (AZ) angle is the compass bearing, relative to true (geographic) north, of a point on the horizon directly beneath an observed object. Here, the UAV 50 and/or the mobile device 100 can include a location determining device such as a Global Positioning Satellite (GPS) measurement device. The antenna azimuth can be determined with the UAV 50 and/or the mobile device 100 using an aerial photo or the GPS measurement device.

§ 6.4 Photo Collections

As part of the cell site audit 40 generally, the UAV 50 and/or the mobile device 100 can be used to document various aspects of the cell site 10 by taking photos or video. For example, the mobile device 100 can be used to take photos or video on the ground in or around the shelter or cabinet 52 and the UAV 500 can be used to take photos or video up the cell tower 12 and of the cell site components 14. The photos and video can be stored in any of the UAV 50, the mobile device 100, the cloud, etc.

In an embodiment, the UAV can also hover at the cell site 10 and provide real-time video footage back to the mobile device 100 or another location (for example, a Network Operations Center (NOC) or the like).

In embodiments for inspecting small cells 90, the UAV hovers at and around the level of the small cells 90 to capture photos and/or videos of the components of the small cells 90 at various angles to ensure that all of the various components of the small cells 90 are properly captured in the photos and/or videos. These photos can be taken with the cover on/panels closed and with the cover off/panels open to ensure all of the components, wires, etc. of the small cells 90 are properly obscured by the cover.

§ 6.5 Compound Length/Width

The UAV 50 can be used to fly over the cell site 10 to measure the overall length and width of the cell site 10 compound from overhead photos. In one aspect, the UAV 50 can use GPS positioning to detect the length and width by flying over the cell site 10. In another aspect, the UAV 50 can take overhead photos which can be processed to determine the associated length and width of the cell site 10.

§ 6.6 Data Capture—Cell Site Audit

The UAV 50 can be used to capture various pieces of data via the camera 86. That is, with the UAV 50 and the mobile device 100, the camera 86 is equivalent to the engineer/technician's own eyes, thereby eliminating the need for the engineer/technician to physically climb the tower. One important aspect of the cell site audit 40 is physically collecting various pieces of information—either to check records for consistency or to establish a record. For example, the data capture can include determining equipment module types, locations, connectivity, serial numbers, etc. from photos. The data capture can include determining physical dimensions from photos or from GPS such as the cell tower 12 height, width, depth, etc. The data capture can also include visual inspection of any aspect of the cell site 10, cell tower 12, cell site components 14, etc. including, but not limited to, physical characteristics, mechanical connectivity, cable connectivity, and the like.

The data capture can also include checking the lighting rod 16 and the warning light 18 on the cell tower 12. Also, with additional equipment on the UAV 50, the UAV 50 can be configured to perform maintenance such as replacing the warning light 18, etc. The data capture can also include checking maintenance status of the cell site components 14 visually as well as checking associated connection status. Another aspect of the cell site audit 40 can include checking the structural integrity of the cell tower 12 and the cell site components 14 via photos from the UAV 50.

§ 6.7 Flying the UAV at the Cell Site

In an embodiment, the UAV 50 can be programmed to automatically fly to a location and remain there without requiring the operator to control the UAV 50 in real-time, at the cell site 10. In this scenario, the UAV 50 can be stationary at a location in the air at the cell site 10. Here, various functionality can be incorporated in the UAV 50 as described herein. Note, this aspect leverages the ability to fly the UAV 50 commercially based on the constraints described herein. That is, the UAV 50 can be used to fly around the cell tower 12, to gather data associated with the cell site components 14 for the various sectors 54, 56, 58. Also, the UAV 50 can be used to hover around the cell tower 12, to provide additional functionality described as follows. The below is also applicable to small cells 90.

§ 6.8 Video/Photo Capture—Cell Site

With the UAV 50 available to operate at the cell site 10, the UAV 50 can also be used to capture video/photos while hovering. This application uses the UAV 50 as a mobile video camera to capture activity at or around the cell site 10 from the air. It can be used to document work at the cell site 10 or to investigate the cell site 10 responsive to problems, e.g., tower collapse. It can be used to take surveillance video of surrounding locations such as service roads leading to the cell site 10, etc.

§ 6.9 Wireless Service Via the UAV

Again, with the ability to fly at the cell site 10, subject to the constraints, the UAV 50 can be used to provide temporary or even permanent wireless service at the cell site 10. This is performed with the addition of wireless service-related components to the UAV 50. In the temporary mode, the UAV 50 can be used to provide services over a short time period, such as responding to an outage or other disaster affecting the cell site 10. Here, an operator can cause the UAV 50 to fly where the cell site components 14 are and provide such service. The UAV 50 can be equipped with wireless antennas to provide cell service, Wireless Local Area Network (WLAN) service, or the like. The UAV 50 can effectively operate as a temporary tower or small cell as needed.

In the permanent mode, the UAV 50 (along with other UAVs 50) can constantly be in the air at the cell site 10 providing wireless service. This can be done similar to the temporary mode but over a longer time period. The UAV 50 can be replaced over a predetermined time to refuel or the like. The replacement can be another UAV 50. The UAV 50 can effectively operate as a permanent tower or small cell as needed.

§ 7.0 Flying the UAV from Cell Site to Another Cell Site

Figure 8:
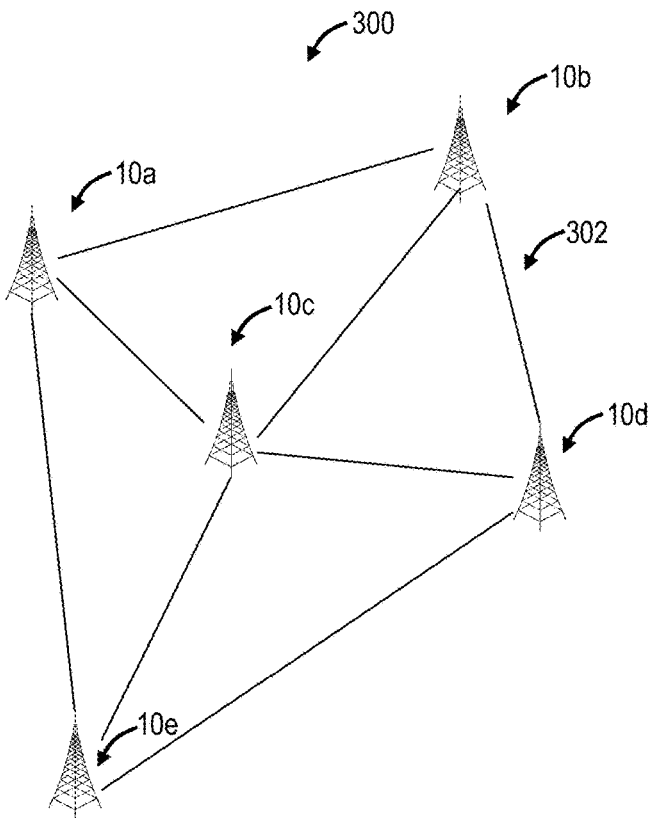
FIG. 8 is a network diagram of various cell sites deployed in a geographic region.

As described herein, the flight constraints include operating the UAV 50 vertically in a defined 3D rectangle at the cell site 10. In another embodiment, the flight constraints can be expanded to allow the 3D rectangle at the cell site 10 as well as a horizontal operation between adjacent cell sites 10. FIG. 8 is a network diagram of various cell sites 10a-10e deployed in a geographic region 300. In an embodiment, the UAV 50 is configured to operate as described herein, such as in FIG. 3, in the vertical 3D rectangular flight pattern, as well as in a horizontal flight pattern between adjacent cell sites 10. Here, the UAV 50 is cleared to fly, without the commercial regulations, between the adjacent cell sites 10.

In this manner, the UAV 50 can be used to perform the cell site audits 40 at multiple locations—note, the UAV 50 does not need to land and physically be transported to the adjacent cell sites 10. Additionally, the fact that the FAA will allow exemptions to fly the UAV 50 at the cell site 10 and between adjacent cell sites 10 can create an interconnected mesh network of allowable flight paths for the UAV 50. Here, the UAV 50 can be used for other purposes besides those related to the cell site 10. That is, the UAV 50 can be flown in any application, independent of the cell sites 10, but without requiring FAA regulation. The applications can include, without limitation, a drone delivery network, a drone surveillance network, and the like.

As shown in FIG. 8, the UAV 50, at the cell site 10a, can be flown to any of the other cell sites 10b-10e along flight paths 302. Due to the fact that cell sites 10 are numerous and diversely deployed in the geographic region 300, an ability to fly the UAV 50 at the cell sites 10 and between adjacent cell sites 10, including sites with small cells 90, creates an opportunity to fly the UAV 50 across the geographic region 300, for numerous applications.

§ 8.0 UAV and Cell Towers

Additionally, the systems and methods described herein contemplate practically any activity at the cell site 10 using the UAV 50 in lieu of a tower climb. This can include, without limitation, any tower audit work with the UAV 50, any tower warranty work with the UAV 50, any tower operational ready work with the UAV 50, any tower construction with the UAV 50, any tower decommissioning/deconstruction with the UAV 50, any tower modifications with the UAV 50, and the like.

§ 9.0 Cell Site Operations

There are generally two entities associated with cell sites—cell site owners and cell site operators. Generally, cell site owners can be viewed as real estate property owners and managers. Typical cell site owners may have a vast number of cell sites, such as tens of thousands, geographically dispersed. The cell site owners are generally responsible for the real estate, ingress and egress, structures on site, the cell tower itself, etc. Cell site operators generally include wireless service providers who generally lease space on the cell tower and in the structures for antennas and associated wireless backhaul equipment. There are other entities that may be associated with cell sites as well including engineering firms, installation contractors, and the like. All of these entities have a need for the various UAV-based systems and methods described herein. Specifically, cell site owners can use the systems and methods for real estate management functions, audit functions, etc. Cell site operators can use the systems and methods for equipment audits, troubleshooting, site engineering, etc. Of course, the systems and methods described herein can be provided by an engineering firm or the like contracted to any of the above entities or the like. The systems and methods described herein provide these entities time savings, increased safety, better accuracy, lower cost, and the like.

§ 10.0 3D Modeling Systems and Methods with UAVs

Figure 9:
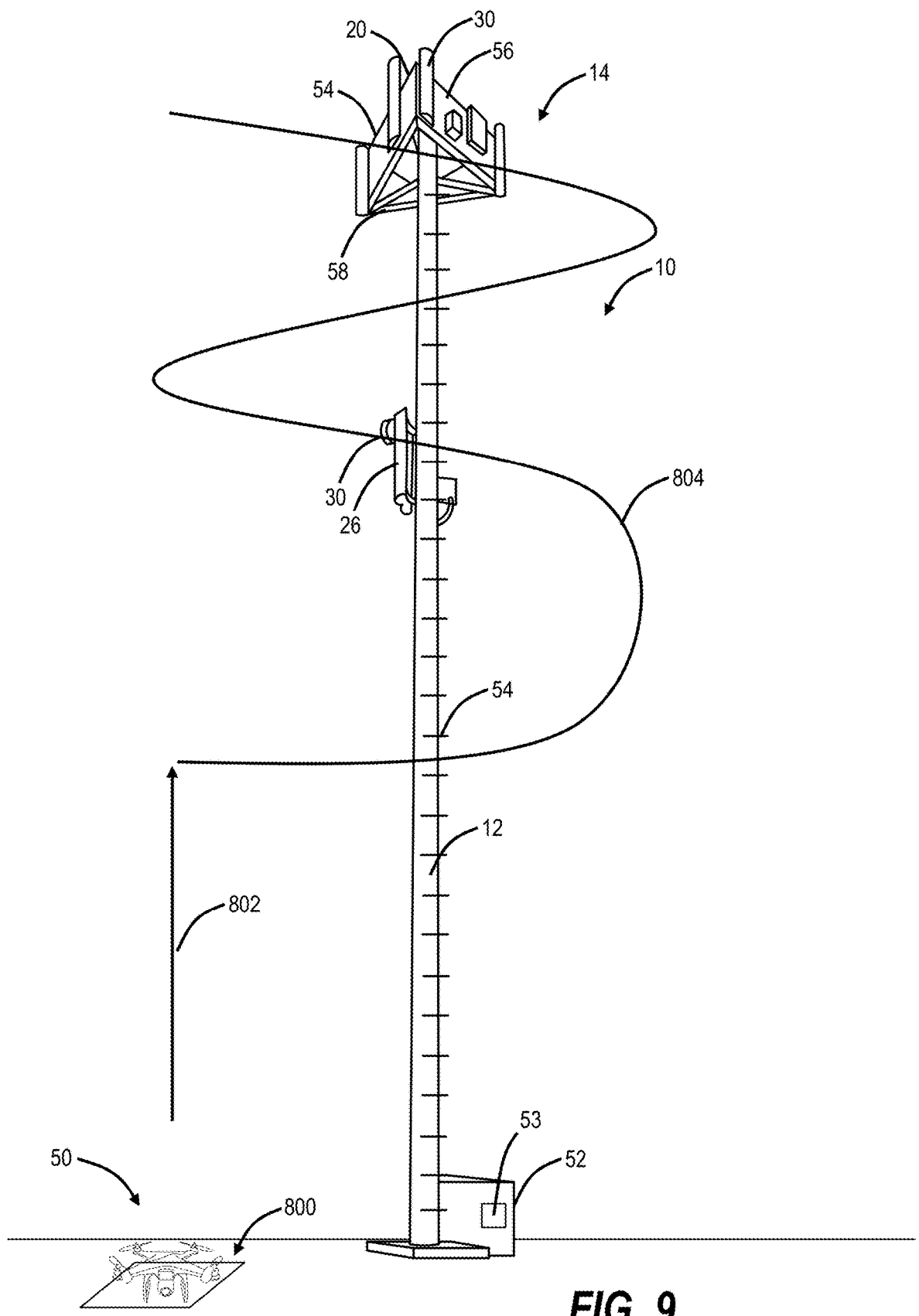
FIG. 9 is a diagram of the cell site and an associated launch configuration and flight for the UAV to obtain photos for a 3D model of the cell site.

FIG. 9 is a diagram of the cell site 10 and an associated launch configuration and flight for the UAV 50 to obtain photos for a 3D model of the cell site 10. Again, the cell site 10, the cell tower 12, the cell site components 14, etc. are as described herein. To develop a 3D model, the UAV 50 is configured to take various photos during flight, at different angles, orientations, heights, etc. to develop a 360-degree view. For post-processing, it is important to differentiate between different photos accurately. In various embodiments, the systems and methods utilize accurate location tracking for each photo taken. It is important for accurate correlation between photos to enable construction of a 3D model from a plurality of 2D photos. The photos can all include multiple location identifiers (i.e., where the photo was taken from, height and exact location). In an embodiment, the photos can each include at least two distinct location identifiers, such as from GPS or GLONASS. GLONASS is a "GLObal NAvigation Satellite System" which is a space-based satellite navigation system operating in the radio navigation-satellite service and used by the Russian Aerospace Defence Forces. It provides an alternative to GPS and is the second alternative navigational system in operation with global coverage and of comparable precision. The location identifiers are tagged or embedded in each photo and indicative of the location of the UAV 50 where and when the photo was taken. These location identifiers are used with objects of interest identified in the photo during post-processing to create the 3D model.

In fact, it was determined that location identifier accuracy is very important in the post-processing for creating the 3D model. One such determination was that there are slight inaccuracies in the location identifiers when the UAV 50 is launched from a different location and/or orientation. Thus, to provide further accuracy for the location identifiers, each flight of the UAV 50 is constrained to land and depart from a same location and orientation. For example, future flights of the same cell site 10 or additional flights at the same time when the UAV 50 lands and, e.g., has a battery change. To ensure the same location and/or orientation in subsequent flights at the cell site 10, a zone indicator 800 is set at the cell site 10, such as on the ground via some marking (e.g., chalk, rope, white powder, etc.). Each flight at the cell site 10 for purposes of obtaining photos for 3D modeling is done using the zone indicator 800 to land and launch the UAV 50. Based on operations, it was determined that using conventional UAVs 50; the zone indicator 800 provides significantly more accuracy in location identifier readings. Accordingly, the photos are accurately identified relative to one another and able to create an extremely accurate 3D model of all physical features of the cell site 10. Thus, in an embodiment, all UAV 50 flights are from the same launch point and orientation to avoid calibration issues with any location identifier technique. The zone indicator 800 can also be marked on the 3D model for future flights at the cell site 10. Thus, the use of the zone indicator 800 for the same launch location and orientation along with the multiple location indicators provide more precision in the coordinates for the UAV 50 to correlate the photos.

Note, in other embodiments, the zone indicator 800 may be omitted, or the UAV 50 can launch from additional points, such that the data used for the 3D model is only based on a single flight. The zone indicator 800 is advantageous when data is collected over time or when there are landings in flight.

Once the zone indicator 800 is established, the UAV 50 is placed therein in a specific orientation (orientation is arbitrary so long as the same orientation is continually maintained). The orientation refers to which way the UAV 50 is facing at launch and landing. Once the UAV 50 is in the zone indicator 800, the UAV 50 can be flown up (denoted by line 802) the cell tower 12. Note, the UAV 50 can use the aforementioned flight constraints to conform to FAA regulations or exemptions. Once at a certain height and certain distance from the cell tower 12 and the cell site components 14, the UAV 50 can take a circular or 360-degree flight pattern about the cell tower 12, including flying up as well as around the cell tower 12 (denoted by line 804).

During the flight, the UAV 50 is configured to take various photos of different aspects of the cell site 10 including the cell tower 12, the cell site components 14, as well as surrounding area. For small cells 90, the UAV 50 is configured to take various photos of the existing infrastructure and the surrounding area. These photos are each tagged or embedded with multiple location identifiers. It has also been determined that the UAV 50 should be flown at a certain distance based on its camera capabilities to obtain the optimal photos, i.e., not too close or too far from objects of interest. The UAV 50 in a given flight can take hundreds or even thousands of photos, each with the appropriate location identifiers. For an accurate 3D model, at least hundreds of photos are required. The UAV 50 can be configured to take pictures automatically are given intervals during the flight, and the flight can be a preprogrammed trajectory around the cell site 10. Alternatively, the photos can be manually taken based on operator commands. Of course, a combination is also contemplated. In another embodiment, the UAV 50 can include preprocessing capabilities which monitor photos taken to determine a threshold after which enough photos have been taken to construct the 3D model accurately.

Figure 10:
FIG. 10 is a satellite view of an example flight of the UAV at the cell site.

FIG. 10 is a satellite view of an example flight of the UAV 50 at the cell site 10. Note, photos are taken at locations marked with circles in the satellite view. Note, the flight of the UAV 50 can be solely to construct the 3D model, or as part of the cell site audit 40 described herein. Also note, the example flight allows photos at different locations, angles, orientations, etc. such that the 3D model not only includes the cell tower 12, but also the surrounding geography.

Figure 11:
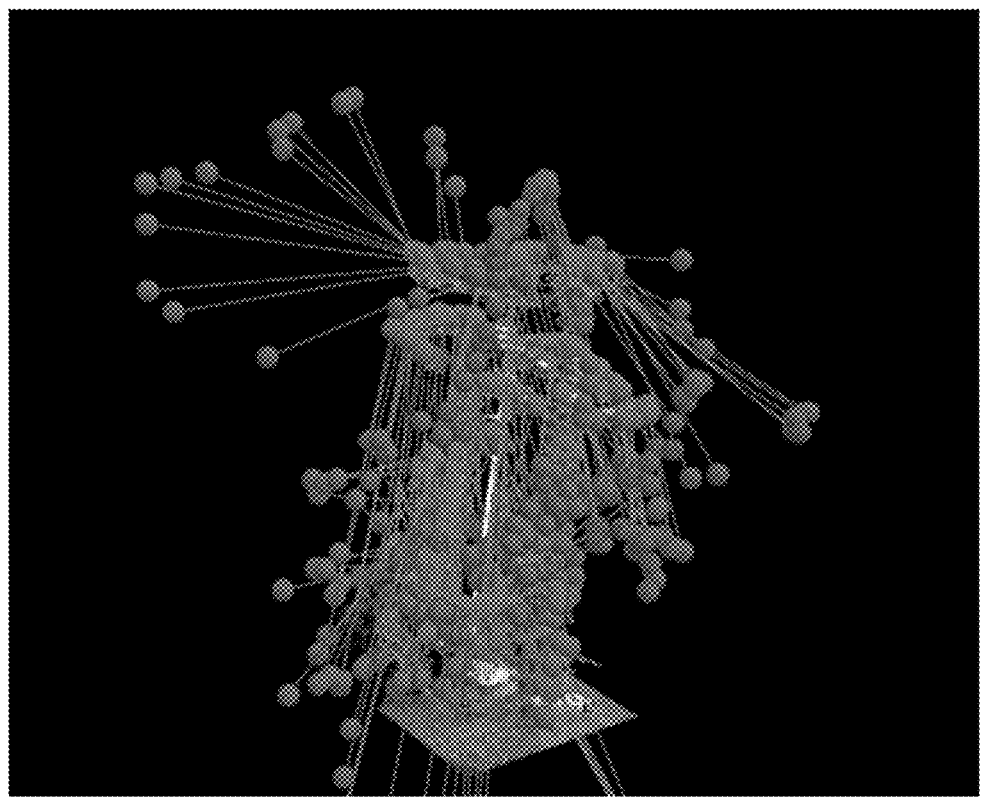
FIG. 11 is a side view of an example flight of the UAV at the cell site.

FIG. 11 is a side view of an example flight of the UAV 50 at the cell site 10. Similar to FIG. 10, FIG. 11 shows circles in the side view at locations where photos were taken. Note, photos are taken at different elevations, orientations, angles, and locations. The photos are stored locally in the UAV 50 and/or transmitted wirelessly to a mobile device, controller, server, etc. Once the flight is complete, and the photos are provided to an external device from the UAV 50 (e.g., mobile device, controller, server, cloud service, or the like), post-processing occurs to combine the photos or "stitch" them together to construct the 3D model. While described separately, the post-processing could occur in the UAV 50 provided its computing power is capable.

Figure 12:
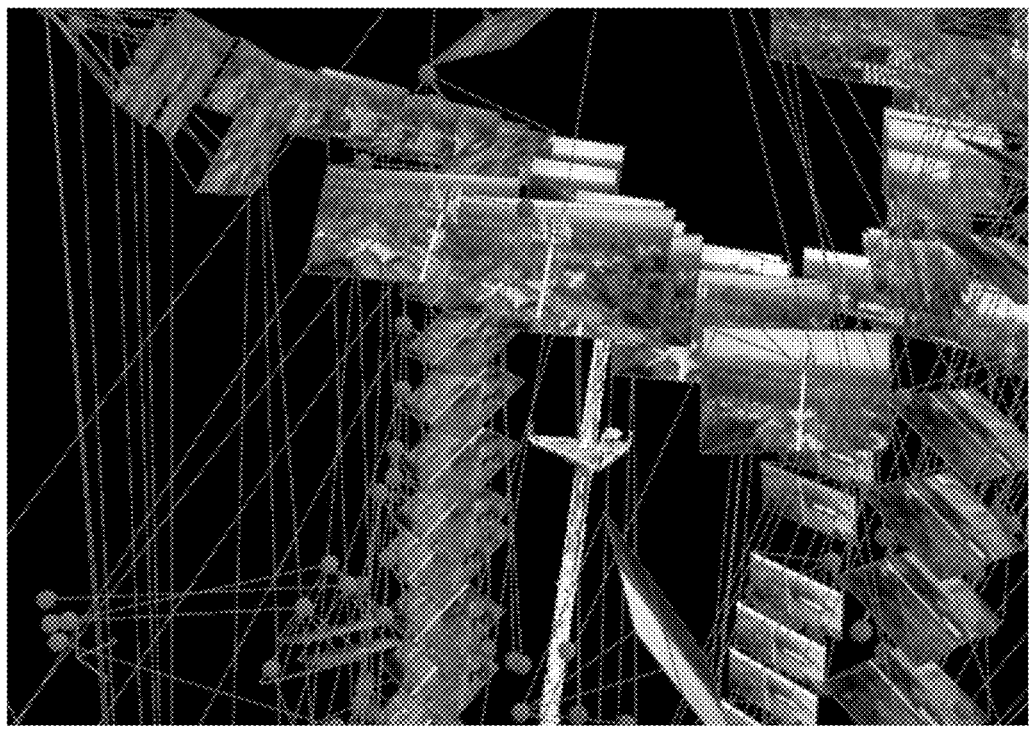
FIG. 12 is a logical diagram of a portion of a cell tower along with associated photos taken by the UAV at different points relative thereto.

FIG. 12 is a logical diagram of a portion of a cell tower 12 along with associated photos taken by the UAV 50 at different points relative thereto. Specifically, various 2D photos are logically shown at different locations relative to the cell tower 12 to illustrate the location identifiers and the stitching together of the photos.

Figure 13:
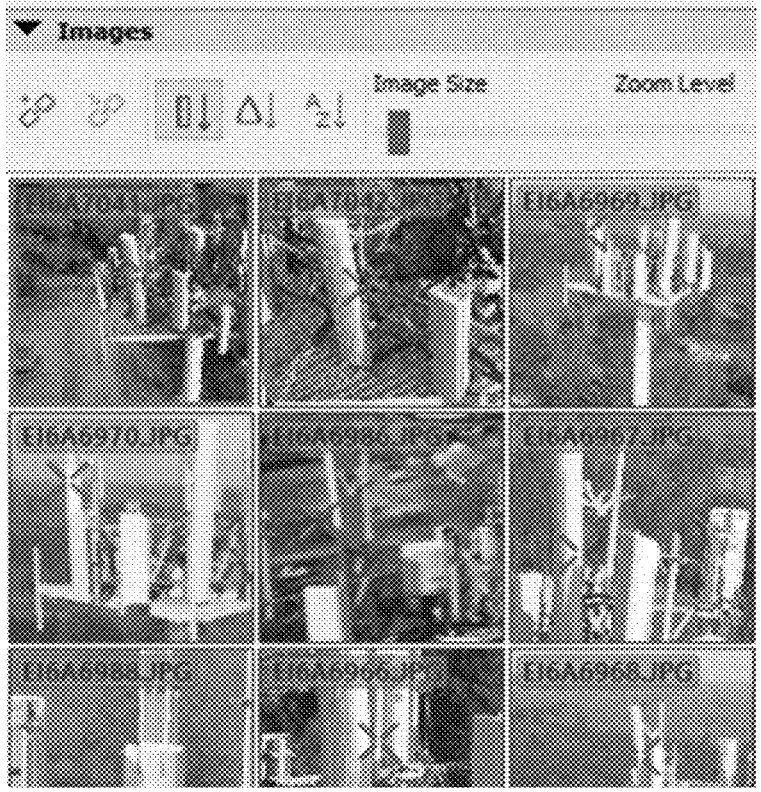
FIG. 13 is a screenshot of a GUI associated with post-processing photos from the UAV.

FIG. 13 is a screen shot of a Graphic User Interface (GUI) associated with post-processing photos from the UAV 50. Again, once the UAV 50 has completed taking photos of the cell site 10, the photos are post-processed to form a 3D model. The systems and methods contemplate any software program capable of performing photogrammetry. In the example of FIG. 13, there are 128 total photos. The post-processing includes identifying visible points across the multiple points, i.e., objects of interest. For example, the objects of interest can be any of the cell site components 14, such as antennas. The post-processing identifies the same object of interest across different photos, with their corresponding location identifiers, and builds a 3D model based on multiple 2D photos.

Figure 14:
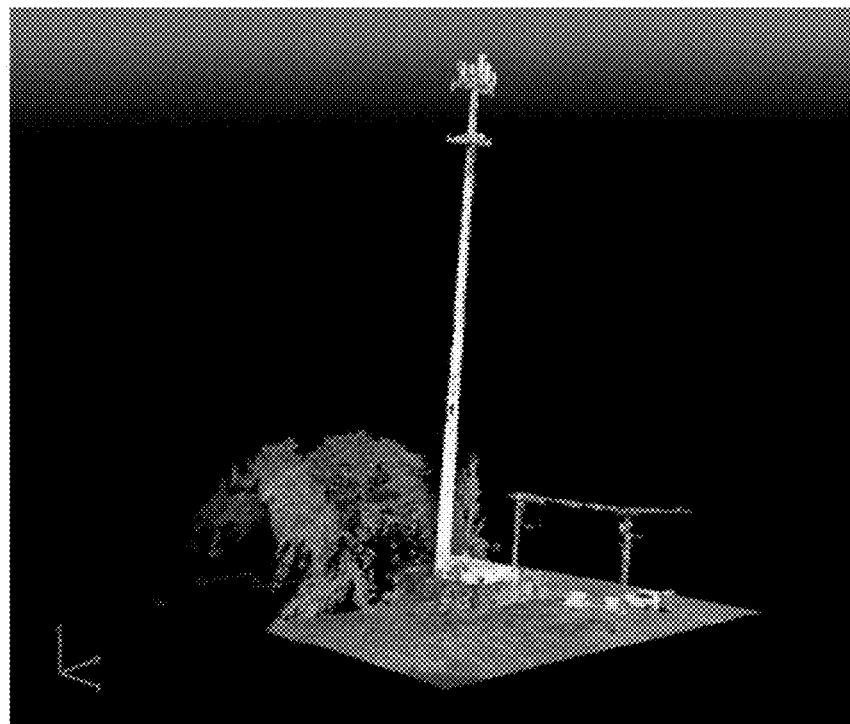
FIG. 14 is a screenshot of a 3D model constructed from a plurality of 2D photos taken from the UAV as described herein.

FIG. 14 is a screen shot of a 3D model constructed from a plurality of 2D photos taken from the UAV 50 as described herein. Note, the 3D model can be displayed on a computer or another type of processing device, such as via an application, a Web browser, or the like. The 3D model supports zoom, pan, tilt, etc.

Figure 15:
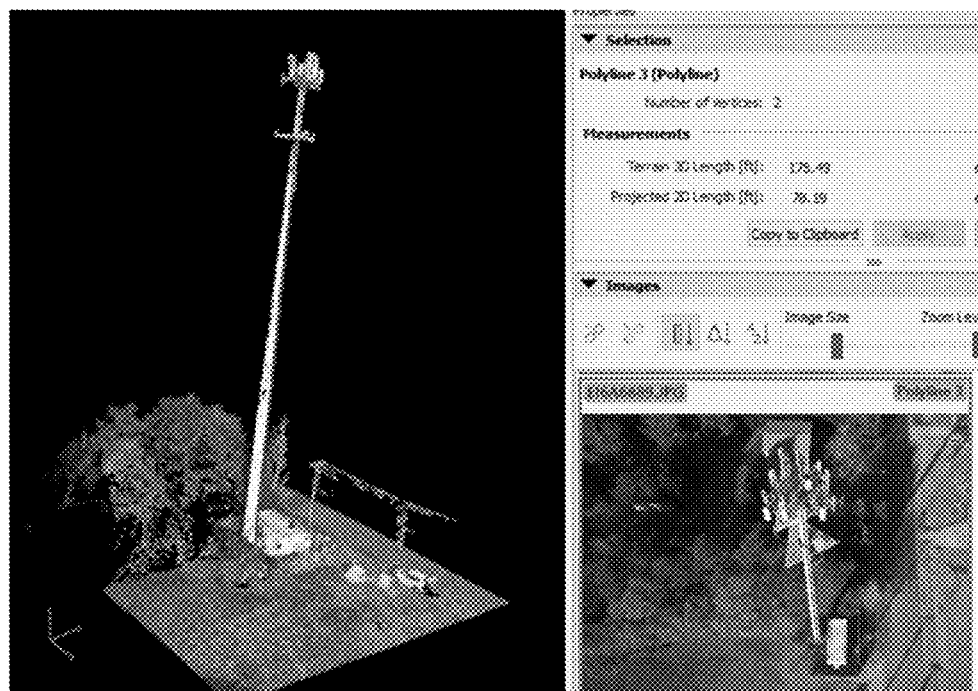
FIGS. 15-20 are various screenshots of GUIs associated with a 3D model of a cell site based on photos taken from the UAV as described herein.
Figure 16:
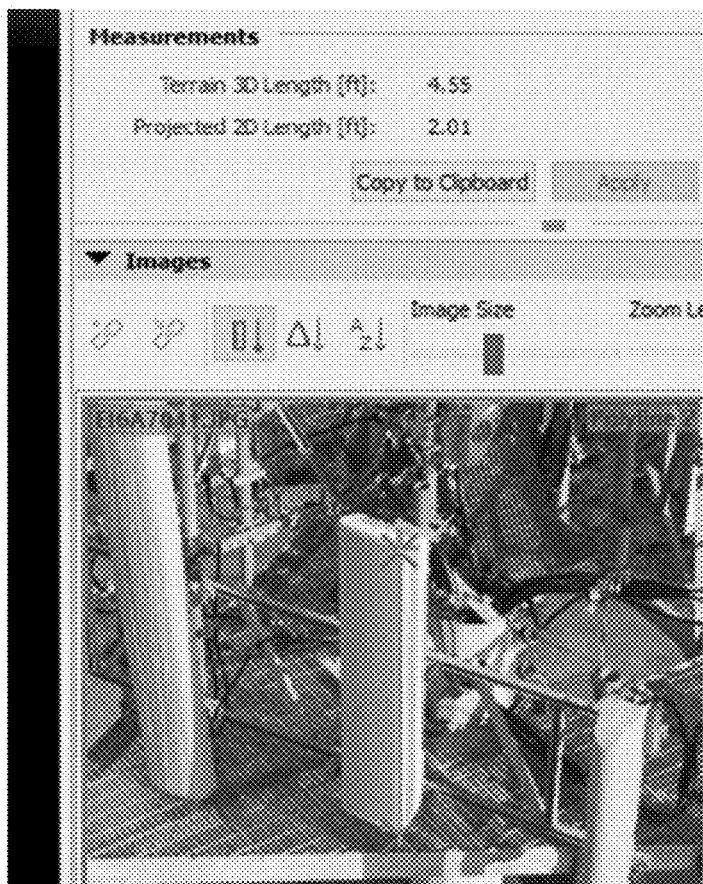
Figure 17:
Figure 18:

FIGS. 15-20 are various screenshots of GUIs associated with a 3D model of a cell site based on photos taken from the UAV 50 as described herein. FIG. 15 is a GUI illustrating an example measurement of an object, i.e., the cell tower 12, in the 3D model. Specifically, using a point and click operation, one can click on two points such as the top and bottom of the cell tower and the 3D model can provide a measurement, e.g., 175' in this example. FIG. 16 illustrates a close-up view of a cell site component 14 such as an antenna and a similar measurement made thereon using point and click, e.g., 4.55' in this example. FIGS. 17 and 18 illustrate an aerial view of the 3D model showing surrounding geography around the cell site 10. From these views, the cell tower 12 is illustrated with the surrounding environment including the structures, access road, fall line, etc. Specifically, the 3D model can assist in determining a fall line which is anywhere in the surroundings of the cell site 10 where the cell tower 12 may fall. Appropriate considerations can be made based thereon.

Figure 19:
Figure 20:
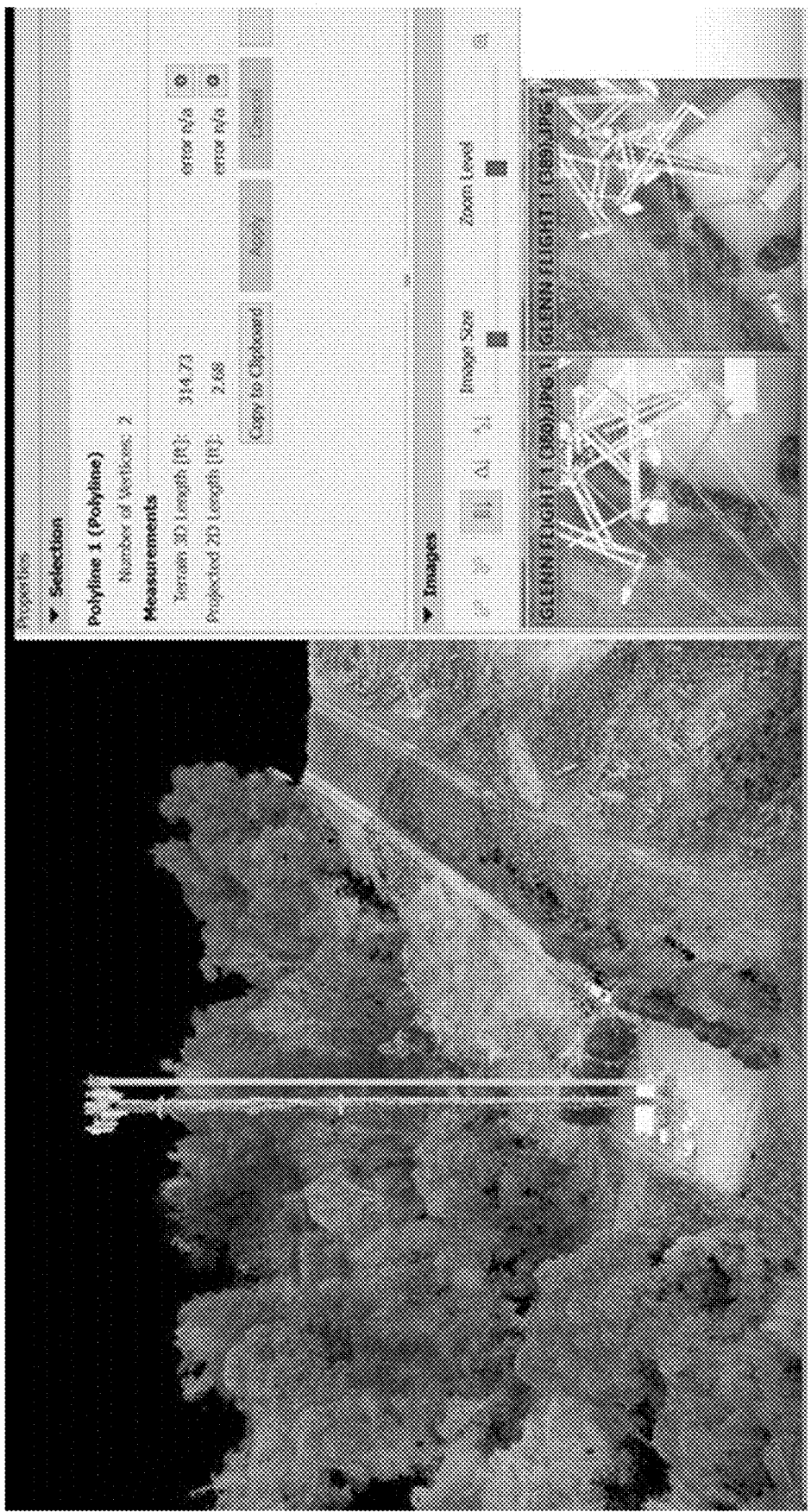

FIGS. 19 and 20 illustrate the 3D model and associated photos on the right side. One useful aspect of the 3D model GUI is an ability to click anywhere on the 3D model and bring up corresponding 2D photos. Here, an operator can click anywhere and bring up full-sized photos of the area. Thus, with the systems and methods described herein, the 3D model can measure and map the cell site 10 and surrounding geography along with the cell tower 12, the cell site components 14, etc. to form a comprehensive 3D model. There are various uses of the 3D model to perform cell site audits including checking tower grounding; sizing and placement of antennas, piping, and other cell site components 14; providing engineering drawings; determining characteristics such as antenna azimuths; and the like.

FIG. 21 is a photo of the UAV 50 in flight at the top of a cell tower 12. As described herein, it was determined that the optimum distance to photograph the cell site components 14 is about 10' to 40' distance.

FIG. 22 is a flowchart of a method 850 for modeling a cell site with a UAV. The method 850 includes causing the UAV to fly a given flight path about a cell tower at the cell site, wherein a launch location and launch orientation is defined for the UAV to take off and land at the cell site such that each flight at the cell site has the same launch location and launch orientation (step 852); obtaining a plurality of photographs of the cell site during about the flight plane, wherein each of the plurality of photographs is associated with one or more location identifiers (step 854); and, subsequent to the obtaining, processing the plurality of photographs to define a 3D model of the cell site based on the associated with one or more location identifiers and one or more objects of interest in the plurality of photographs (step 856).

The method 850 can further include landing the UAV at the launch location in the launch orientation; performing one or more operations on the UAV, such as changing a battery; and relaunching the UAV from the launch location in the launch orientation to obtain additional photographs. The one or more location identifiers can include at least two location identifiers including GPS and GLONASS. The flight plan can be constrained to an optimum distance from the cell tower. The plurality of photographs can be obtained automatically during the flight plan while concurrently performing a cell site audit of the cell site. The method 850 can further include providing a GUI of the 3D model; and using the GUI to perform a cell site audit. The method 850 can further include providing a GUI of the 3D model; and using the GUI to measure various components at the cell site. The method 850 can further include providing a GUI of the 3D model; and using the GUI to obtain photographs of the various components at the cell site.

§ 11.0 3D Modeling Systems and Methods without UAVs

Figure 23:
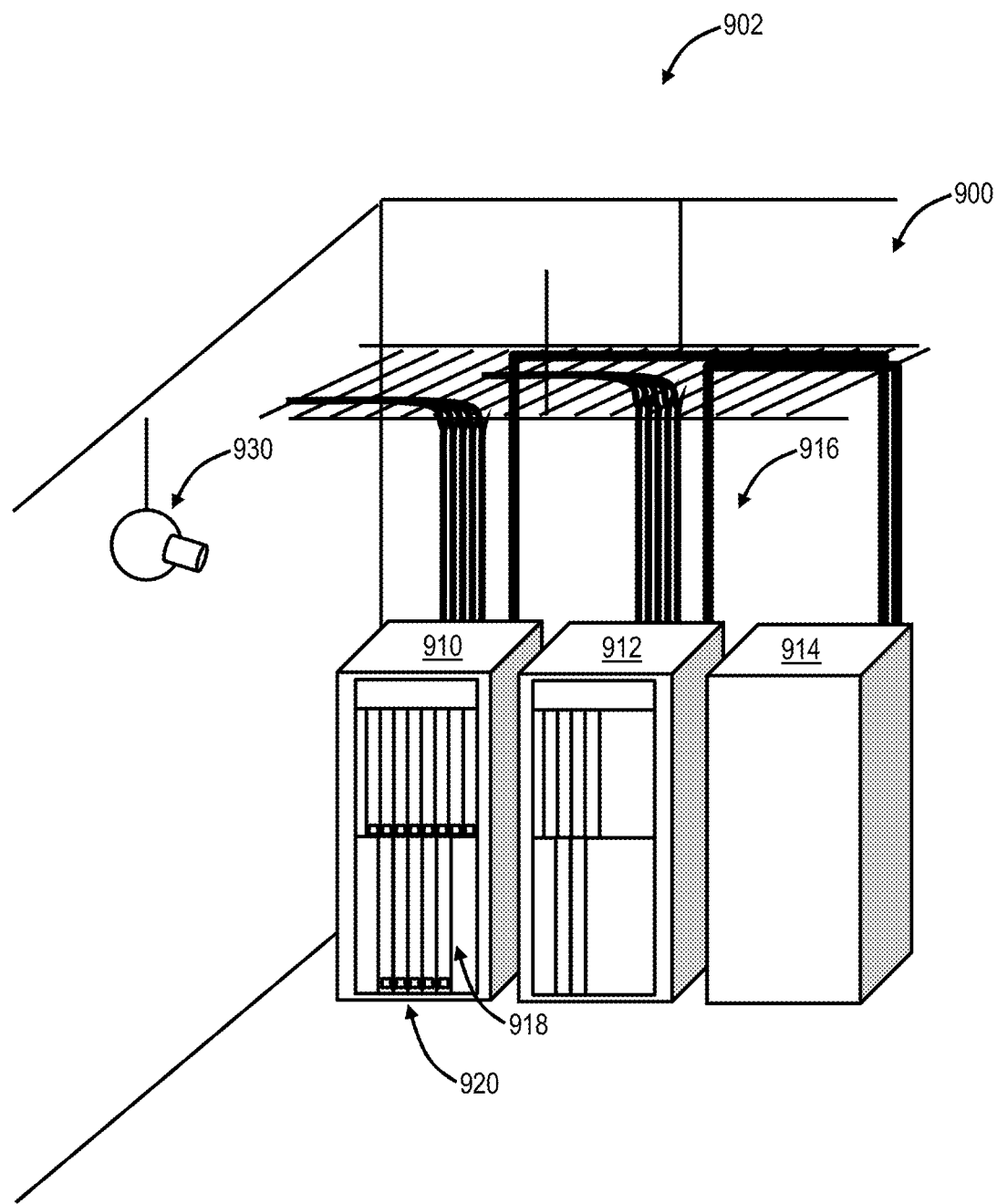
FIG. 23 is a diagram of an example interior of a building, such as a shelter or cabinet, at the cell site.

The above description explains 3D modeling and photo data capture using the UAV 50. Additionally, the photo data capture can be through other means, including portable cameras, fixed cameras, heads-up displays (HUD), head-mounted cameras, and the like. That is the systems and methods described herein contemplate the data capture through any available technique. The UAV 50 will be difficult to obtain photos inside the buildings, i.e., the shelter or cabinet 52. FIG. 23 is a diagram of an example interior 900 of a building 902, such as the shelter or cabinet 52, at the cell site 10. Generally, the building 902 houses equipment associated with the cell site 10 such as wireless RF terminals 910 (e.g., LTE terminals), wireless backhaul equipment 912, power distribution 914 (such as power plant 53 of FIGS. 3 and 9), and the like. Generally, wireless RF terminals 910 connect to the cell site components 14 for providing associated wireless service. The wireless backhaul equipment 912 includes networking equipment to bring the associated wireless service signals to a wireline network, such as via fiber optics or the like. The power distribution 914 provides power for all of the equipment such as from the grid as well as a battery backup to enable operation in the event of power failures. Of course, additional equipment and functionality are contemplated in the interior 900.

The terminals 910, equipment 912, and the power distribution 914 can be realized as rack or frame mounted hardware with cabling 916 and with associated modules 918. The modules 918 can be pluggable modules which are selectively inserted in the hardware and each can include unique identifiers 920 such as barcodes, Quick Response (QR) codes, RF Identification (RFID), physical labeling, color coding, or the like. Each module 918 can be unique with a serial number, part number, and/or functional identifier. The modules 918 are configured as needed to provide the associated functionality of the cell site.

The systems and methods include, in addition to the aforementioned photo capture via the UAV 50, photo data capture in the interior 900 for 3D modeling and for virtual site surveys. The photo data capture can be performed by a fixed, rotatable camera 930 located in the interior 900. The camera 930 can be communicatively coupled to a Data Communication Network (DCN), such as through the wireless backhaul equipment 912 or the like. The camera 930 can be remotely controlled, such as by an engineer performing a site survey from his or her office. Other techniques of photo data capture can include an on-site technician taking photos with a camera and uploading them to a cloud service or the like. Again, the systems and methods contemplate any type of data capture.

Again, with a plurality of photos, e.g., hundreds, it is possible to utilize photogrammetry to create a 3D model of the interior 900 (as well as a 3D model of the exterior as described above). The 3D model is created using physical cues in the photos to identify objects of interest, such as the modules 918, the unique identifiers 920, or the like. Note, the location identifiers described relative to the UAV 50 are less effective in the interior 900 given the enclosed, interior space and the closer distances.

§ 12.0 Virtual Site Survey

Figure 24:
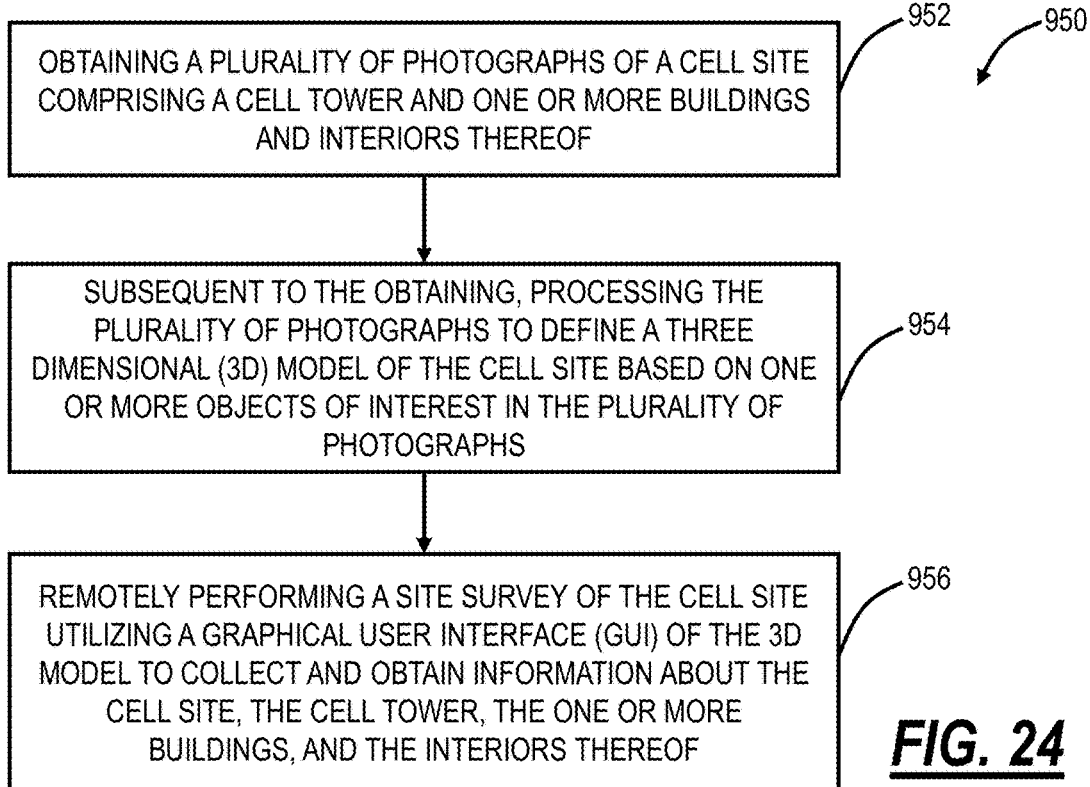
FIG. 24 is a flowchart of a virtual site survey method for the cell site.

FIG. 24 is a flowchart of a virtual site survey method 950 for the cell site 10. The virtual site survey method 950 is associated with the cell site 10 and utilizes three-dimensional (3D) models for remote performance, i.e., at an office as opposed to in the field. The virtual site survey method 950 includes obtaining a plurality of photographs of a cell site including a cell tower and one or more buildings and interiors thereof (step 952); subsequent to the obtaining, processing the plurality of photographs to define a three dimensional (3D) model of the cell site based on one or more objects of interest in the plurality of photographs (step 954); and remotely performing a site survey of the cell site utilizing a Graphical User Interface (GUI) of the 3D model to collect and obtain information about the cell site, the cell tower, the one or more buildings, and the interiors thereof (step 956). The 3D model is a combination of an exterior of the cell site including the cell tower and associated cell site components thereon, geography local to the cell site, and the interiors of the one or more buildings at the cell site, and the 3D model can include detail at a module level in the interiors. For existing small cells 90, the 3D model is a combination of an interior of the small cell 90 (with the cover off/panels open) and an exterior of the small cell 90 (with the cover on/panels closed).

The remotely performing the site survey can include determining equipment location on the cell tower and in the interiors; measuring distances between the equipment and within the equipment to determine actual spatial location; and determining connectivity between the equipment based on associated cabling. The remotely performing the site survey can include planning for one or more of new equipment and changes to existing equipment at the cell site through drag and drop operations in the GUI, wherein the GUI includes a library of equipment for the drag and drop operations; and, subsequent to the planning, providing a list of the one or more of the new equipment and the changes to the existing equipment based on the library, for implementation thereof. The remotely performing the site survey can include providing one or more of the photographs of an associated area of the 3D model responsive to an operation in the GUI. The virtual site survey method 950 can include rendering a texture map of the interiors responsive to an operation in the GUI.

The virtual site survey method 950 can include performing an inventory of equipment at the cell site including cell site components on the cell tower and networking equipment in the interiors, wherein the inventory from the 3D model uniquely identifies each of the equipment based on associated unique identifiers. The remotely performing the site survey can include providing equipment visual in the GUI of a rack and all associated modules therein. The obtaining can include the UAV 50 obtaining the photographs on the cell tower, and the obtaining includes one or more of a fixed and portable camera obtaining the photographs in the interior. The obtaining can be performed by an on-site technician at the cell site, and the site survey can be remotely performed. Additionally, an apparatus can be adapted to perform a virtual site survey of a cell site.

The virtual site survey can perform anything remotely that traditionally would have required on-site presence, including the various aspects of the cell site audit 40 described herein. The GUI of the 3D model can be used to check plumbing of coaxial cabling, connectivity of all cabling, automatic identification of cabling endpoints such as through unique identifiers detected on the cabling, and the like. The GUI can further be used to check power plant 53 and batteries, power panels, physical hardware, grounding, heating and air conditioning, generators, safety equipment, and the like.

The 3D model can be utilized to automatically provide engineering drawings, such as responsive to the planning for new equipment or changes to existing equipment. Here, the GUI can have a library of equipment (e.g., approved equipment and vendor information can be periodically imported into the GUI). Normal drag and drop operations in the GUI can be used for equipment placement from the library. Also, the GUI system can include error checking, e.g., a particular piece of equipment is incompatible with placement or in violation of policies, and the like.

In embodiments for new small cell 90 installations, the virtual site survey includes scanning the existing infrastructure, such as with the UAV 50 where the small cells 90 are or will be mounted to and determining one or more of a size, shape, and color of the existing infrastructure and an installation height for the small cells 90. Confirming a size, shape, and color of the existing infrastructure can help ensure provisions are taken to blend the small cells 90 into the installation environment, and in particular, blending the small cells 90 with the existing infrastructure.

§ 13.0 Close-Out Audit Systems and Methods

Again, a close-out audit is done to document and verify the work performed at the cell site 10. The systems and methods eliminate the separate third-party inspection firm for the close-out audit. The systems and methods include the installers (i.e., from the third-party installation firm, the owner, the operator, etc.) performing video capture subsequent to the installation and maintenance and using various techniques to obtain data from the video capture for the close-out audit. The close-out audit can be performed off-site with the data from the video capture thereby eliminating unnecessary tower climbs, site visits, and the like.

Figure 25:
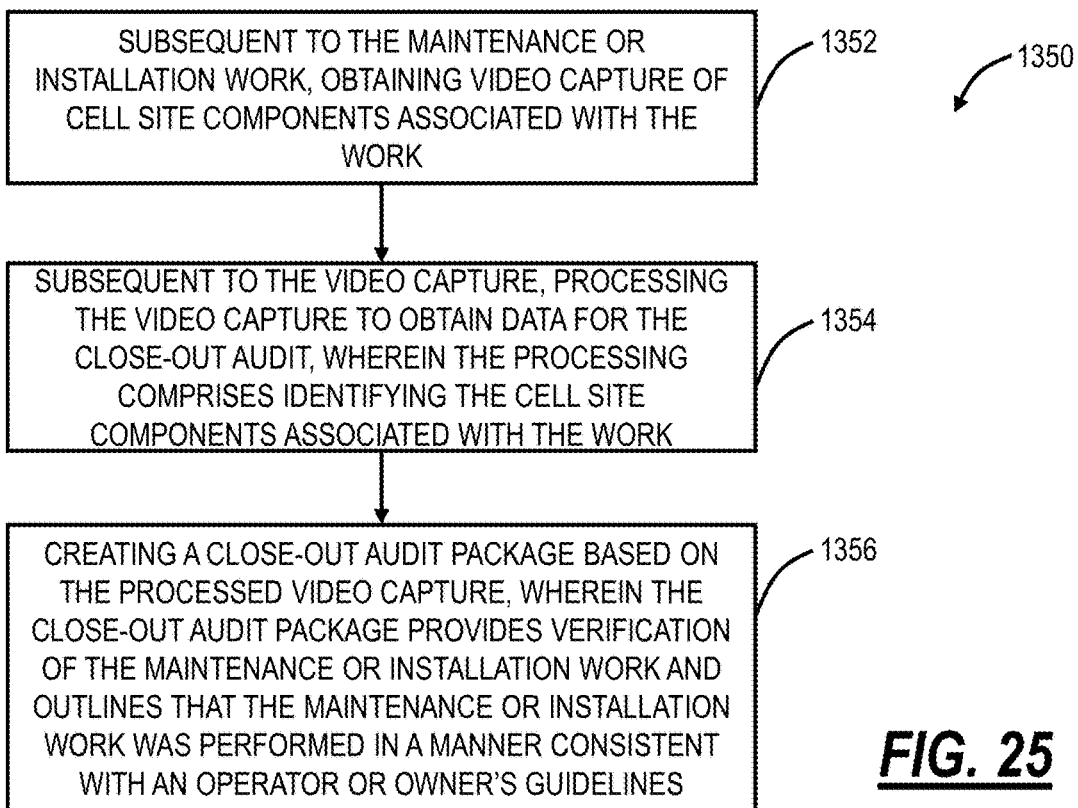
FIG. 25 is a flowchart of a close-out audit method performed at a cell site subsequent to maintenance or installation work.

FIG. 25 is a flowchart of a close-out audit method 1350 performed at a cell site subsequent to maintenance or installation work. The close-out audit method 1350 includes, subsequent to the maintenance or installation work, obtaining video capture of cell site components associated with the work (step 1352); subsequent to the video capture, processing the video capture to obtain data for the close-out audit, wherein the processing comprises identifying the cell site components associated with the work (step 1354); and creating a close-out audit package based on the processed video capture, wherein the close-out audit package provides verification of the maintenance or installation work and outlines that the maintenance or installation work was performed in a manner consistent with an operator or owner's guidelines (step 1356).

The video capture can be performed by a mobile device and one or more of locally stored thereon and transmitted from the mobile device. The video capture can also be performed by a mobile device which wirelessly transmits a live video feed, and the video capture is remotely stored from the cell site. The video capture can also be performed by a UAV flown at the cell site. Further, the video capture can be a live video feed with two-way communication between an installer associated with the maintenance or installation work and personnel associated with the operator or owner to verify the maintenance or installation work. For example, the installer and the personnel can communicate to go through various items in the maintenance or installation work to check/audit the work.

The close-out audit method 1350 can also include creating a 3D model from the video capture; determining equipment location from the 3D model; measuring distances between the equipment and within the equipment to determine actual spatial location; and determining connectivity between the equipment based on associated cabling from the 3D model. The close-out audit method 1350 can also include uniquely identifying the cell site components from the video capture and distinguishing in the close-out audit package. The close-out audit method 1350 can also include determining antenna height, azimuth, and down tilt angles for antennas in the cell site components from the video capture; and checking the antenna height, azimuth, and down tilt angles against predetermined specifications.

The close-out audit method 1350 can also include identifying cabling and connectivity between the cell site components from the video capture and distinguishing in the close-out audit package. The close-out audit method 1350 can also include checking a plurality of factors in the close-out audit from the video capture compared to the operator or owner's guidelines. The close-out audit method 1350 can also include checking the grounding of the cell site components from the video capture, comparing the checked grounding to the operator or owner's guidelines and distinguishing in the close-out audit package. The close-out audit method 1350 can also include checking mechanical connectivity of the cell site components to a cell tower based on the video capture and distinguishing in the close-out audit package.

The close-out audit package can include, without limitation, drawings, cell site component settings, test results, equipment lists, pictures, commissioning data, GPS data, Antenna height, azimuth and down tilt data, equipment data, serial numbers, cabling, etc. For small cells 90, the close-out audit package can include pictures and or video of the small cell 90 without the cover or with one or more panels 91 of the cover open for access to the various components, cabling, and connectivity, and with the cover on/the one or more panels 91 closed to ensure the components, cabling, and connectivity is properly covered, hidden from view, and well blended into the installation environment.

§ 14.0 3D Modeling Systems and Methods

Figure 26:
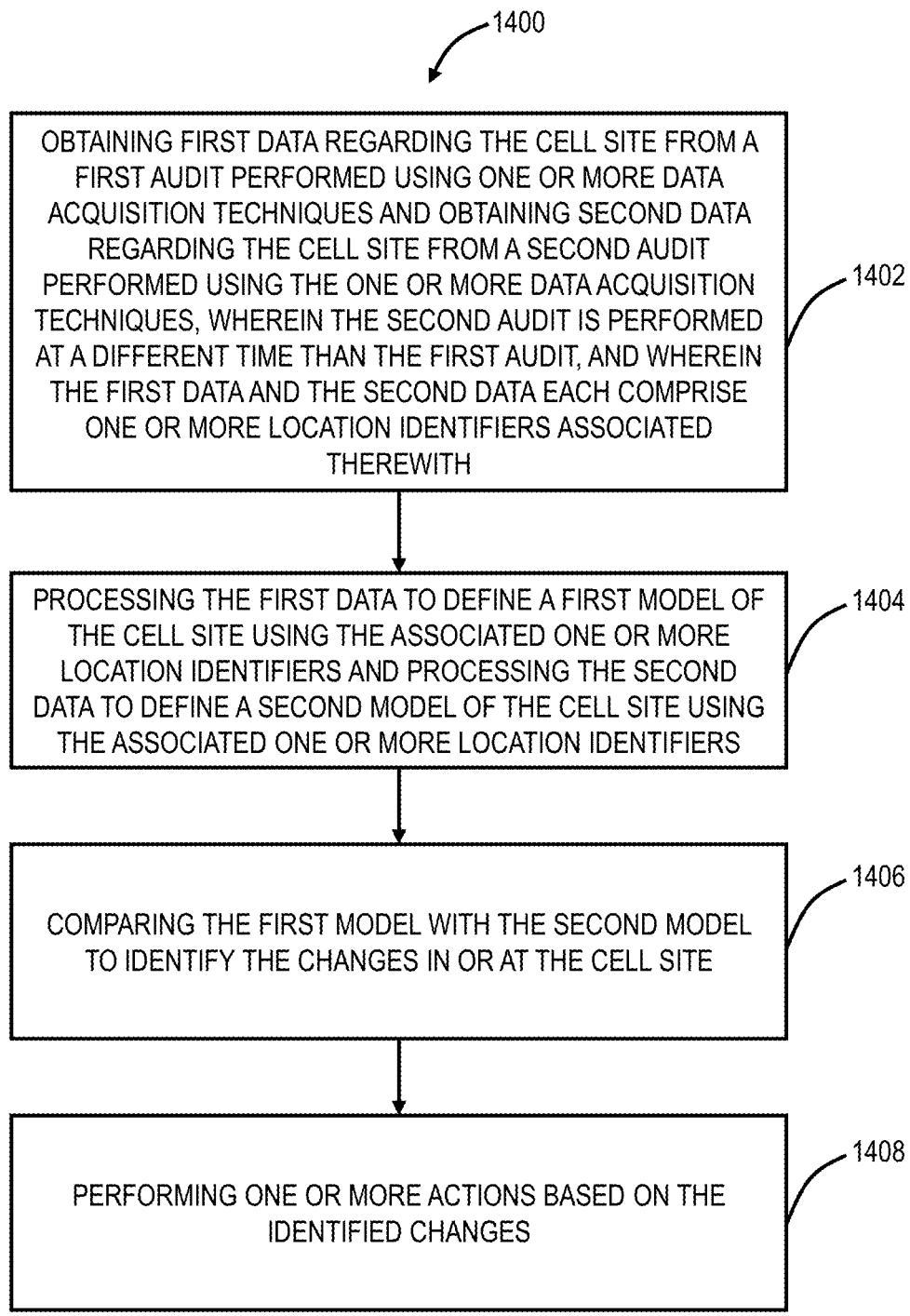
FIG. 26 is a flowchart of a 3D modeling method to detect configuration and site changes.

FIG. 26 is a flowchart of a 3D modeling method 1400 to detect configuration and site changes. The 3D modeling method 1400 utilizes various techniques to obtain data, to create 3D models, and to detect changes in configurations and surroundings. The 3D models can be created at two or more different points in time, and with the different 3D models, a comparison can be made to detect the changes. Advantageously, the 3D modeling systems and methods allow cell site operators to manage the cell sites without repeated physical site surveys efficiently.

The modeling method 1400 includes obtaining first data regarding the cell site from a first audit performed using one or more data acquisition techniques and obtaining second data regarding the cell site from a second audit performed using the one or more data acquisition techniques, wherein the second audit is performed at a different time than the first audit, and wherein the first data and the second data each comprise one or more location identifiers associated therewith (step 1402); processing the first data to define a first model of the cell site using the associated one or more location identifiers and processing the second data to define a second model of the cell site using the associated one or more location identifiers (step 1404); comparing the first model with the second model to identify the changes in or at the cell site (step 1406); and performing one or more actions based on the identified changes (step 1408).

The one or more actions can include any remedial or corrective actions including maintenance, landscaping, mechanical repair, licensing from operators who install more cell site components 14 than agreed upon, and the like. The identified changes can be associated with cell site components installed on a cell tower at the cell site, and wherein the one or more actions comprises any of maintenance, licensing with operators, and removal. The identified changes can be associated with physical surroundings of the cell site, and wherein the one or more actions comprise maintenance to correct the identified changes. The identified changes can include any of degradation of gravel roads, trees obstructing a cell tower, physical hazards at the cell site, and mechanical issues with the cell tower or a shelter at the cell site.

The first data and the second data can be obtained remotely, without a tower climb. The first model and the second model each can include a three-dimensional model of the cell site, displayed in a Graphical User Interface (GUI). The one or more data acquisition techniques can include using an Unmanned Aerial Vehicle (UAV) to capture the first data and the second data. The one or more data acquisition techniques can include using a fixed or portable camera to capture the first data and the second data. The one or more location identifiers can include at least two location identifiers comprising Global Positioning Satellite (GPS) and GLObal NAvigation Satellite System (GLONASS). The second model can be created using the first model as a template for expected objects at the cell site.

§ 15.0 3D Modeling Data Capture Systems and Methods

Figure 27:
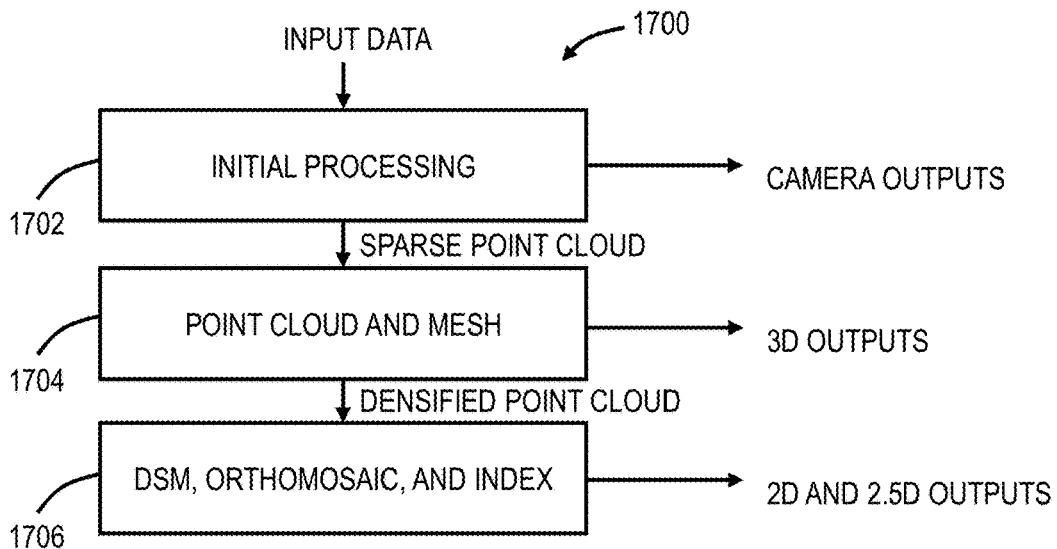
FIG. 27 is a flow diagram of a 3D model creation method.

Again, various embodiments herein describe applications and use of 3D models of the cell site 10 and the cell tower 12. For small cells 90, the 3D models are of the existing infrastructure and the small cells 90 attached thereto. Further, it has been described using the UAV 50 to obtain data capture for creating the 3D model. The data capture systems and methods described herein provide various techniques and criteria for properly capturing images or video using the UAV 50. Referring to FIG. 27 is a flow diagram of a 3D model creation method 1700. The 3D model creation method 1700 is implemented on a server or the like. The 3D model creation method 1700 includes receiving input data, i.e., pictures and/or video. The data capture systems and methods describe various techniques for obtaining the pictures and/or video using the UAV 50 at the cell site 10. In an embodiment, the pictures can be at least 10 megapixels, and the video can be at least 4 k high definition video.

The 3D model creation method 1700 performs initial processing on the input data (step 1702). An output of the initial processing includes a sparse point cloud, a quality report, and an output file can be camera outputs. The sparse point cloud is processed into a point cloud and mesh (step 1704) providing a densified point cloud and 3D outputs. The 3D model is an output of the step 1704. Other models can be developed by further processing the densified point cloud (step 1706) to provide a Digital Surface Model (DSM), an orthomosaic, tiles, contour lines, etc.

Figure 28:
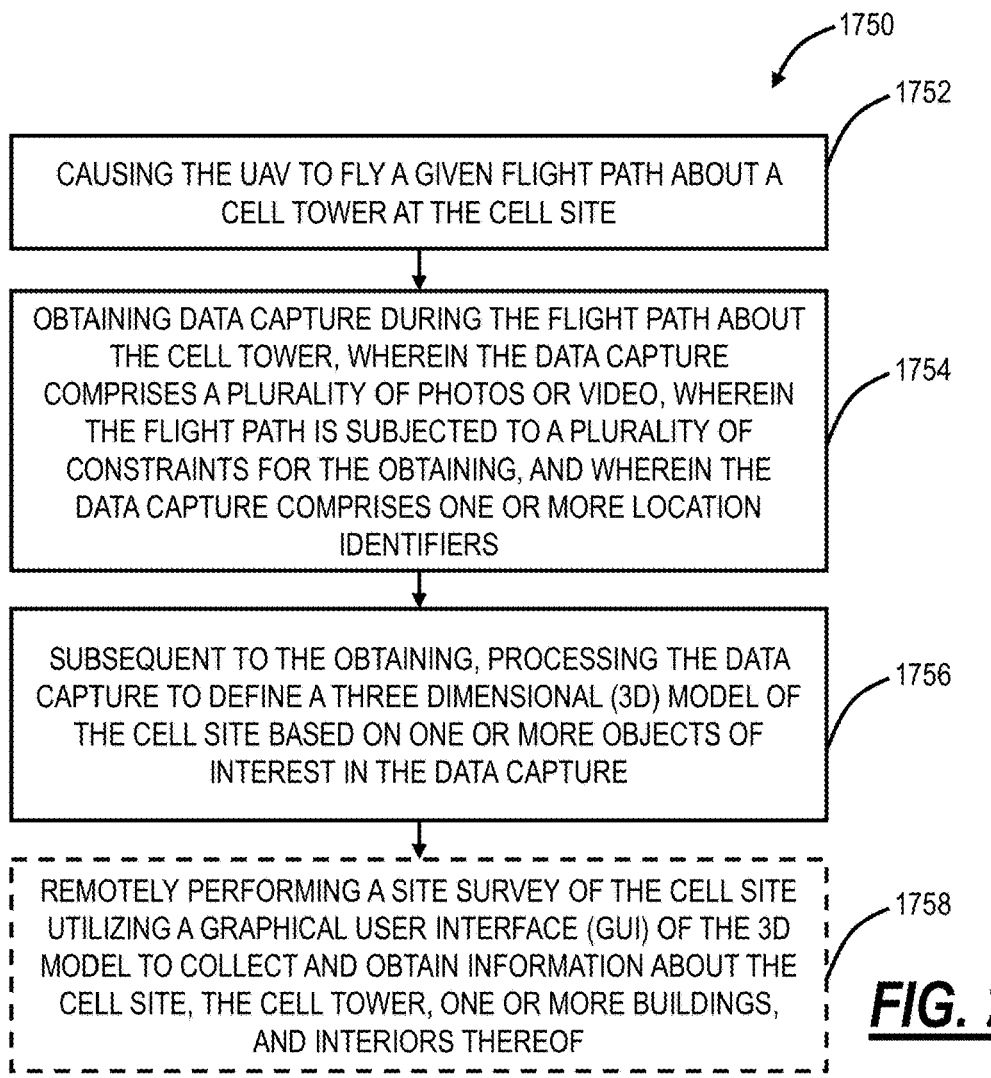
FIG. 28 is a flowchart of a method using an Unmanned Aerial Vehicle (UAV) to obtain data capture at a cell site for developing a three dimensional (3D) thereof.

The data capture systems and methods include capturing thousands of images or video which can be used to provide images. FIG. 28 is flowchart of a method 1750 using a UAV to obtain data capture at a cell site for developing a 3D model thereof. The method 1750 includes causing the UAV to fly a given flight path about a cell tower at the cell site (step 1752); obtaining data capture during the flight path about the cell tower, wherein the data capture comprises a plurality of photos or video, wherein the flight path is subjected to a plurality of constraints for the obtaining, and wherein the data capture comprises one or more location identifiers (step 1754); and, subsequent to the obtaining, processing the data capture to define a 3D model of the cell site based on one or more objects of interest in the data capture (step 1756). Similarly, for small cells 90, the flight path is about the infrastructure that the small cells 90 are attached to.

The method 1750 can further include remotely performing a site survey of the cell site utilizing a GUI of the 3D model to collect and obtain information about the cell site, the cell tower, one or more buildings, and interiors thereof (step 1758). Similarly, for small cells 90, the GUI is utilized to collect and obtain information about the infrastructure and any small cells 90 attached thereto. As a launch location and launch orientation can be defined for the UAV to take off and land at the cell site such that each flight at the cell site has the same launch location and launch orientation. The one or more location identifiers can include at least two location identifiers including GPS and GLONASS.

The plurality of constraints can include each flight of the UAV having a similar lighting condition and at about a same time of day. Specifically, the data capture can be performed on different days or times to update the 3D model. Importantly, the method 1750 can require the data capture in the same lighting conditions, e.g., sunny, cloudy, etc., and at about the same time of day to account for shadows.

The data capture can include a plurality of photographs each with at least 10 megapixels and wherein the plurality of constraints can include each photograph having at least 75% overlap with another photograph. Specifically, the significant overlap allows for ease in processing to create the 3D model. The data capture can include a video with at least 4 k high definition and wherein the plurality of constraints can include capturing a screen from the video as a photograph having at least 75% overlap with another photograph captured from the video.

The plurality of constraints can include a plurality of flight paths around the cell tower with each of the plurality of flight paths at one or more of different elevations, different camera angles, and different focal lengths for a camera. The plurality of flight paths can be one of a first flight path at a first height and a camera angle and a second flight path at a second height and the camera angle; and a first flight path at the first height and a first camera angle and a second flight path at the first height and a second camera angle. The plurality of flight paths can be substantially circular around the cell tower.

§ 15.1 3D Methodology for Cell Sites

Figure 29:
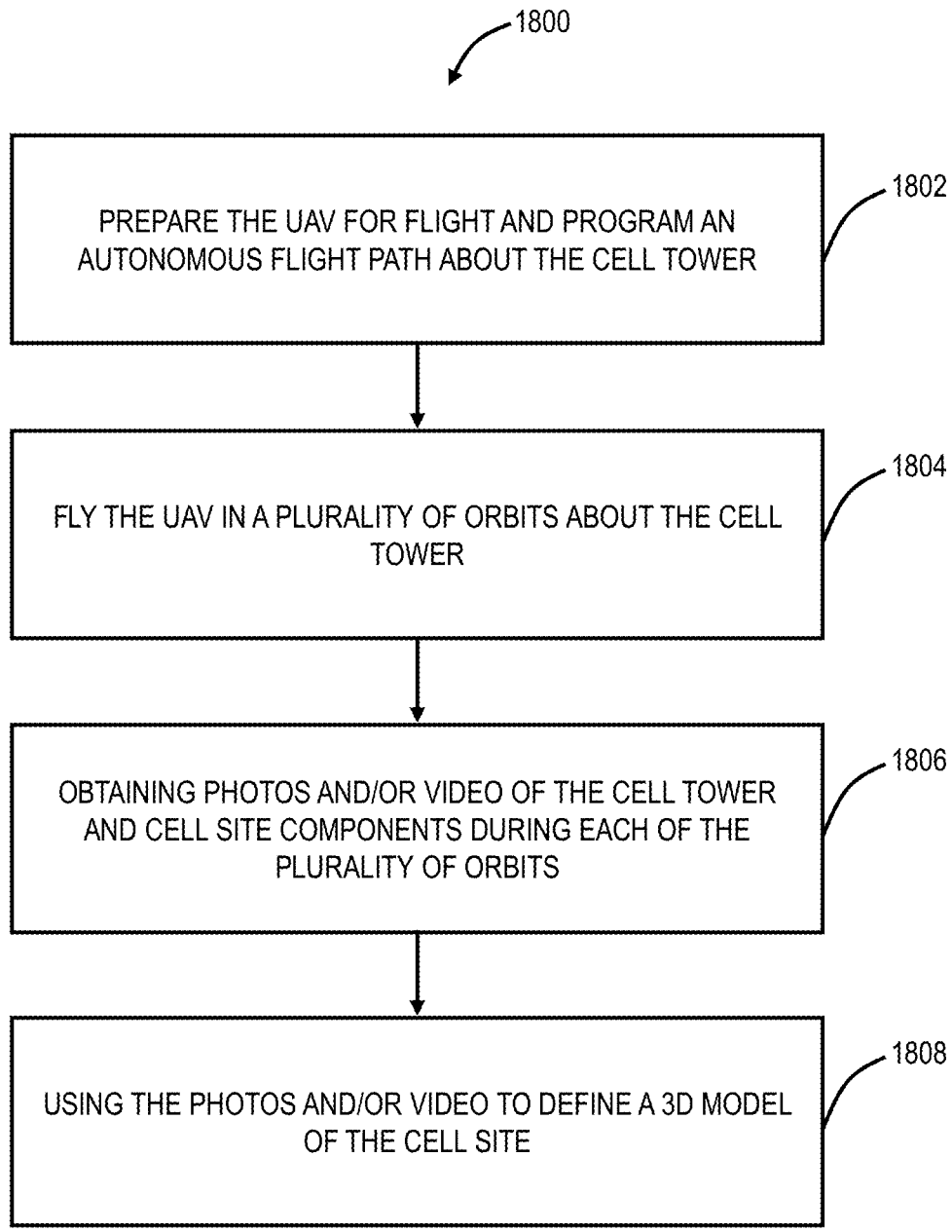
FIG. 29 is a flowchart of a 3D modeling method for capturing data at the cell site, the cell tower, etc. using the UAV.

FIG. 29 is a flowchart of a 3D modeling method 1800 for capturing data at the cell site 10, the cell tower 12, etc. using the UAV 50. The method 1800, in addition to or in combination with the method 1750, provides various techniques for accurately capturing data for building a point cloud generated a 3D model of the cell site 10. First, the data acquisition, i.e., the performance of the method 1800, should be performed in the early morning or afternoon such that nothing is overexposed and there is a minimum reflection off of the cell tower 12. It is also important to have a low Kp Index level to minimize the disruption of geomagnetic activity on the UAV's GPS unit, sub level six is adequate for 3D modeling as described in this claim. Of course, it is also important to ensure the camera lenses on the UAV 50 are clean prior to launch. This can be done by cleaning the lenses with alcohol and a wipe. Thus, the method 1800 includes preparing the UAV 50 for flight and programming an autonomous flight path about the cell tower 12 (step 1802).

The UAV 50 flight about the cell tower 12 at the cell site 10 can be autonomous, i.e., automatic without manual control of the actual flight plan in real-time. The advantage here with autonomous flight is the flight of the UAV 50 is circular as opposed to a manual flight which can be more elliptical, oblong, or have gaps in data collection, etc. In an embodiment, the autonomous flight of the UAV 50 can capture data equidistance around the planned circular flight path by using a Point of Interest (POI) flight mode. The POI flight mode is selected (either before or after takeoff), and once the UAV 50 is in flight, an operator can select a point of interest from a view of the UAV 50, such as but not limited to via the mobile device 100 which is in communication with the UAV 50. The view is provided by the camera 86, and the UAV 50 in conjunction with the device identifier to be in communication with the UAV 50 can determine a flight plan about the point of interest. In the method 1800, the point of interest can be the cell tower 12. The point of interest can be selected at an appropriate altitude and once selected, the UAV 50 circles in flight about the point of interest. Further, the radius, altitude, direction, and speed can be set to the point of interest flight as well as a number of repetitions of the circle. Advantageously, the point of interest flight path in a circle provides an even distance about the cell tower 12 for obtaining photos and video thereof for the 3D model. In an embodiment of a tape drop model, the UAV 50 will perform four orbits about a monopole cell tower 12 and about five or six orbits about a self-support/guyed cell tower 12. In the embodiment of a structural analysis model, the number of orbits will be increased from 2 to 3 times to acquire the data needed to construct a more realistic graphics user interface model. For small cells 90, the flight path may be limited based on the surrounding infrastructure.

Additionally, the preparation can also include focusing the camera 86 in its view of the cell tower 12 to set the proper exposure. Specifically, if the camera 86's view is too bright or too dark, the 3D modeling software will have issues in matching pictures or frames together to build the 3D model.

Once the preparation is complete and the flight path is set (step 1802), the UAV 50 flies in a plurality of orbits about the cell tower 12 (step 1804). The UAV obtains photos and/or video of the cell tower 12 and the cell site components 14 during each of the plurality of orbits (step 1806). Note, each of the plurality of orbits has different characteristics for obtaining the photos and/or video. Finally, photos and/or video is used to define a 3D model of the cell site 10 (step 1808).

For the plurality of orbits, a first orbit is around the entire cell site 10 to cover the entire cell tower 12 and associated surroundings. For monopole cell towers 12, the radius of the first orbit will typically range from 100 to 150 ft. For self-support cell towers 12, the radius can be up to 200 ft. The UAV 50's altitude should be slightly higher than that of the cell tower for the first orbit. The camera 86 should be tilted slightly down capturing more ground in the background than sky to provide more texture helping the software match the photos. The first orbit should be at a speed of about 4 ft/second (this provides a good speed for battery efficiency and photo spacing). A photo should be taken around every two seconds or at 80 percent overlap decreasing the amount that edges and textures move from each photo. This allows the software to relate those edge/texture points to each photo called tie points.

A second orbit of the plurality of orbits should be closer to the radiation centers of the cell tower 12, typically 30 to 50 ft with an altitude still slightly above the cell tower 12 with the camera 86 pointing downward. The operator should make sure all the cell site components 12 and antennas are in the frame including those on the opposite side of the cell tower 12. This second orbit will allow the 3D model to create better detail on the structure and equipment in between the antennas and the cell site components 14. This will allow contractors to make measurements on equipment between those antennas. The orbit should be done at a speed around 2.6 ft/second and still take photos close to every 2 seconds or keeping an 80 percent overlap.

A third orbit of the plurality of orbits has a lower altitude to around the mean distance between all of the cell site components 14 (e.g., Radio Access Devices (RADs)). With the lower altitude, the camera 86 is raised up such as 5 degrees or more because the ground will have moved up in the frame. This new angle and altitude will allow a full profile of all the antennas and the cell site components 14 to be captured. The orbit will still have a radius around 30 to 50 ft with a speed of about 2.6 ft/second.

The next orbit should be for a self-support cell tower 12. Here, the orbit is expanded to around 50 to 60 ft, and the altitude decreased slightly below the cell site components 14 and the camera 86 angled slightly down more capturing all of the cross barring of the self-support structure. All of the structure to the ground does not need to be captured for this orbit but close to it. The portion close to the ground will be captured in the next orbit. However, there needs to be clear spacing in whatever camera angle is chosen. The cross members in the foreground should be spaced enough for the cross members on the other side of the cell tower 12 to be visible. This is done for self-support towers 12 because of the complexity of the structure and the need for better detail which is not needed for monopoles in this area. The first orbit for monopoles provides more detail because they are at a closer distance with the cell towers 12 lower height. The speed of the orbit can be increased to around 3 ft/second with the same spacing.

The last orbit for all cell towers 12 should have an increased radius to around 60 to 80 ft with the camera 86 looking more downward at the cell site 10. The altitude should be decreased to get closer to the cell site 10 compound. The altitude should be around 60 to 80 ft but will change slightly depending on the size of the cell site 10 compound. The angle of the camera 86 with the altitude should be such as where the sides and tops of structures such as the shelters will be visible throughout the orbit. It is important to make sure the whole cell site 10 compound is in the frame for the entire orbit allowing the capture of every side of everything inside the compound including the fencing. The speed of the orbit should be around 3.5 ft/second with same photo time spacing and overlap.

The total amount of photos that should be taken for a monopole cell tower 12 should be around 300-400 and the total amount of photos for self-support cell tower 12 should be between 400-500 photos. Too many photos can indicate that the photos were taken too close together. Photos taken in succession with more than 80 percent overlap can cause errors in the processing of the model and cause extra noise around the details of the tower and lower the distinguishable parts for the software.

§ 16.0 3D Modeling Data Capture Systems and Methods Using Multiple Cameras

Figure 30A:
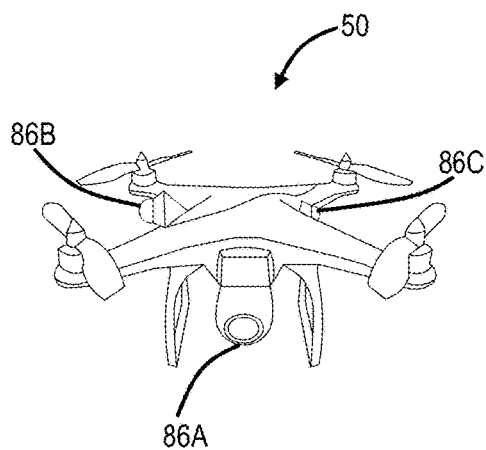
FIGS. 30A and 30B are block diagrams of a UAV with multiple cameras (FIG. 30A) and a camera array (FIG. 30B)
Figure 30B:
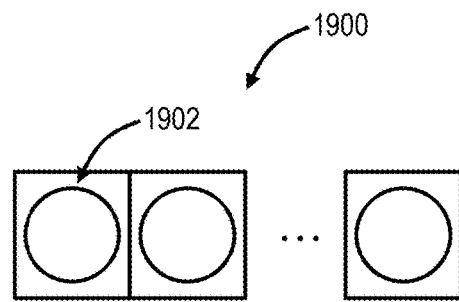

FIGS. 30A and 30B are block diagrams of a UAV 50 with multiple cameras 86A, 86B, 86C (FIG. 30A) and a camera array 1900 (FIG. 30B). The UAV 50 can include the multiple cameras 86A, 86B, 86C which can be located physically apart on the UAV 50. In another embodiment, the multiple cameras 86A, 86B, 86C can be in a single housing. In all embodiments, each of the multiple cameras 86A, 86B, 86C can be configured to take a picture of a different location, different area, different focus, etc. That is, the cameras 86A, 86B, 86C can be angled differently, have a different focus, etc. The objective is for the cameras 86A, 86B, 86C together to cover a larger area than a single camera 86. In a conventional approach for 3D modeling, the camera 86 is configured to take hundreds of pictures for the 3D model. For example, as described with respect to the 3D modeling method 1800, 300-500 pictures are required for an accurate 3D model. In practice, using the limitations described in the 3D modeling method 1800, this process, such as with the UAV 50, can take hours. It is the objective of the systems and methods with multiple cameras to streamline this process such as reduce this time by half or more. The cameras 86A, 86B, 86C are coordinated and communicatively coupled to one another and the processor 102.

In FIG. 30B, the camera array 1900 includes a plurality of cameras 1902. Each of the cameras 1902 can be individual cameras each with its own settings, i.e., angle, zoom, focus, etc. The camera array 1900 can be mounted on the UAV 50, such as the camera 86. The camera array 1900 can also be portable, mounted on or at the cell site 10, and the like.

In the systems and methods herein, the cameras 86A, 86B, 86C and the camera array 1900 are configured to work cooperatively to obtain pictures to create a 3D model. In an embodiment, the 3D model is a cell site 10. As described herein, the systems and methods utilize at least two cameras, e.g., the cameras 86A, 86B, or two cameras 1902 in the camera array 1900. Of course, there can be greater than two cameras. The multiple cameras are coordinated such that one event where pictures are taken produce at least two pictures. Thus, to capture 300-500 pictures, less than 150-250 pictures are actually taken.

Figure 31:
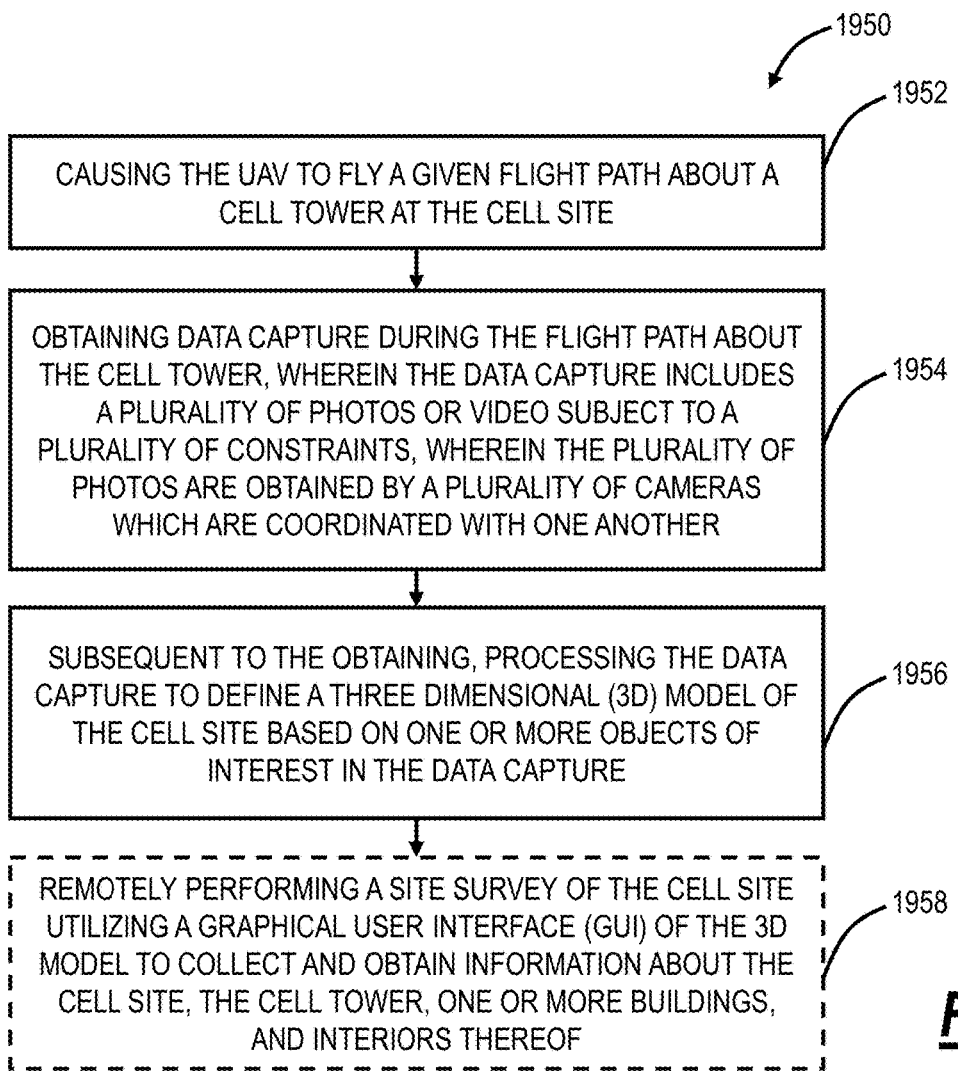
FIG. 31 is a flowchart of a method using multiple cameras to obtain accurate three-dimensional (3D) modeling data.

FIG. 31 is a flowchart of a method 1950 using multiple cameras to obtain accurate 3D modeling data. In the method 1950, the multiple cameras are used with the UAV 50, but other embodiments are also contemplated. The method 1950 includes causing the UAV to fly a given flight path about a cell tower at the cell site (step 1952); obtaining data capture during the flight path about the cell tower, wherein the data capture includes a plurality of photos or video subject to a plurality of constraints, wherein the plurality of photos are obtained by a plurality of cameras which are coordinated with one another (step 1954); and, subsequent to the obtaining, processing the data capture to define a 3D model of the cell site based on one or more objects of interest in the data capture (step 1956). The method 1950 can further include remotely performing a site survey of the cell site utilizing a GUI of the 3D model to collect and obtain information about the cell site, the cell tower, one or more buildings, and interiors thereof (step 1958). The flight path can include a plurality of orbits comprising at least four orbits around the cell tower each with a different set of characteristics of altitude, radius, and camera angle.

A launch location and launch orientation can be defined for the UAV to take off and land at the cell site such that each flight at the cell site has the same launch location and launch orientation. The plurality of constraints can include each flight of the UAV having a similar lighting condition and at about a same time of day. A total number of photos can include around 300-400 for the monopole cell tower and 500-600 for the self-support cell tower, and the total number is taken concurrently by the plurality of cameras. The data capture can include a plurality of photographs each with at least 10 megapixels and wherein the plurality of constraints comprises each photograph having at least 75% overlap with another photograph. The data capture can include a video with at least 4 k high definition and wherein the plurality of constraints can include capturing a screen from the video as a photograph having at least 75% overlap with another photograph captured from the video. The plurality of constraints can include a plurality of flight paths around the cell tower with each of the plurality of flight paths at one or more of different elevations and each of the plurality of cameras with different camera angles and different focal lengths.

In another embodiment, an apparatus adapted to obtain data capture at a cell site for developing a 3D model thereof includes a network interface and a processor communicatively coupled to one another; and memory storing instructions that, when executed, cause the processor to cause the UAV to fly a given flight path about a cell tower at the cell site; obtain data capture during the flight path about the cell tower, wherein the data capture comprises a plurality of photos or video subject to a plurality of constraints, wherein the plurality of photos are obtained by a plurality of cameras which are coordinated with one another; and process the obtained data capture to define a 3D model of the cell site based on one or more objects of interest in the data capture.

§ 17.0 Multiple Camera Apparatus and Process

FIGS. 32 and 33 are diagrams of a multiple camera apparatus 2000 and use of the multiple camera apparatus 2000 in the shelter or cabinet 52 or the interior 900 of the building 902. As previously described herein, the camera 930 can be used in the interior 900 for obtaining photos for 3D modeling and for virtual site surveys. The multiple camera apparatus 2000 is an improvement to the camera 930, enabling multiple photos to be taken simultaneously of different views, angles, zoom, etc. In an embodiment, the multiple camera apparatus 2000 can be operated by a technician at the building 902 to quickly, efficiently, and properly obtain photos for a 3D model of the interior 900. In another embodiment, the multiple camera apparatus 2000 can be mounted in the interior 900 and remotely controlled by an operator.

The multiple camera apparatus 2000 includes a post 2002 with a plurality of cameras 2004 disposed or attached to the post 2002. The plurality of cameras 2004 can be interconnected to one another and to a control unit 2006 on the post. The control unit 2006 can include user controls to cause the cameras 2004 to each take a photo and memory for storing the photos from the cameras 2004. The control unit 2006 can further include communication mechanisms to provide the captured photos to a system for 3D modeling (either via a wired and/or wireless connection). In an embodiment, the post 2002 can be about 6' and the cameras 2004 can be positioned to enable data capture from the floor to the ceiling of the interior 900.

The multiple camera apparatus 2000 can include other physical embodiments besides the post 2002. For example, the multiple camera apparatus 2000 can include a box with the multiple cameras 2004 disposed therein. In another example, the multiple camera apparatus 2000 can include a handheld device which includes the multiple cameras 2004.

The objective of the multiple camera apparatus 2000 is to enable a technician (either on-site or remote) to quickly capture photos (through the use of the multiple cameras 2004) for a 3D model and to properly capture the photos (through the multiple cameras 2004 have different zooms, angles, etc.). That is, the multiple camera apparatus 2000 ensures the photo capture is sufficient to accurately develop the 3D model, avoiding potentially revisiting the building 902.

FIG. 34 is a flowchart of a data capture method 2050 in the interior 900 using the multiple camera apparatus 2000. The method 2050 includes obtaining or providing the multiple camera apparatus 2000 at the shelter or cabinet 52 or the interior 900 of the building 902 and positioning the multiple camera apparatus 2000 therein (step 2052). The method 2050 further includes causing the plurality of cameras 2004 to take photos based on the positioning (step 2054) and repositioning the multiple camera apparatus 2000 at a different location in the shelter or cabinet 52 or the interior 900 of the building 902 to take additional photos (step 2056). Finally, the photos taken by the cameras 2004 are provided to a 3D modeling system to develop a 3D model of the shelter or cabinet 52 or the interior 900 of the building 902, such as for a virtual site survey (step 2058).

The repositioning step 2056 can include moving the multiple camera apparatus to each corner of the shelter, the cabinet, or the interior of the building. The repositioning step 2056 can include moving the multiple camera apparatus to each row of equipment in the shelter, the cabinet, or the interior of the building. The multiple camera apparatus can include a pole with the plurality of cameras disposed thereon, each of the plurality of cameras configured for a different view. The plurality of cameras are communicatively coupled to a control unit for the causing step 2054 and/or the providing step 2058. Each of the plurality of cameras can be configured on the multiple camera apparatus for a different view, zoom, and/or angle. The method 2050 can include analyzing the photos subsequent to the repositioning, and determining whether the photos are suitable for the 3D model, and responsive to the photos not being suitable for the 3D model, instructing a user to retake the photos which are not suitable. The method 2050 can include combing the photos of the shelter, the cabinet, or the interior of the building with photos of a cell tower at the cell site, to form a 3D model of the cell site. The method 2050 can include performing a virtual site survey of the cell site using the 3D model. The repositioning step 2056 can be based on a review of the photos taken in the causing.

§ 18.0 Cell Site Verification Using 3D Modeling

Figure 35:
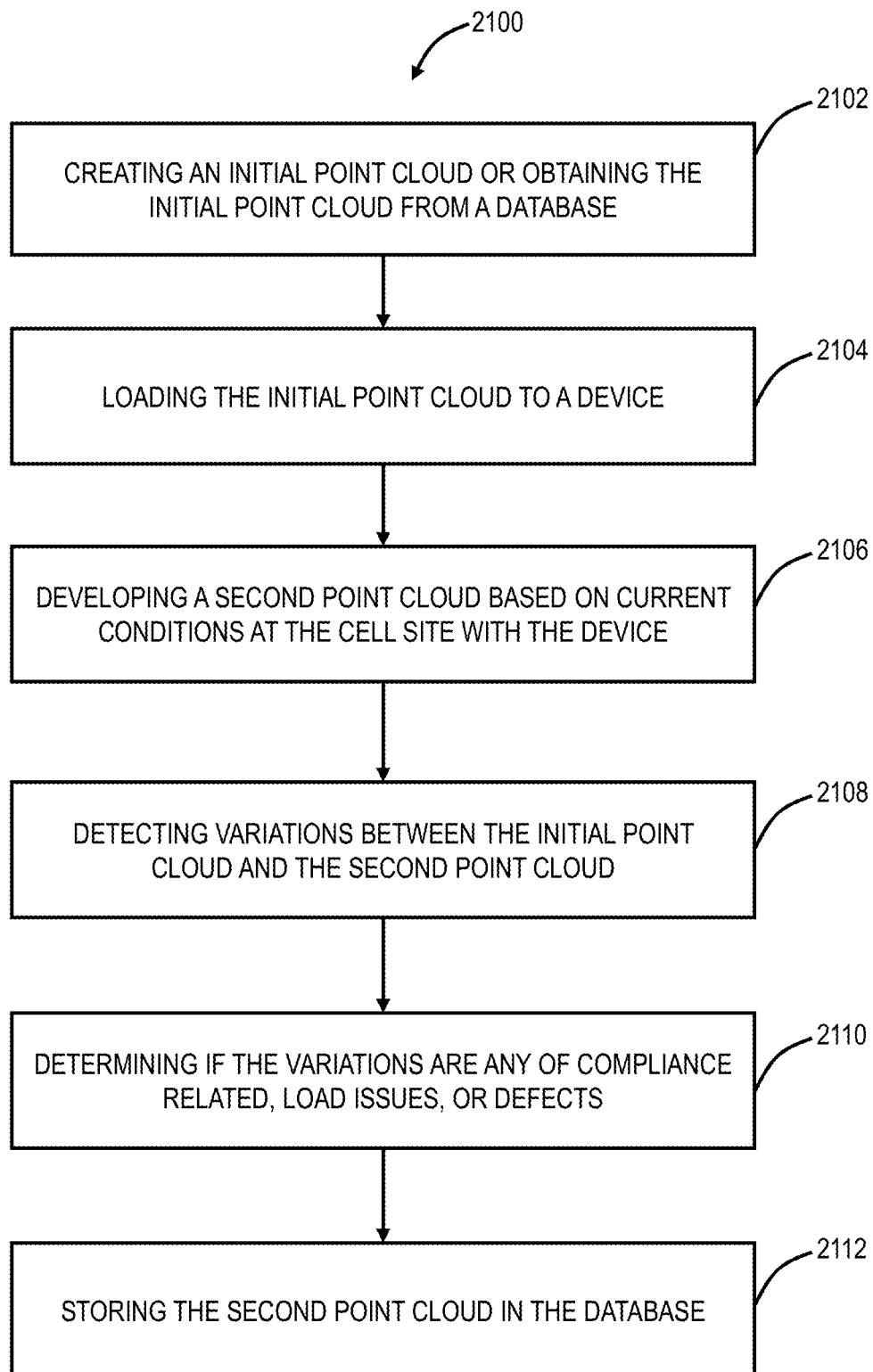
FIG. 35 is a flowchart of a method for verifying equipment and structures at the cell site using 3D modeling.

FIG. 35 is a flowchart of a method 2100 for verifying equipment and structures at the cell site 10 using 3D modeling. As described herein, an intermediate step in the creation of a 3D model includes a point cloud, e.g., a sparse or dense point cloud. A point cloud is a set of data points in some coordinate system, e.g., in a three-dimensional coordinate system, these points are usually defined by X, Y, and Z coordinates, and can be used to represent the external surface of an object. Here, the object can be anything associated with the cell site 10, e.g., the cell tower 12, the cell site components 14, etc. As part of the 3D model creation process, a large number of points on an object's surface are determined, and the output is a point cloud in a data file. The point cloud represents the set of points that the device has measured.

Various descriptions were presented herein for site surveys, close-out audits, etc. In a similar manner, there is a need to continually monitor the state of the cell site 10. Specifically, as described herein, conventional site monitoring techniques typically include tower climbs. The UAV 50 and the various approaches described herein provide safe and more efficient alternatives to tower climbs. Additionally, the UAV 50 can be used to provide cell site 10 verification to monitor for site compliance, structural or load issues, defects, and the like. The cell site 10 verification can utilize point clouds to compare "before" and "after" data capture to detect differences.

With respect to site compliance, the cell site 10 is typically owned and operated by a cell site operator (e.g., real estate company or the like) separate from cell service providers with their associated cell site components 14. The typical transaction includes leases between these parties with specific conditions, e.g., the number of antennas, the amount of equipment, the location of equipment, etc. It is advantageous for cell site operators to periodically audit/verify the state of the cell site 10 with respect to compliance, i.e., has cell service provider A added more cell site components 14 than authorized? Similarly, it is important for cell site operators to periodically check the cell site 10 to proactively detect load issues (too much equipment on the structure of the cell tower 12), defects (equipment detached from the structure), etc.

One approach to verifying the cell site 10 is a site survey, including the various approaches to site surveys described herein, including the use of 3D models for remote site surveys. In various embodiments, the method 2100 provides a quick and automated mechanism to quickly detect concerns (i.e., compliance issues, defects, load issues, etc.)

using point clouds. Specifically, the method 2100 includes creating an initial point cloud for a cell site 10 or obtaining the initial point cloud from a database (step 2102). The initial point cloud can represent a known good condition, i.e., with no compliance issues, load issues, defects, etc. For example, the initial point cloud could be developed as part of the close-out audit, etc. The initial point cloud can be created using the various data acquisition techniques described herein using the UAV 50. Also, a database can be used to store the initial point cloud.

The initial point cloud is loaded in a device, such as the UAV 50 (step 2104). The point cloud data files can be stored in the memory in a processing device associated with the UAV 50. In an embodiment, multiple point cloud data files can be stored in the UAV 50, allowing the UAV 50 to be deployed to perform the method 2100 at a plurality of cell sites 10. The device (UAV 50) can be used to develop a second point cloud based on current conditions at the cell site 10 (step 2106). Again, the UAV 50 can use the techniques described herein relative to data acquisition to develop the second point cloud. Note, it is preferable to use a similar data acquisition for both the initial point cloud and the second point cloud, e.g., similar takeoff locations/orientations, similar paths about the cell tower 12, etc. This ensures similarity in the data capture. In an embodiment, the initial point cloud is loaded to the UAV 50 along with instructions on how to perform the data acquisition for the second point cloud. The second point cloud is developed at a current time, i.e., when it is desired to verify aspects associated with the cell site 10.

Variations are detected between the initial point cloud and the second point cloud (step 2108). The variations could be detected by the UAV 50, in an external server, in a database, etc. The objective here is the initial point cloud and the second point cloud provides a quick and efficient comparison to detect differences, i.e., variations. The method 2100 includes determining if the variations are ant of compliance related, load issues, or defects (step 2110). Note, variations can be simply detected based on raw data differences between the point clouds. The step 2110 requires additional processing to determine what the underlying differences are. In an embodiment, the variations are detected in the UAV 50, and, if detected, additional processing is performed by a server to actually determine the differences based on creating a 3D model of each of the point clouds. Finally, the second point cloud can be stored in the database for future processing (step 2112). An operator of the cell site 10 can be notified via any technique of any determined variations or differences for remedial action based thereon (addressing non-compliance, performing maintenance to fix defects or load issues, etc.).

The above is also applicable for verifying small cells 90.

§ 19.0 Cell Site Audit and Survey Via Photo Stitching

Photo stitching or linking is a technique where multiple photos of either overlapping fields of view or adjacent fields of view are linked together to produce a virtual view or segmented panorama of an area. A common example of this approach is the so-called Street view offered by online map providers. In various embodiments, the systems and methods enable a remote user to perform a cell site audit, survey, site inspection, etc. using a User Interface (UI) with photo stitching/linking to view the cell site 10. The various activities can include any of the aforementioned activities described herein. Further, the photos can also be obtained using any of the aforementioned techniques. Of note, the photos required for a photo stitched UI are significantly less than those required by the 3D model. However, the photo stitched UI can be based on the photos captured for the 3D model, e.g., a subset of the photos. Alternatively, the photo capture for the photo stitched UI can be captured separately. Variously, the photos for the UI are captured, and a linkage is provided between photos. The linkage allows a user to navigate between photos to view up, down, left, or right, i.e., to navigate the cell site 10 via the UI. The linkage can be noted in a photo database with some adjacency indicator. The linkage can be manually entered via a user reviewing the photos or automatically based on location tags associated with the photos.

Figure 36:
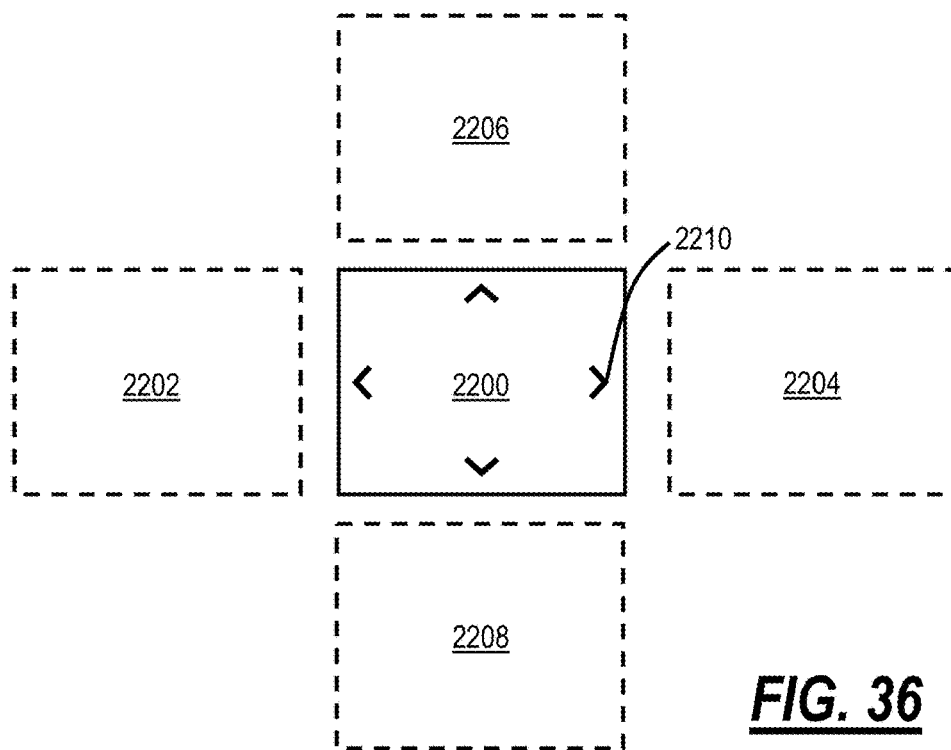
FIG. 36 is a diagram of a photo stitching User Interface (UI) for cell site audits, surveys, inspections, etc. remotely.

FIG. 36 is a diagram of a photo stitching UI 2200 for cell site audits, surveys, inspections, etc. remotely. The UI 2200 is viewed by a computer accessing a database of a plurality of photos with the linkage between each other based on adjacency. The photos are of the cell site 10 and can include the cell tower 12 and associated cell site components as well as interior photos of the shelter or cabinet 52 of the interior 900. The UI 2200 displays a photo of the cell site 12 and the user can navigate to the left to a photo 2202, to the right to a photo 2204, up to a photo 2206, or down to a photo 2208. The navigation between the photos 2202, 2204, 2206, 2208 is based on the links between the photos. In an embodiment, a navigation icon 2210 is shown in the UI 2200 from which the user can navigate the UI 2200. Also, the navigation can include opening and closing a door to the shelter or cabinet 52.

In an embodiment, the UI 2200 can include one of the photos 2202, 2204, 2206, 2208 at a time with the navigation moving to a next photo. In another embodiment, the navigation can scroll through the photos 2202, 2204, 2206, 2208 seamlessly. In either approach, the UI 2200 allows virtual movement around the cell site 10 remotely. The photos 2202, 2204, 2206, 2208 can each be a high-resolution photo, e.g., 8 megapixels or more. From the photos 2202, 2204, 2206, 2208, the user can read labels on equipment, check cable runs, check equipment location and installation, check cabling, etc. Also, the user can virtually scale the cell tower 12 avoiding a tower climb. An engineer can use the UI 2200 to perform site expansion, e.g., where to install new equipment. Further, once the new equipment is installed, the associated photos can be updated to reflect the new equipment. It is not necessary to update all photos, but rather only the photos of new equipment locations.

The photos 2202, 2204, 2206, 2208 can be obtained using the data capture techniques described herein. The camera used for capturing the photos can be a 180, 270, or 360-degree camera. These cameras typically include multiple sensors allowing a single photo capture to capture a large view with a wide lens, fish eye lens, etc. The cameras can be mounted on the UAV 50 for capturing the cell tower 12, the multiple camera apparatus 2000, etc. Also, the cameras can be the camera 930 in the interior 900.

Figure 37:
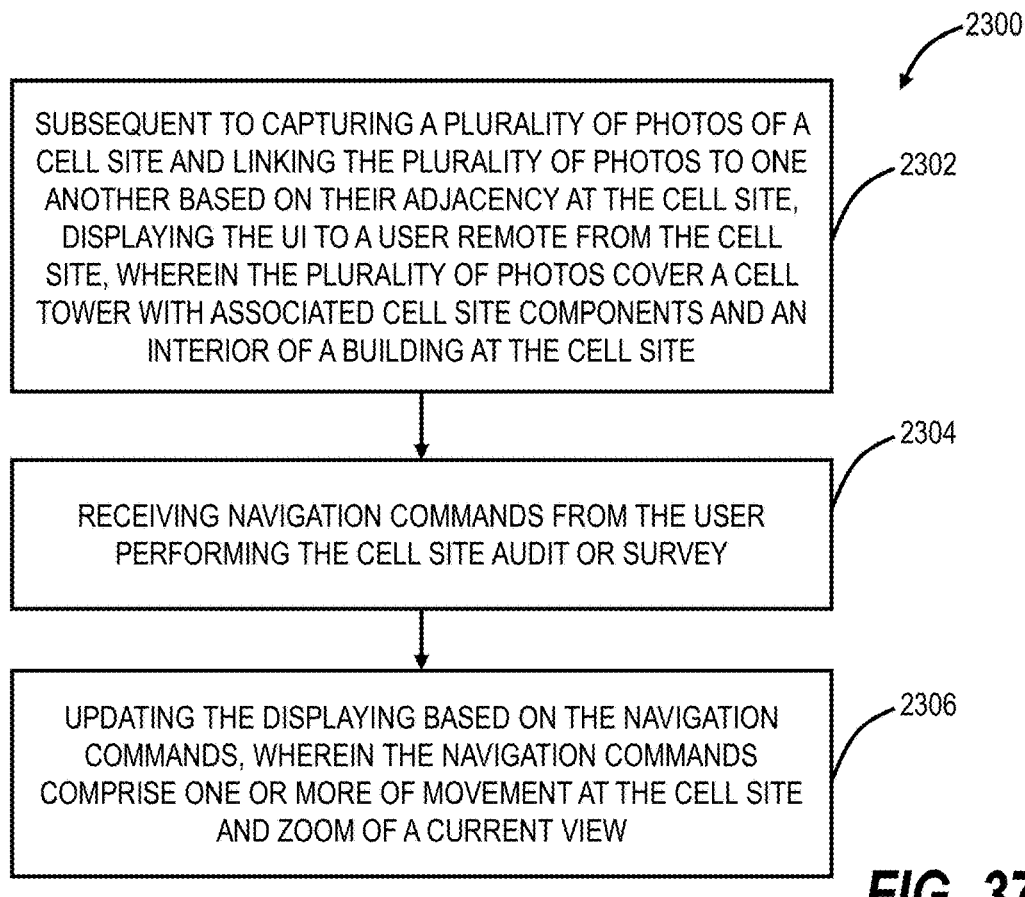
FIG. 37 is a flowchart of a method for performing a cell site audit or survey remotely via a User Interface (UI)

FIG. 37 is a flowchart of a method 2300 for performing a cell site audit or survey remotely via a User Interface (UI). The method 2300 includes, subsequent to capturing a plurality of photos of a cell site and linking the plurality of photos to one another based on their adjacency at the cell site, displaying the UI to a user remote from the cell site, wherein the plurality of photos cover a cell tower with associated cell site components and an interior of a building at the cell site (step 2302); receiving navigation commands from the user performing the cell site audit or survey (step 2304); and updating the displaying based on the navigation commands, wherein the navigation commands comprise one or more of movement at the cell site and zoom of a current view (step 2306). The capturing the plurality of photos can be performed for a cell tower with a UAV flying about the cell tower. The linking the plurality of photos can be performed one of manually and automatically based on location identifiers associated with each photo.

The user performing the cell site audit or survey can include determining a down tilt angle of one or more antennas of the cell site components based on measuring three points comprising two defined by each antenna and one by an associated support bar; determining plumb of the cell tower and/or the one or more antennas, azimuth of the one or more antennas using a location determination in the photos; determining dimensions of the cell site components; determining equipment type and serial number of the cell site components; and determining connections between the cell site components. The plurality of photos can be captured concurrently with developing a three-dimensional (3D) model of the cell site. The updating the displaying can include providing a new photo based on the navigation commands. The updating the displaying can include seamlessly panning between the plurality of photos based on the navigation commands.

§ 20.0 Subterranean 3D Modeling

Figure 38:
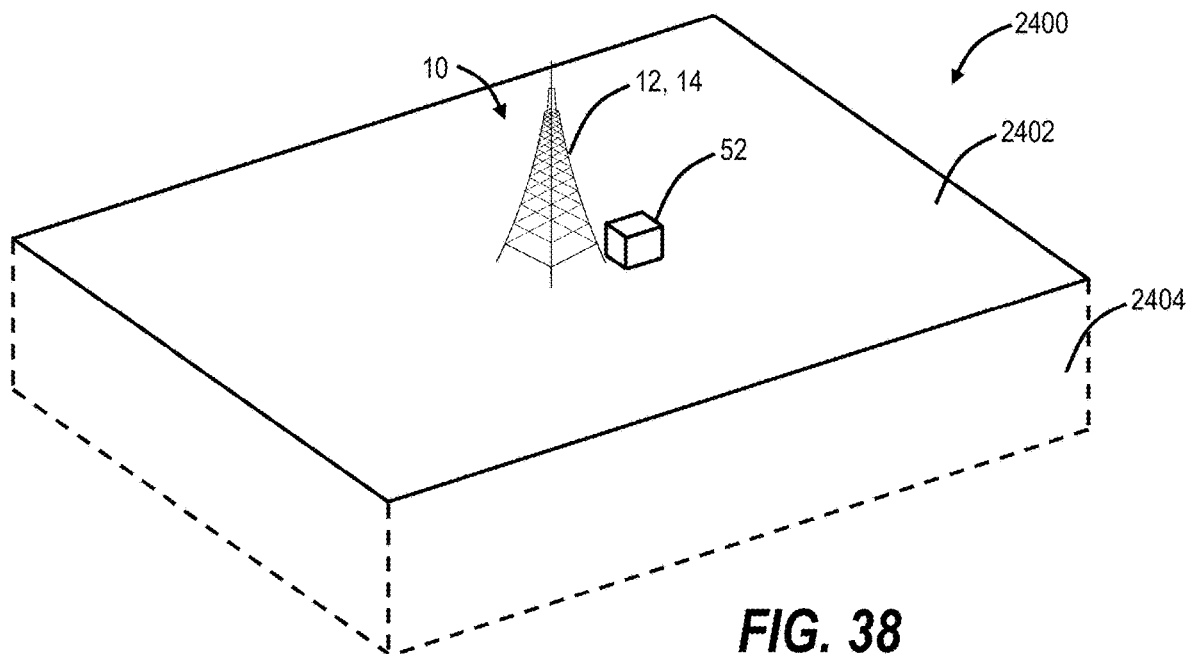
FIG. 38 is a perspective diagram of a 3D model of the cell site, the cell tower, the cell site components, and the shelter or cabinet along with surrounding geography and subterranean geography.

The foregoing descriptions provide techniques for developing a 3D model of the cell site 10, the cell tower 12, the cell site components 14, the shelter or cabinet 52, the interior 900 of the building 902, etc. The 3D model can be used for a cell site audit, survey, site inspection, etc. In addition, the 3D model can also include a subterranean model of the surrounding area associated with the cell site 10. FIG. 38 is a perspective diagram of a 3D model 2400 of the cell site 10, the cell tower 12, the cell site components 14, and the shelter or cabinet 52 along with surrounding geography 2402 and subterranean geography 2404. Again, the 3D model 2400 of the cell site 10, the cell tower 12, the cell site components 14, and the shelter or cabinet 52 along with a 3D model of the interior 900 can be constructed using the various techniques described herein.

In various embodiments, the systems and methods extend the 3D model 2400 to include the surrounding geography 2402 and the subterranean geography 2404. The surrounding geography 2402 represents the physical location around the cell site 10. This can include the cell tower 12, the shelter or cabinet 52, access roads, etc. The subterranean geography 2404 includes the area underneath the surrounding geography 2402.

The 3D model 2400 portion of the surrounding geography 2402 and the subterranean geography 2404 can be used by operators and cell site 10 owners for a variety of purposes. First, the subterranean geography 2404 can show locations of utility constructions including electrical lines, water/sewer lines, gas lines, etc. Knowledge of the utility constructions can be used in site planning and expansion, i.e., where to build new structures, where to run new underground utility constructions, etc. For example, it would make sense to avoid new above-ground structures in the surrounding geography 2402 on top of gas lines or other utility constructions if possible. Second, the subterranean geography 2404 can provide insight into various aspects of the cell site 10 such as depth of support for the cell tower 12, the ability of the surrounding geography 2402 to support various structures, the health of the surrounding geography 2402, and the like. For example, for new cell site components 14 on the cell tower 12, the 3D model 2400 can be used to determine whether there will be support issues, i.e., a depth of the underground concrete supports of the cell tower 12.

Data capture for the 3D model 2400 for the subterranean geography 2404 can use various known 3D subterranean modeling techniques such as sonar, ultrasound, LIDAR (Light Detection and Ranging), and the like. Also, the data capture for the 3D model 2400 can utilize external data sources such as utility databases which can include the location of the utility constructions noted by location coordinates (e.g., GPS). In an embodiment, the data capture can be verified with the external data sources, i.e., data from the external data sources can verify the data capture using the 3D subterranean modeling techniques.

The 3D subterranean modeling techniques utilize a data capture device based on the associated technology. In an embodiment, the data capture device can be on the UAV 50. In addition to performing the data capture techniques described herein for the cell tower 12, the UAV 50 can perform data capture by flying around the surrounding geography 2402 with the data capture device aimed at the subterranean geography 2404. The UAV 50 can capture data for the 3D model 2400 for both the above ground components and the subterranean geography 2404.

In another embodiment, the data capture device can be used separately from the UAV 50, such as via a human operator moving about the surrounding geography 2402 aiming the data capture device at the subterranean geography 2404, via a robot or the like with the data capture device connected thereto, and the like.

Figure 39:
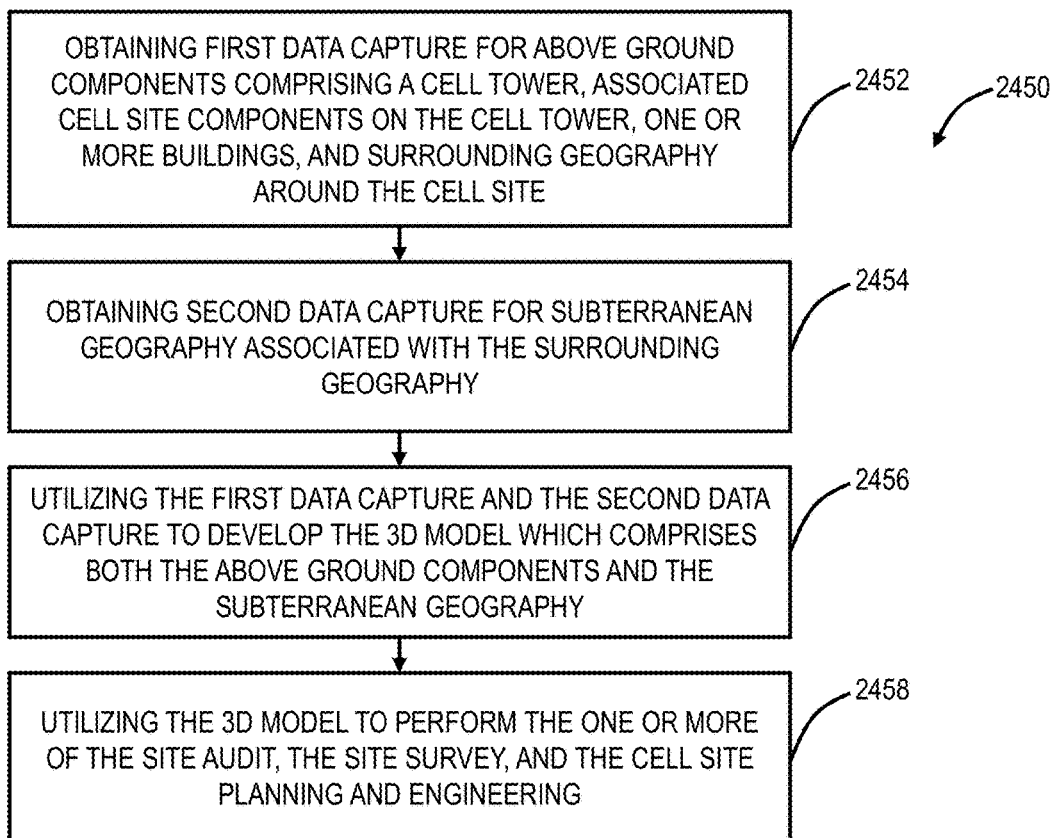
FIG. 39 is a flowchart of a method for creating a three-dimensional (3D) model of a cell site for one or more of a cell site audit, a site survey, and cell site planning and engineering.

FIG. 39 is a flowchart of a method 2400 for creating a 3D model of a cell site for one or more of a cell site audit, a site survey, and cell site planning and engineering. The method 2450 includes obtaining first data capture for above ground components including a cell tower, associated cell site components on the cell tower, one or more buildings, and surrounding geography around the cell site (step 2402); obtaining second data capture for subterranean geography associated with the surrounding geography (step 2404); utilizing the first data capture and the second data capture to develop the 3D model which includes both the above ground components and the subterranean geography (step 2406); and utilizing the 3D model to perform the one or more of the site audit, the site survey, and the cell site planning and engineering (step 2408).

The method 2450 can further include obtaining third data capture of interiors of the one or more buildings; and utilizing the third data capture to develop the 3D model for the interiors. The obtaining second data capture can be performed with a data capture device using one of sonar, ultrasound, and LIDAR (Light Detection and Ranging). The obtaining first data capture can be performed with a UAV flying about the cell tower, and wherein the obtaining second data capture can be performed with the data capture device on the UAV. The obtaining first data capture can be performed with a UAV flying about the cell tower. The first data capture can include a plurality of photos or video subject to a plurality of constraints, wherein the plurality of photos are obtained by a plurality of cameras which are coordinated with one another. The 3D model can be presented in a GUI to perform the one or more of the site audit, the site survey, and the cell site planning and engineering. The subterranean geography in the 3D model can illustrate support structures of the cell tower and utility constructions in the surrounding geography. The method can further include utilizing an external data source to verify utility constructions in the second data capture for the subterranean geography.

§ 21.0 3 D Model of Cell Sites for Modeling Fiber Connectivity

As described herein, various approaches are described for 3D models for cell sites for cell site audits, site surveys, close-out audits, etc. which can be performed remotely (virtual). In an embodiment, the 3D model is further extended to cover surrounding areas focusing on fiber optic cables near the cell site. Specifically, with the fiber connectivity in the 3D model, backhaul connectivity can be determined remotely.

Figure 40:
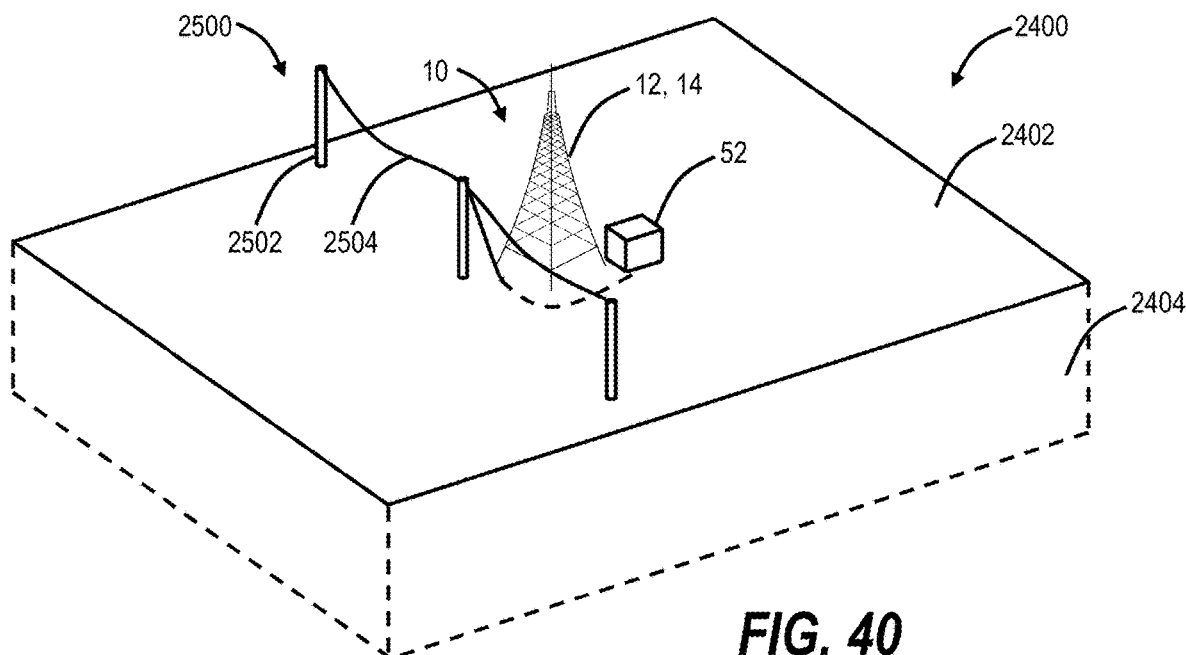
FIG. 40 is a perspective diagram of the 3D model of FIG. 38 of the cell site, the cell tower, the cell site components, and the shelter or cabinet along with surrounding geography, subterranean geography, and including fiber connectivity.

FIG. 40 is a perspective diagram of the 3D model 2400 of the cell site 10, the cell tower 12, the cell site components 14, and the shelter or cabinet 52 along with surrounding geography 2402, subterranean geography 2404, and fiber connectivity 2500. Again, the 3D model 2400 of the cell site 10, the cell tower 12, the cell site components 14, and the shelter or cabinet 52 along with a 3D model of the interior 900 can be constructed using the various techniques described herein. Specifically, FIG. 40 extends the 3D model 2400 in FIG. 39 and in other areas described herein to further include fiber cabling.

As previously described, the systems and methods extend the 3D model 2400 to include the surrounding geography 2402 and the subterranean geography 2404. The surrounding geography 2402 represents the physical location around the cell site 10. This can include the cell tower 12, the shelter or cabinet 52, access roads, etc. The subterranean geography 2404 includes the area underneath the surrounding geography 2402. Additionally, the 3D model 2400 also includes the fiber connectivity 2500 including components above ground in the surrounding geography 2402 and as well as the subterranean geography 2404.

The fiber connectivity 2500 can include poles 2502 and cabling 2504 on the poles 2502. The 3D model 2400 can include the fiber connectivity 2500 at the surrounding geography 2402 and the subterranean geography 2404. Also, the 3D model can extend out from the surrounding geography 2402 on a path associated with the fiber connectivity 2500 away from the cell site 10. Here, this can give the operator the opportunity to see where the fiber connectivity 2500 extends. Thus, various 3D models 2400 can provide a local view of the cell sites 10 as well as fiber connectivity 2500 in a geographic region. With this information, the operator can determine how close fiber connectivity 2500 is to current or future cell sites 10, as well as perform site planning.

A geographic region can include a plurality of 3D models 2400 along with the fiber connectivity 2500 across the region. A collection of these 3D models 2400 in the region enables operators to perform more efficient site acquisition and planning.

Data capture of the fiber connectivity 2500 can be through the UAV 50 as described herein. Advantageously, the UAV 50 is efficient to capture photos or video of the fiber connectivity 2500 without requiring site access (on the ground) as the poles 2502 and the cabling 2504 may traverse private property, etc. Also, other forms of data capture are contemplated such as via a car with a camera, a handheld camera, etc.

The UAV 50 can be manually flown at the cell site 10, and once the cabling 2504 is identified, an operator can trace the cabling 2504 to capture photos or video for creating the 3D model 2400 with the fiber connectivity 2500. For example, the operator can identify the fiber connectivity 2500 near the cell site 10 in the surrounding geography 2402 and then cause the UAV 50 to fly a path similar to the path taken by the fiber connectivity 2500 while performing data capture. Once the data is captured, the photos or video can be used to develop a 3D model of the fiber connectivity 2500 which can be incorporated in the 3D model 2400. Also, the data capture can use the techniques for the subterranean geography 2404 as well.

Figure 41:
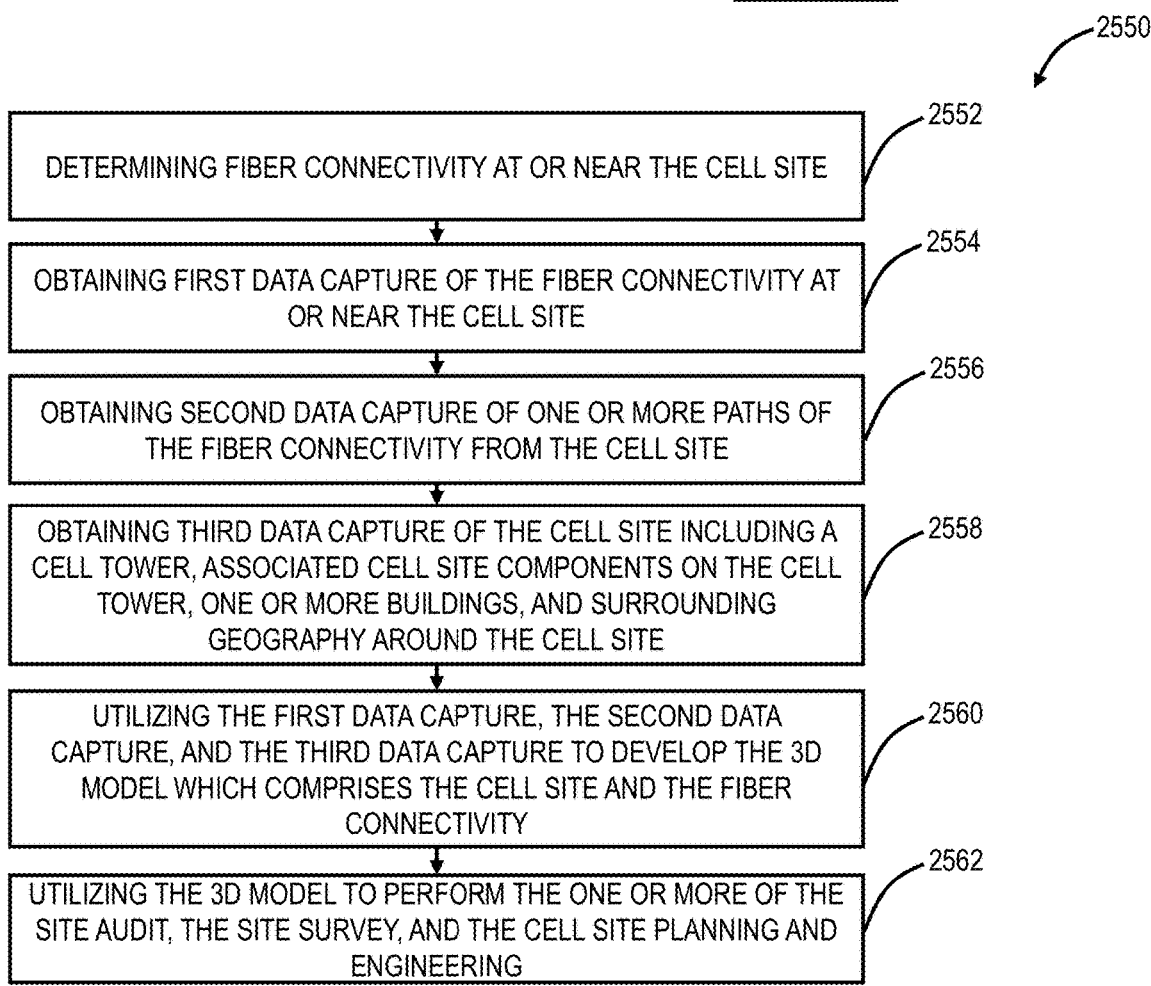
FIG. 41 is a flowchart of a method for creating a three-dimensional (3D) model of a cell site and associated fiber connectivity for one or more of a cell site audit, a site survey, and cell site planning and engineering.

FIG. 41 is a flowchart of a method 2550 for creating a 3D model of a cell site and associated fiber connectivity for one or more of a cell site audit, a site survey, and cell site planning and engineering. The method 2550 includes determining fiber connectivity at or near the cell site (step 2552); obtaining first data capture of the fiber connectivity at or near the cell site (step 2554); obtaining second data capture of one or more paths of the fiber connectivity from the cell site (step 2556); obtaining third data capture of the cell site including a cell tower, associated cell site components on the cell tower, one or more buildings, and surrounding geography around the cell site (step 2558); utilizing the first data capture, the second data capture, and the third data capture to develop the 3D model which comprises the cell site and the fiber connectivity (step 2560); and utilizing the 3D model to perform the one or more of the site audit, the site survey, and the cell site planning and engineering (step 2560).

The method 2550 can further include obtaining fourth data capture for subterranean geography associated with the surrounding geography of the cell site; and utilizing the fourth data capture with the first data capture, the second data capture, and the third data capture to develop the 3D model. The fourth data capture can be performed with a data capture device using one of sonar, ultrasound, photogrammetry, and LIDAR (Light Detection and Ranging).

The method 2550 can further include obtaining fifth data capture of interiors of one or more buildings at the cell site; and utilizing the fifth data capture with the first data capture, the second data capture, the third data capture, and the fourth data capture to develop the 3D model. The obtaining first data capture and the obtaining second data capture can be performed with a UAV flying about the cell tower with a data capture device on the UAV. An operator can cause the UAV to fly the one or more paths to obtain the second data capture.

The obtaining first data capture, the obtaining second data capture, and the obtaining third data capture can be performed with a UAV flying about the cell tower with a data capture device on the UAV. The third data capture can include a plurality of photos or video subject to a plurality of constraints, wherein the plurality of photos are obtained by a plurality of cameras which are coordinated with one another. The 3D model can be presented in a GUI to perform the one or more of the site audit, the site survey, and the cell site planning and engineering.

In a further embodiment, an apparatus adapted to create a 3D model of a cell site and associated fiber connectivity for one or more of a cell site audit, a site survey, and cell site planning and engineering includes a network interface, a data capture device, and a processor communicatively coupled to one another; and memory storing instructions that, when executed, cause the processor to determine fiber connectivity at or near the cell site based on feedback from the data capture device; obtain first data capture of the fiber connectivity at or near the cell site; obtain second data capture of one or more paths of the fiber connectivity from the cell site; obtain third data capture of the cell site including a cell tower, associated cell site components on the cell tower, one or more buildings, and surrounding geography around the cell site; utilize the first data capture, the second data capture, and the third data capture to develop the 3D model which comprises the cell site and the fiber connectivity; and utilize the 3D model to perform the one or more of the site audit, the site survey, and the cell site planning and engineering.

§ 22.0 Detecting Changes at the Cell Site and Surrounding Area Using UAVs

Figure 42:
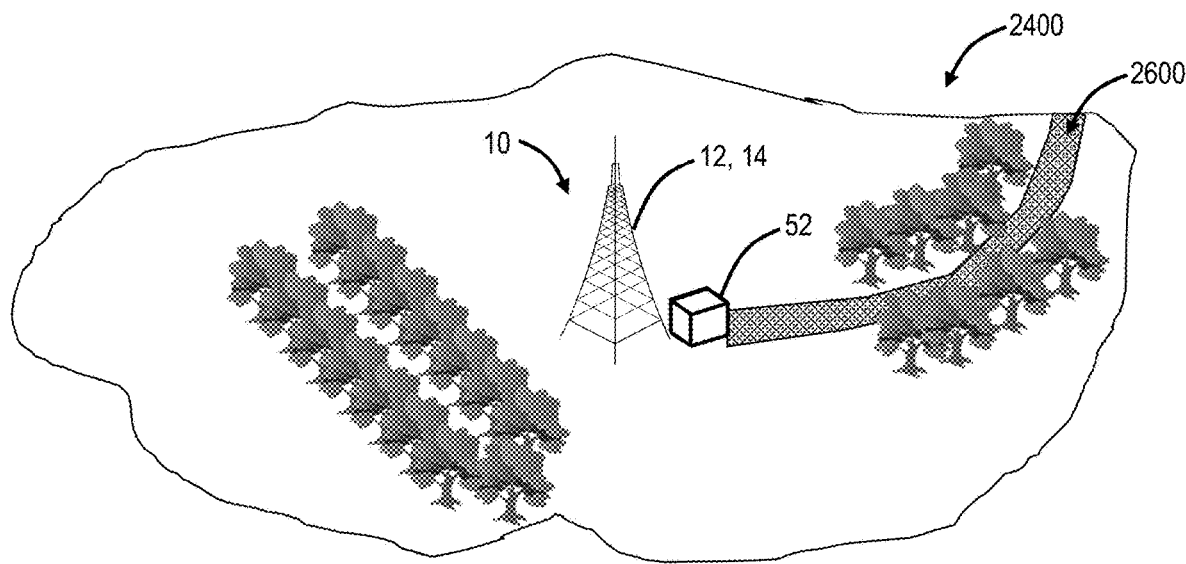
FIG. 42 is a perspective diagram of a cell site with the surrounding geography.

FIG. 42 is a perspective diagram of a cell site 10 with the surrounding geography 2402. FIG. 42 is an example of a typical cell site. The cell tower 12 can generally be classified as a self-support tower, a monopole tower, and a guyed tower. These three types of cell towers 12 have different support mechanisms. The self-support tower can also be referred to as a lattice tower, and it is free standing, with a triangular base with three or four sides. The monopole tower is a single tube tower, and it is also free-standing, but typically at a lower height than the self-support tower. The guyed tower is a straight rod supported by wires attached to the ground. The guyed tower needs to be inspected every 3 years, or so, the self-support tower needs to be inspected every 5 years, and the monopole tower needs to be inspected every 7 years. Again, the owners (real estate companies generally) of the cell site 10 have to be able to inspect these sites efficiently and effectively, especially given the tremendous number of sites—hundreds of thousands.

A typical cell site 10 can include the cell tower 12 and the associated cell site components 14 as described herein. The cell site 10 can also include the shelter or cabinet 52 and other physical structures—buildings, outside plant cabinets, etc. The cell site 10 can include aerial cabling, an access road 2600, trees, etc. The cell site operator is generally concerned about the integrity of all of the aspects of the cell site 10 including the cell tower 12 and the cell site components 14 as well as everything in the surrounding geography 2402. In general, the surrounding geography 2402 can be about an acre; although other sizes are also seen.

Conventionally, the cell site operator had inspections performed manually with on-site personnel, with a tower climb, and with visual inspection around the surrounding geography 2402. The on-site personnel can capture data and observations and then return to the office to compare and contrast with engineering records. That is, the on-site personnel capture data, it is then compared later with existing site plans, close-out audits, etc. This process is time-consuming and manual.

To address these concerns, the systems and methods propose a combination of the UAV 50 and 3D models of the cell site 10 and surrounding geography 2402 to quickly capture and compare data. This capture and compare can be done in one step on-site, using the UAV 50 and optionally the mobile device 100, quickly and accurately. First, an initial 3D model 2400 is developed. This can be part of a close-out audit or part of another inspection. The 3D model 2400 can be captured using the 3D modeling systems and methods described herein. This initial 3D model 2400 can be referred to as a known good situation. The data from the 3D model 2400 can be provided to the UAV 50 or the mobile device 100, and a subsequent inspection can use this initial 3D model 2400 to simultaneously capture current data and compare the current data with the known good situation. Any deviations are flagged. The deviations can be changes to the physical infrastructure, structural problems, ground disturbances, potential hazards, loss of gravel on the access road 2600 such as through wash out, etc.

Figure 43:
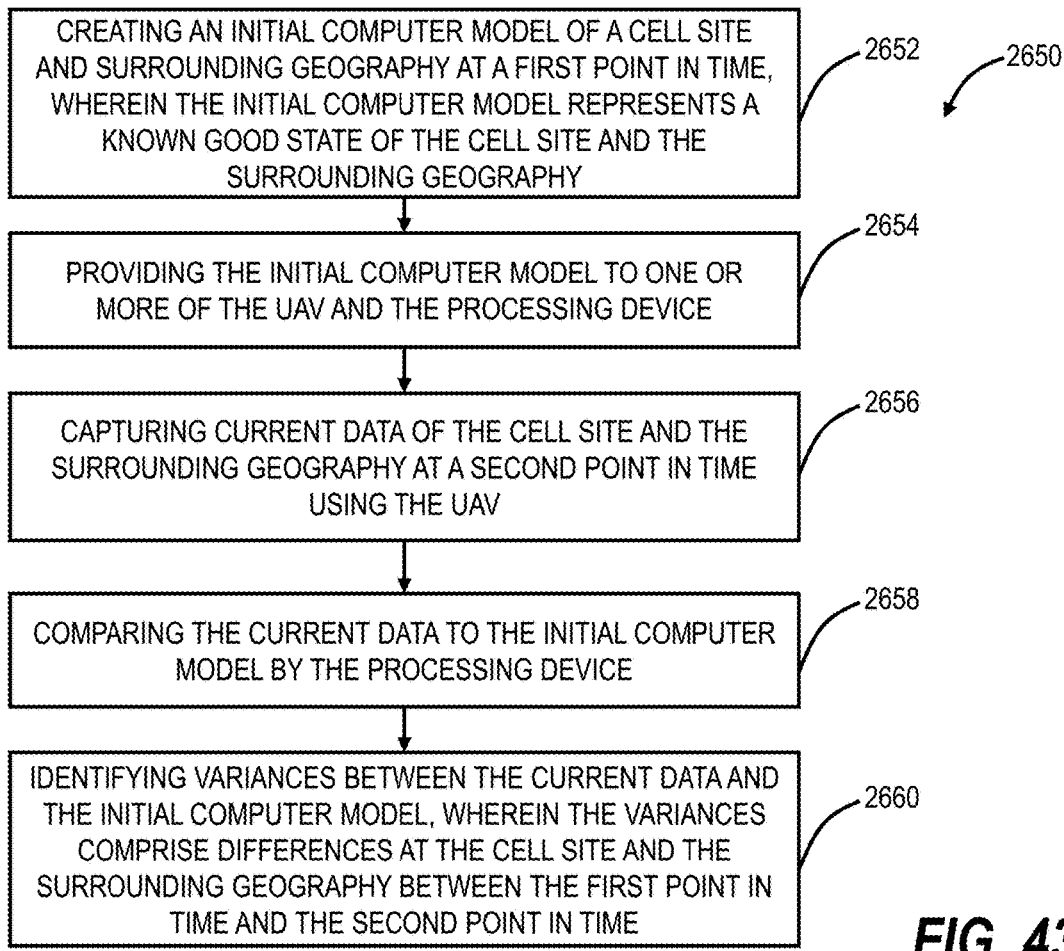
FIG. 43 is a flowchart of a method for cell site inspection by a cell site operator using the UAV.

FIG. 43 is a flowchart of a method 2650 for cell site inspection by a cell site operator using the UAV 50 and a processing device, such as the mobile device 100 or a processor associated with the UAV 50. The method 2650 includes creating an initial computer model of a cell site and surrounding geography at a first point in time, wherein the initial computer model represents a known good state of the cell site and the surrounding geography (step 2652); providing the initial computer model to one or more of the UAV and the processing device (step 2654); capturing current data of the cell site and the surrounding geography at a second point in time using the UAV (step 2656); comparing the current data to the initial computer model by the processing device (step 2658); and identifying variances between the current data and the initial computer model, wherein the variances comprise differences at the cell site and the surrounding geography between the first point in time and the second point in time (step 2660).

The method can further include specifically describing the variances based on comparing the current data and the initial computer model, wherein the variances comprise any of changes to a cell tower, changes to cell site components on the cell tower, ground hazards, state of an access road, and landscape changes in the surrounding geography. The initial computer model can be a 3D model describing a point cloud, and where the comparing comprises a comparison of the current data to the point cloud. The initial computer model can be determined as part of one of a close-out audit and a site inspection where it is determined the initial computer model represents the known good state. The UAV can be utilized to capture data from the initial computer model, and the UAV is utilized in the capturing the current data. A flight plan of the UAV around a cell tower can be based on a type of the cell tower including any of a self-support tower, a monopole tower, and a guyed tower. The initial computer model can be a 3D model viewed in a GUI, and wherein the method can further include creating a second 3D model based on the current data and utilizing the second 3D model if it is determined the cell site is in the known good state based on the current data.

§ 23.0 Virtual 360 View Systems and Methods

Figure 44:
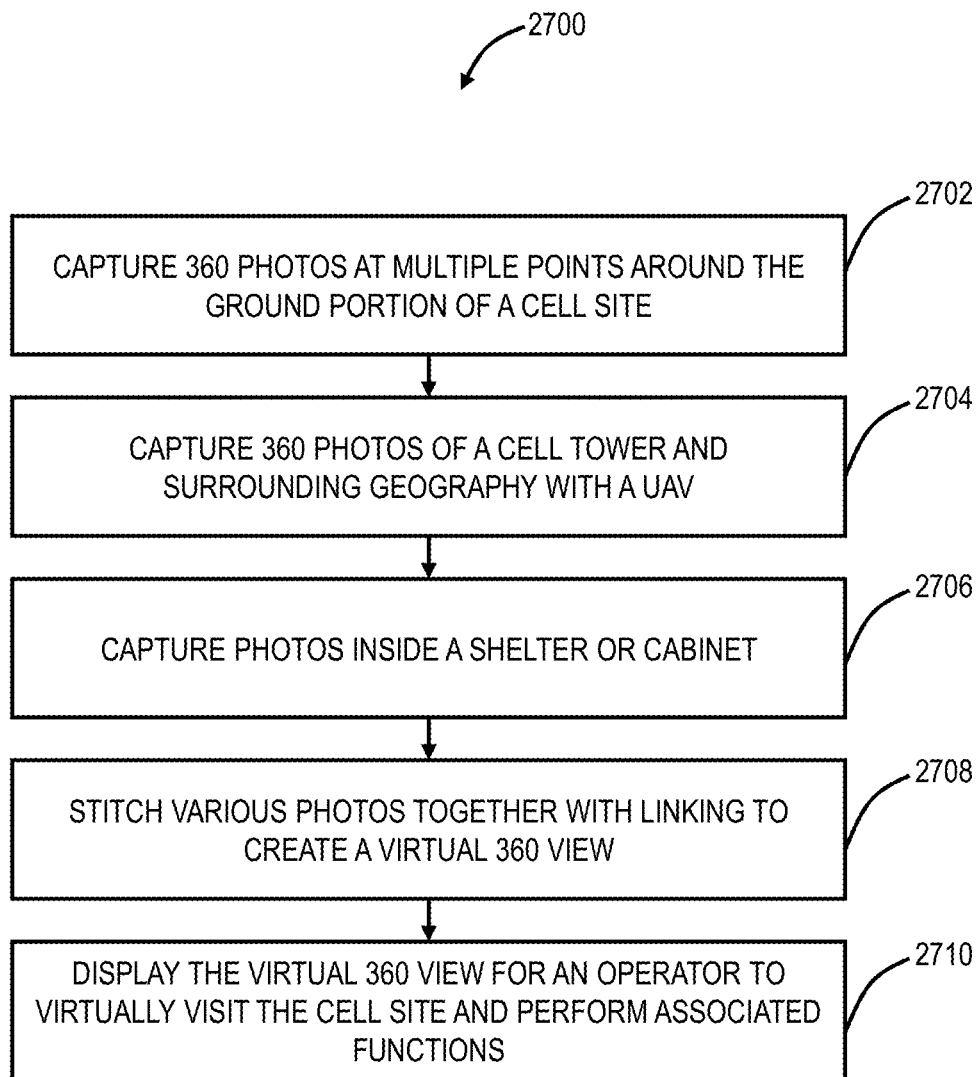
FIG. 44 is a flowchart of a virtual 360 view method 2700 for creating and using a virtual 360 environment.

FIG. 44 is a flowchart of a virtual 360 view method 2700 for creating and using a virtual 360 environment. The method 2700 is described referencing the cell site 10 and using the UAV 50; those skilled in the art will recognize that other types of telecommunication sites are also contemplated such as data centers, central offices, regenerator huts, etc. The objective of the method 2700 is to create the virtual 360 environment and an example virtual 360 environment is illustrated in FIGS. 45-54.

The method 2700 includes various data capture steps including capturing 360-degree photos at multiple points around the ground portion of the cell site 10 (step 2702), capturing 360-degree photos of the cell tower 12 and the surrounding geography 2402 with the UAV 50 (step 2704), and capturing photos inside the shelter or cabinet 52 (step 2706). Once all of the data is captured, the method 2700 includes stitching the various photos together with linking to create the virtual 360-degree view environment (step 2708). The virtual 360-degree view environment can be hosted on a server, in the cloud, etc. and accessible remotely such as via a URL or the like. The hosting device can enable display of the virtual 360-degree view environment for an operator to virtually visit the cell site 10 and perform associated functions (step 2710). For example, the operator can access the virtual 360-degree view environment via a tablet, computer, mobile device, etc. and perform a site survey, site audit, site inspection, etc. for various purposes such as maintenance, installation, upgrades, etc.

An important aspect of the method 2700 is proper data capture of the various photos. For step 2702, the photos are preferably captured with a 360-degree camera or the like.

The multiple points for the ground portion of the cell site 10 can include taking one or more photos at each corner of the cell site 10 to get all of the angles, e.g., at each point of a square or rectangle defining the surrounding geography 2402. Also, the multiple points can include photos at gates for a walking path, access road, etc. The multiple points can also include points around the cell tower 12 such as at the base of the cell tower, points between the cell tower 12 and the shelter or cabinet 52, points around the shelter or cabinet 52 including any ingress (doors) points. The photos can also include the ingress points into the shelter or cabinet 52 and then systematically working down the rows of equipment in the shelter or cabinet 52 (which is covered in step 2706).

For step 2704, the UAV 50 can employ the various techniques described herein. In particular, the UAV 50 is used to take photos at the top of the cell tower 12 including the surrounding geography 2402. Also, the UAV 50 is utilized to take detailed photos of the cell site components 14 on the cell tower 12, such as sector photos of the alpha, beta, and gamma sectors to show the front of the antennas and the direction each antenna is facing. Also, the UAV 50 or another device can take photos or video of the access road, of a tower climb (with the UAV 50 flying up the cell tower 12), at the top of the cell tower 12 including pointing down showing the entire cell site 10, etc. The photos for the sectors should capture all of the cell site equipment 14 including cabling, serial numbers, identifiers, etc.

For step 2706, the objective is to obtain photos inside the shelter or cabinet 52 to enable virtual movement through the interior and to identify (zoom) items of interest. The photos capture all model numbers, labels, cables, etc. The model numbers and/or labels can be used to create hotspots in the virtual 360-degree view environment where the operator can click for additional details such as close up views. The data capture should include photos with the equipment doors both open and closed to show equipment, status identifiers, cabling, etc. In the same manner, the data capture should include any power plant 53, AC panels, batteries, etc. both with doors open and closed to show various details therein (breakers, labels, model numbers, etc.). Also, the data capture within the shelter or cabinet 52 can include coax ports and ground bars (inside/outside/tower), the telco board and equipment, all technology equipment and model numbers; all rack-mounted equipment, all wall mounted equipment.

For ground-based photo or video capture, the method 2700 can use the multiple camera apparatus 2000 (or a variant thereof with a single camera such as a 360-degree camera). For example, the ground-based data capture can use a tripod or pole about 4-7' tall with a 360-degree camera attached thereto to replicate an eye-level view for an individual. A technician performing this data capture place the apparatus 2000 (or variant thereof) at all four corners of the cell site 10 to capture the photos while then placing and capturing in between the points to make sure every perspective and side of objects can be seen in a 360/VR environment of the virtual 360-degree view environment.

Also, items needing additional detail for telecommunication audits can be captured using a traditional camera and embedded into the 360/VR environment for viewing. For example, this can include detailed close-up photos of equipment, cabling, breakers, etc. The individual taking the photos places themselves in the environment where the camera cannot view them in that perspective.

For UAV-based data capture, the UAV 50 can include the 360-degree camera attached thereto or mounted. Importantly, the camera on the UAV 50 should be positioned so that the photos or video are free from the UAV, i.e., the camera's field of view should not include any portion of the UAV 50. The camera mount can attach below the UAV 50 making sure no landing gear or other parts of the UAV 50 are visible to the camera. The camera mounts can be attached to the landing gear or in place of or on the normal payload area best for the center of gravity. Using the UAV 50, data capture can be taken systematically around the cell tower 12 to create a 360 view on sides and above the cell tower 12.

For step 2708, the 360-degree camera takes several photos of the surrounding environment. The photos need to be combined into one panoramic like photo by stitching the individual photos together. This can be performed at the job site to stitch the photos together to make it ready for the VR environment. Also, the various techniques described herein are also contemplated for virtual views.

Once the virtual 360-degree view environment is created, it is hosted online for access by operators, installers, engineers, etc. The virtual 360-degree view environment can be accessed securely such as over HTTPS, over a Virtual Private Network (VPN), etc. The objective of the virtual 360-degree view environment is to provide navigation in a manner similar to as if the viewer was physically located at the cell site 10. In this manner, the display or GUI of the virtual 360-degree view environment supports navigation (e.g., via a mouse, scroll bar, touch screen, etc.) to allow the viewer to move about the cell site 10 and inspect/zoom in on various objects of interest.

Figure 45:
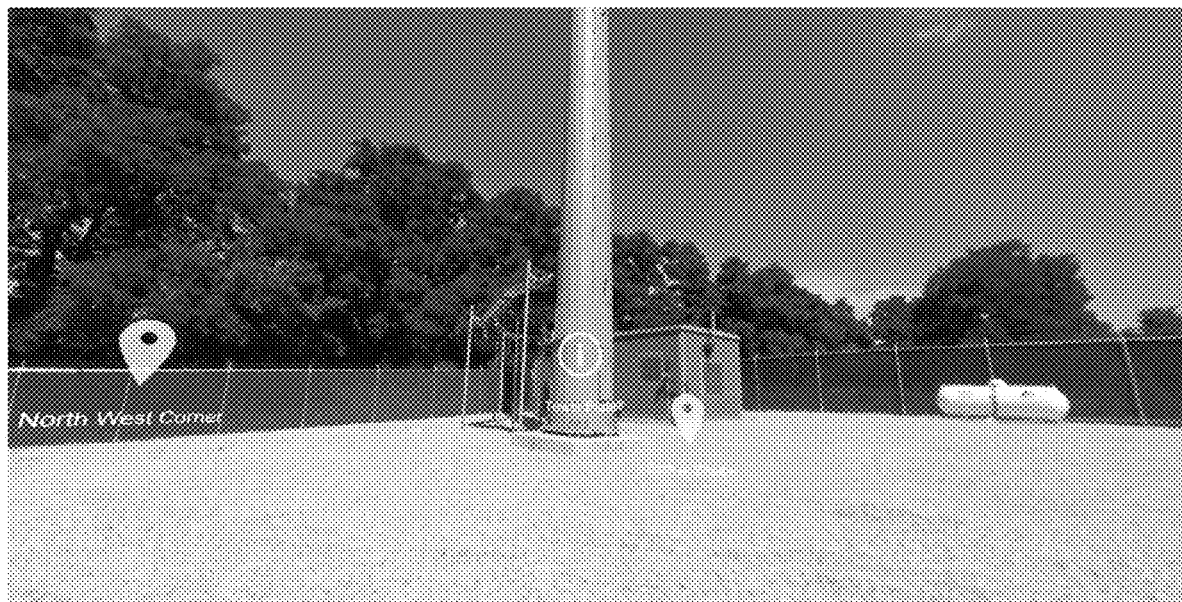
FIGS. 45-56 are screenshots from an example implementation of the virtual 360-degree view environment from FIG. 44.

FIGS. 45-56 illustrate screen shots from an example implementation of the virtual 360-degree view environment. FIG. 45 is a view entering the cell site 10 facing the cell tower 12 and the shelter or cabinet 52. Note, this is a 360-view, and the viewer can zoom, pan, scroll, etc. as if they were at the cell site 10 walking and/or moving their head/eyes. The display can include location items which denote a possible area the viewer can move to, such as the northwest corner or the back of shelter in FIG. 45. Further, the display can include information icons such as tower plate which denotes the possibility of zooming in to see additional detail.

Figure 46:
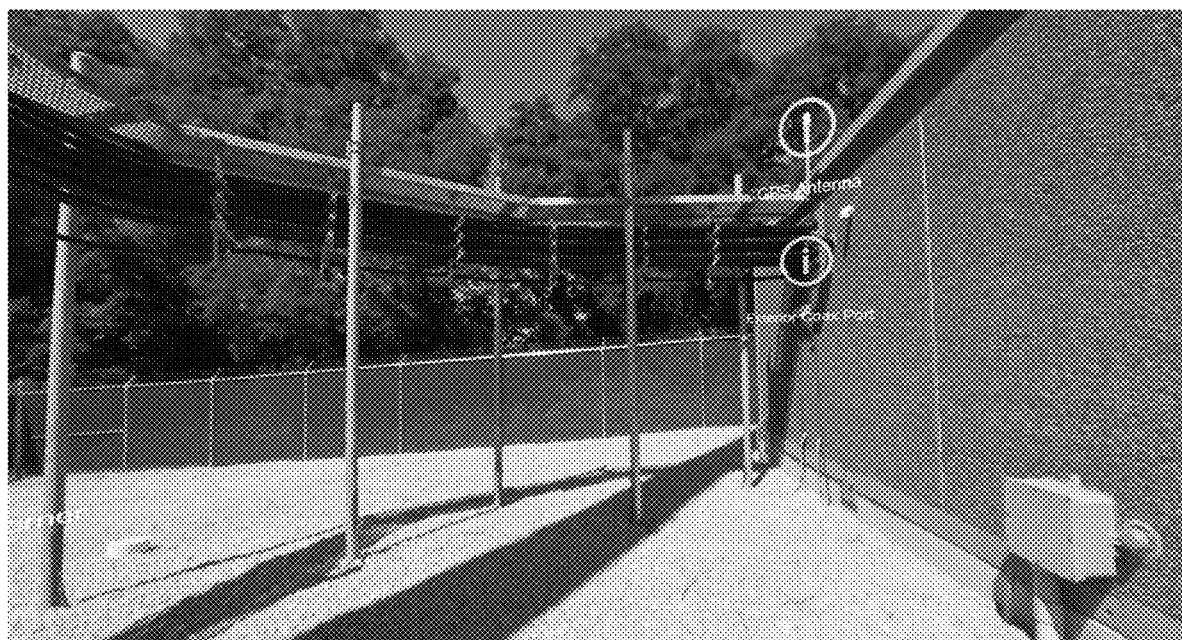
Figure 47:
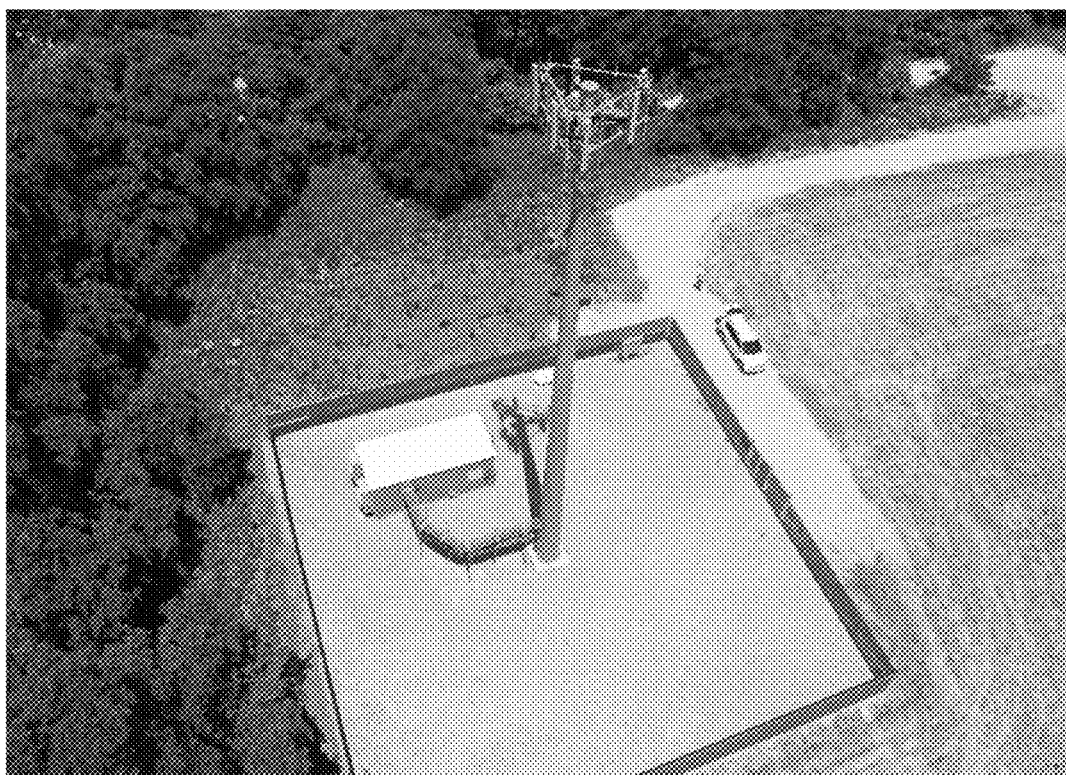
Figure 48:
Figure 49:
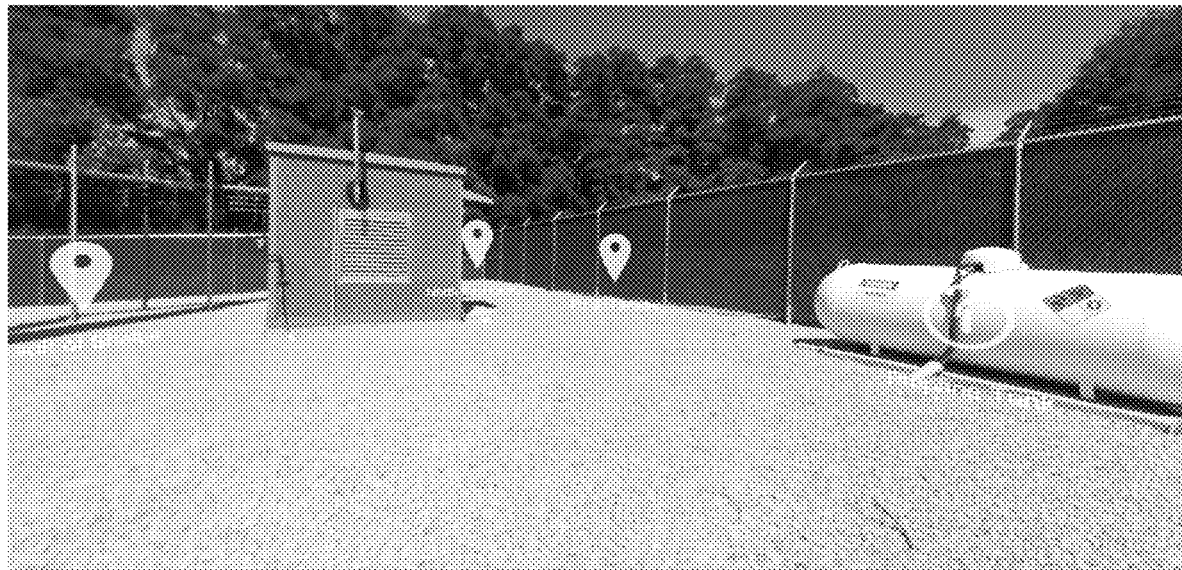
Figure 50A:
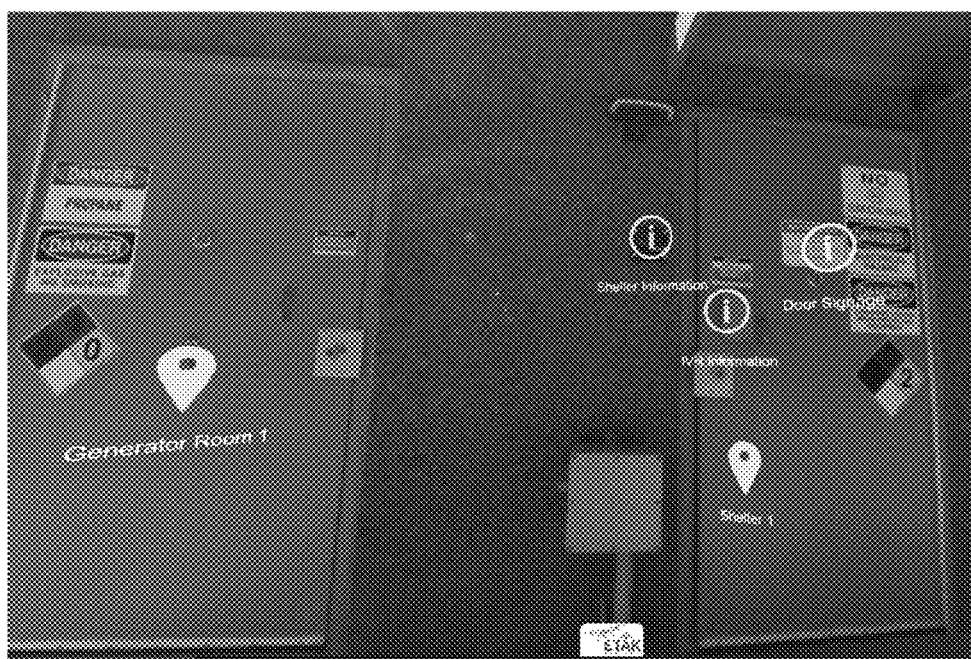

In FIG. 46, the viewer has moved to the back of the shelter, and there are now information icons for the GPS antenna and the exterior coax port. In FIG. 47, the viewer navigates to the top of the cell tower 12 showing a view of the entire cell site 10. In FIG. 48, the viewer zooms in, such as via an information icon, to get a closer view of one sector. In FIG. 49, the viewer navigates to the side of the shelter or cabinet 52, and there is an information icon for the propane tank. In FIG. 50A, the viewer navigates to the front of the shelter or cabinet 52 showing doors to the generator room and to the shelter itself along with various information icons to display details on the door.

Figure 50B:
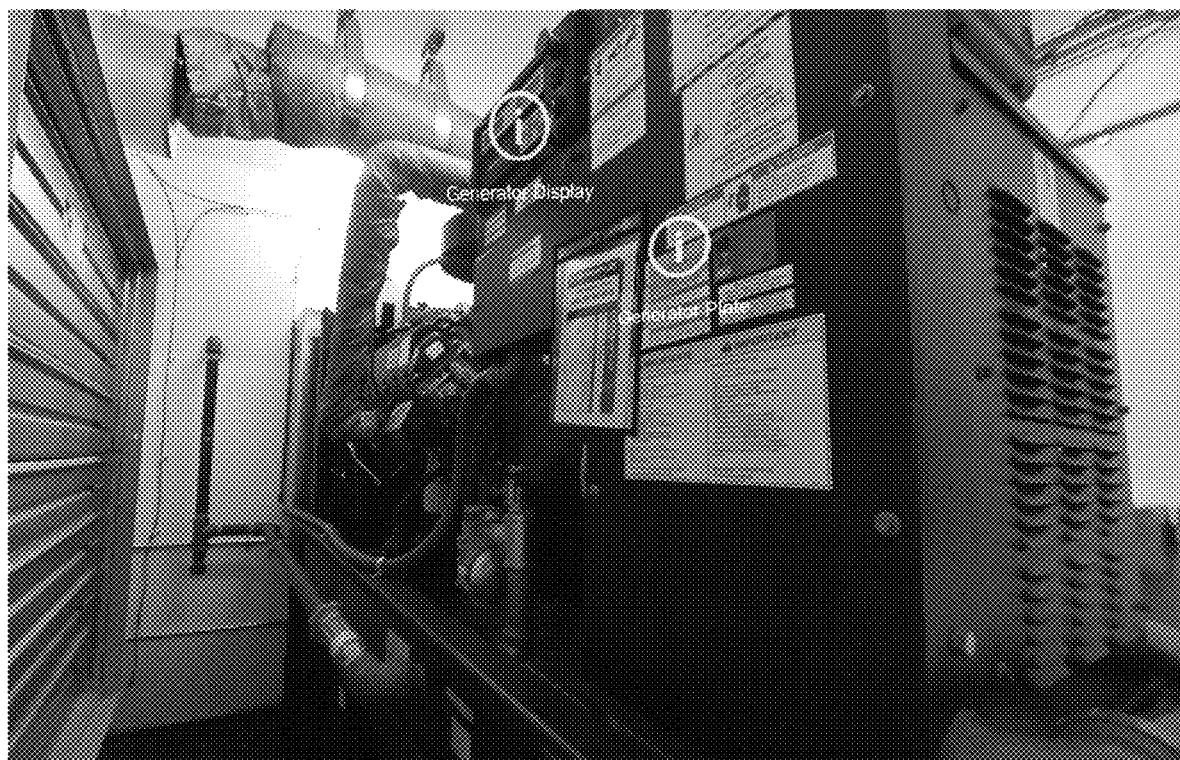
Figure 51:
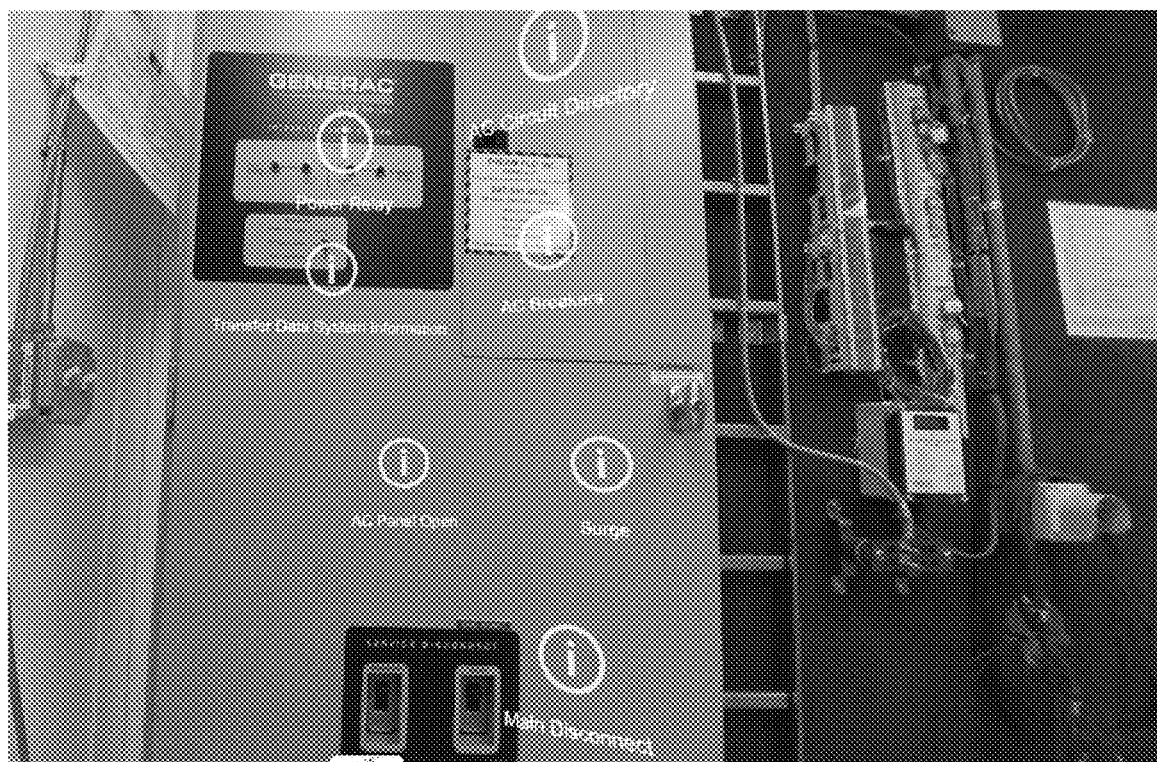
Figure 52:
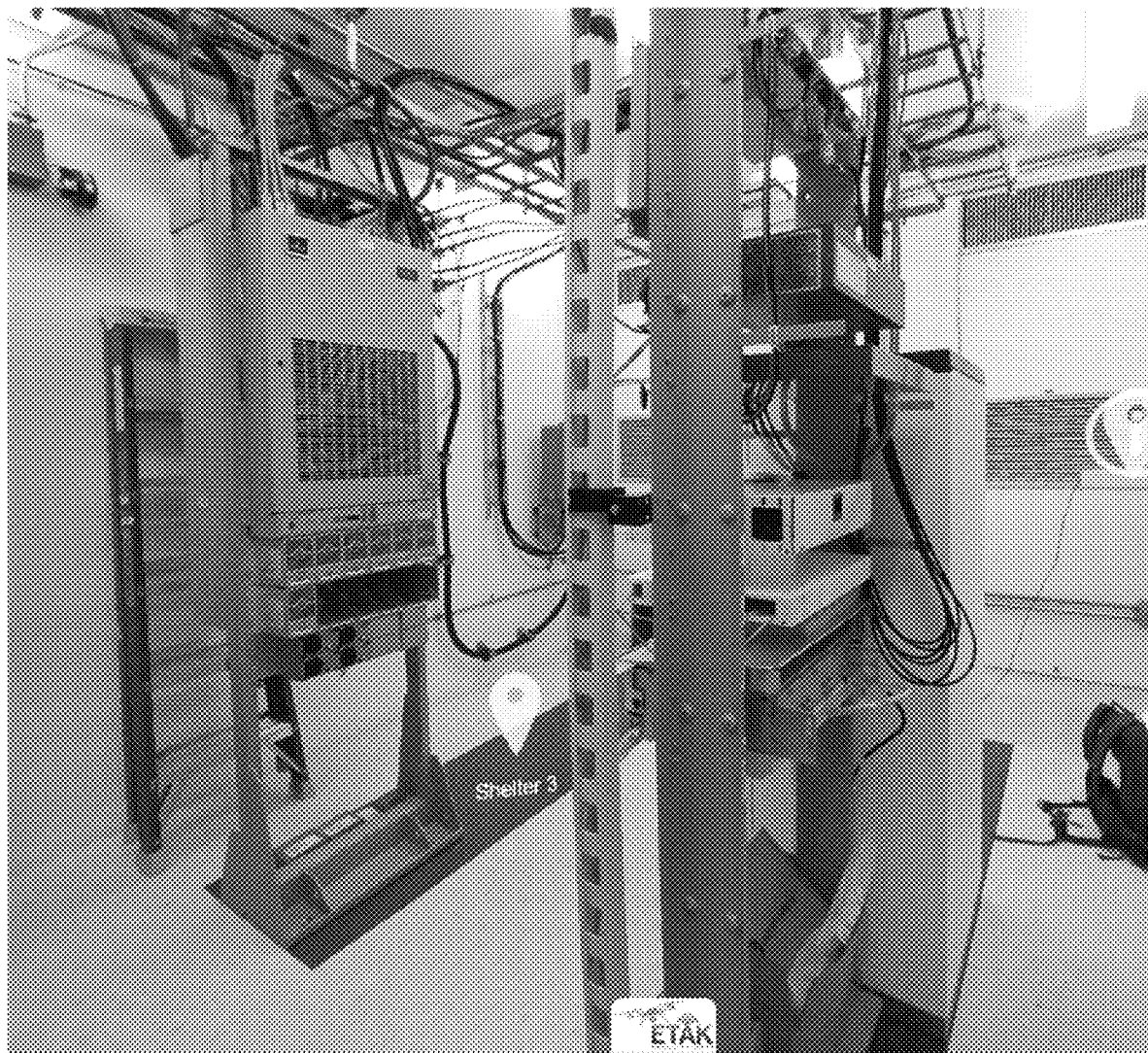
Figure 53:
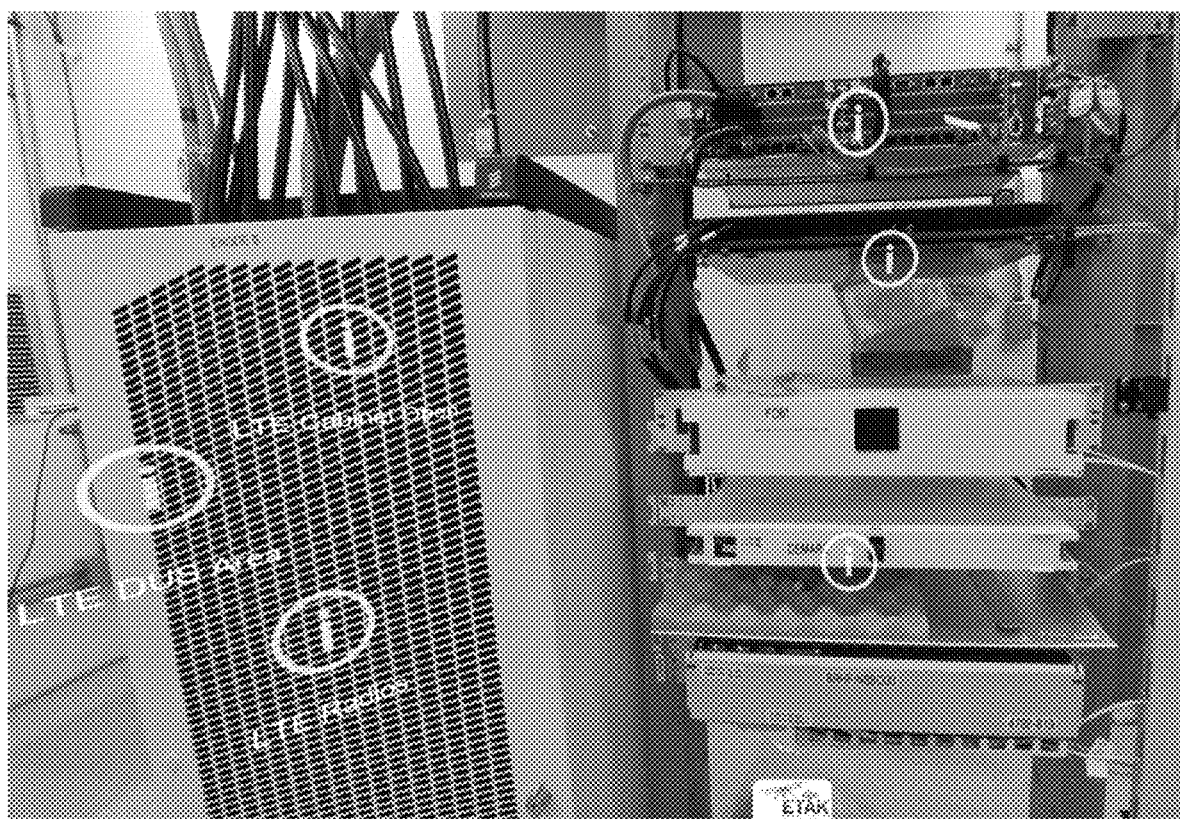
Figure 54:
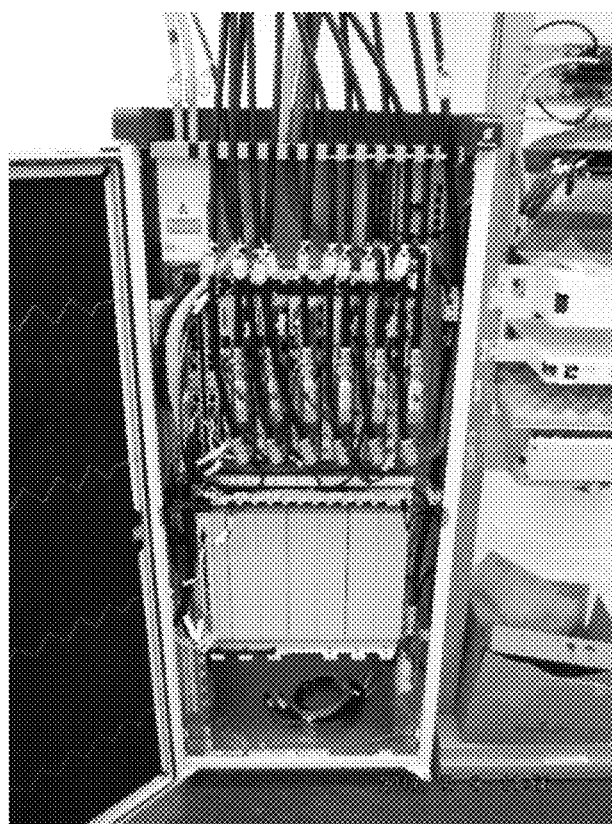

In FIG. 50B, the viewer navigates into the generator room, and this view shows information icons for the generator. In FIG. 51, the viewer navigates into the shelter or cabinet 52 and views the wall showing the power panel with associated information icons. In FIG. 52, the viewer looks around the interior of the shelter or cabinet 52 showing racks of equipment. In FIG. 53, the viewer looks at a rack with the equipment door closed, and this view shows various information icons. Finally, in FIG. 54, the viewer virtually opens the door for LTE equipment.

Figure 55:
Figure 56:

FIGS. 55 and 56 illustrate the ability to "pop-up" or call an additional photo within the environment by clicking the information icons. Note, the viewer can also zoom within the environment and on the popped out photos.

§ 24.0 Modified Virtual 360 View Systems and Methods

Figure 57:
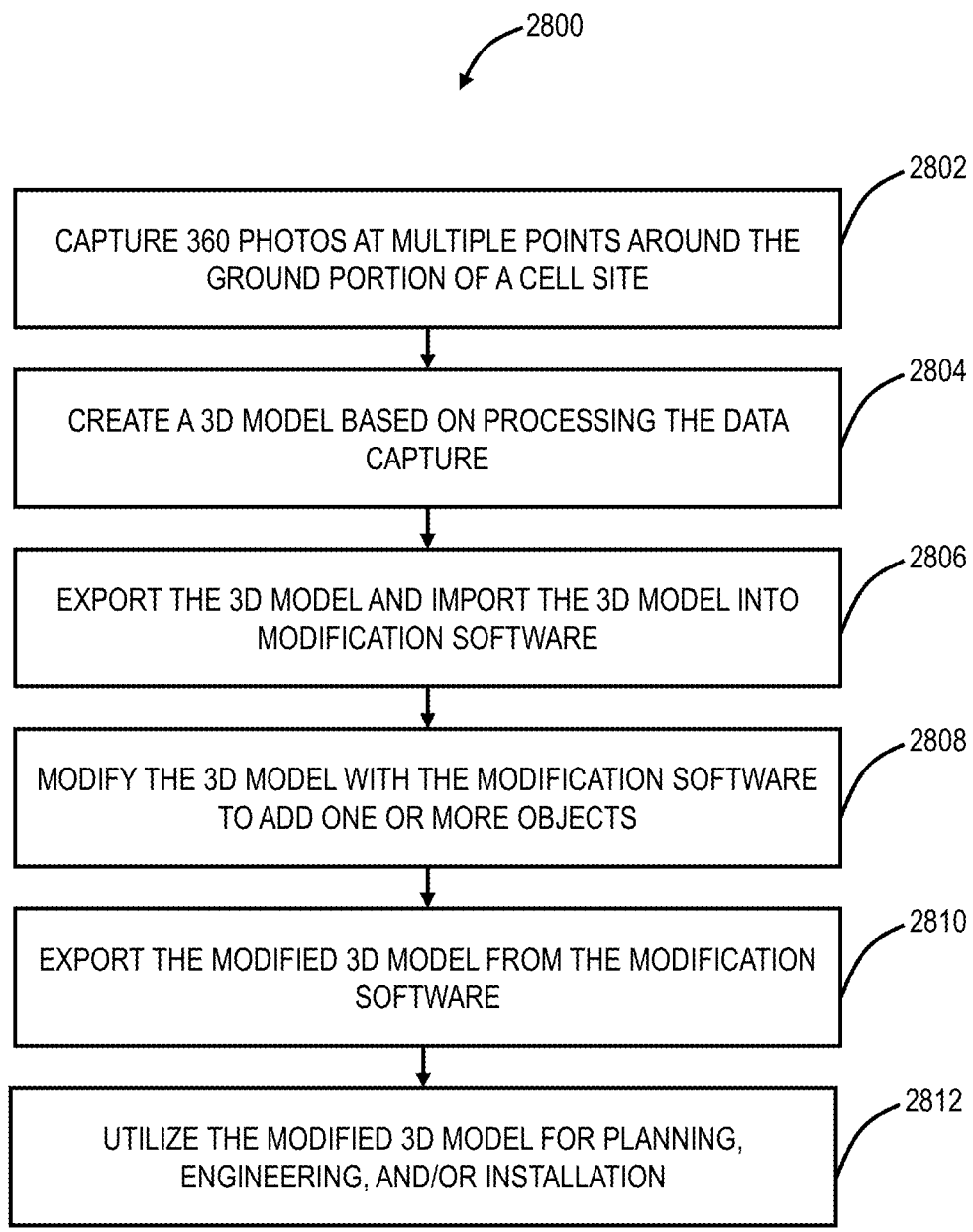
FIG. 57 is a flowchart of a virtual 360 view method for creating, modifying, and using a virtual 360 environment.

FIG. 57 is a flowchart of a virtual 360 view method 2800 for creating, modifying, and using a virtual 360 environment. The method 2800 includes performing data capture of the telecommunications site (step 2802). The data capture can utilize the various techniques described herein. Of note, the data capture in the method 2800 can be performed prior to construction of the cell site 10, for planning, engineering, compliance, and installation. The entire construction area can be captured in a quick flight with the UAV 50. For example, the photos of the cell site 10 or recommended construction zone can be captured with the UAV 50, in a manner that the environment can be reconstructed virtually into a point cloud model using photogrammetry software.

Once the data capture is obtained, a 3D model is created based on processing the data capture (step 2804). The 3D model can be created based on the various techniques described herein. Again, the cell site 10 here does not necessarily have the cell tower 12 and/or various cell site components 14, etc. The objective of the method 2800 is to create the 3D model where 3D replications of future installed equipment can be placed and examined.

Once created from the data capture, the 3D model is exported and imported into modification software (step 2806). For example, the 3D model can be exported using a file type/extension such as .obj with texture files. The file and its textures are imported into a 3D design software where 3D modifications can be performed to the imported 3D model of already preexisting objects scanned and where new 3D objects can be created from scratch using inputted dimensions or the like. The modification software can be used to modify the 3D model to add one or more objects (step 2808).

Specifically, the one or more objects can include the cell tower 12, the cell site components 14, the shelter or cabinet 52, or the like. That is, from the customer's specifications or construction drawings, equipment is added using their dimensions using the software. This can also be performed using a GUI and drag/drop operations. The modification software can add/combine the newly created 3D objects to the cell site or construction zone model at the correct distances from objects (georeferenced location) as illustrated in the construction drawings or client details.

The model is then exported as a new 3D model file where it can be viewed by the customer in various 3D model software or web-based viewing packages where the additions can be viewed from any perspective they choose (step 2810).

The modified 3D model can be utilized for planning, engineering, and/or installation (step 2812). The 3D model in its future replicated form can then be shared easily among contractors, engineers, and city officials to exam the future installation in a 3D virtual environment where each can easily manipulate the environment to express their needs and come to a unified plan. This process will allow construction companies, engineers, and local official to see a scaled size rendering of the plans (i.e., CDs—Constructions Drawings).

Figure 58:
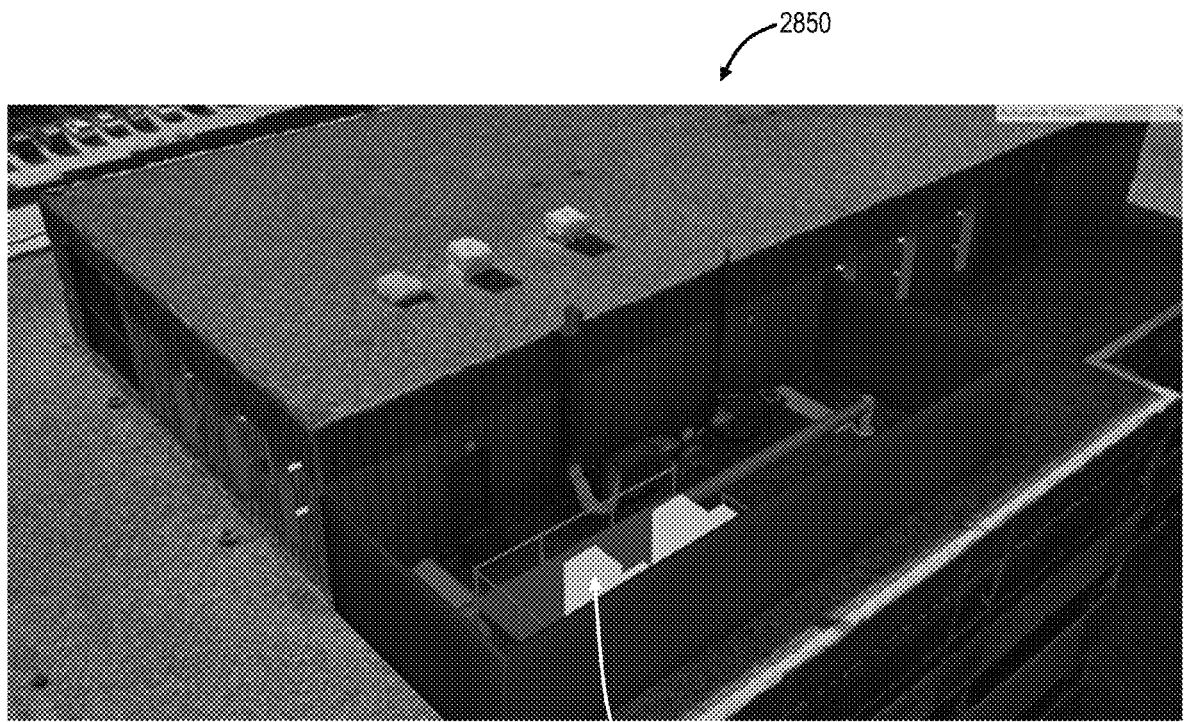
FIGS. 58 and 59 are screenshots of a 3D model of a telecommunications site of a building roof with antenna equipment added in the modified 3D model.
Figure 59:
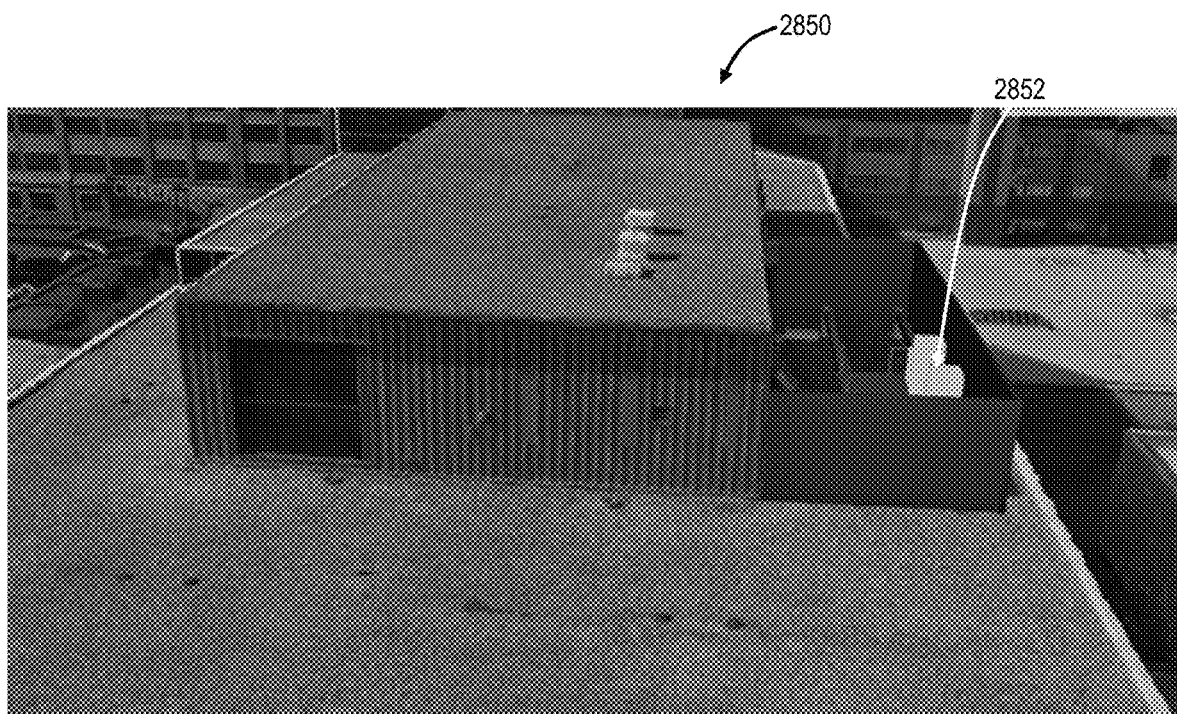

FIGS. 58-59 are screenshots of a 3D model of a telecommunications site 2850 of a building roof with antenna equipment 2852 added in the modified 3D model. Here, the antenna equipment 2852 is shown with a fence on top of the building roof, showing the proposed construction is obscured. This can be used to show the building owner the actual look of the proposed construction in the modified 3D model as well as other stakeholders to assist in planning (approvals, etc.) as well as to assist engineers in engineering and installation.

§ 25.0 Augmented Reality

The augmented reality systems and methods allow a user to experience 3D digital objects through a digital camera such as on a mobile device, tablet, laptop, etc. The 3D digital objects can be created via photogrammetry or created as a 3D model. The user can project the 3D digital objects onto in a virtual environment including real-time in a view on a phone, tablet, etc. as well as in existing virtual environments.

For example, the augmented reality systems and methods can be used in a battery and/or power plant 53 installations such as in a cabinet or shelter 52. The augmented reality systems and methods can assist engineers, planners, installers, operators, etc. to visualize new equipment on site, to determine where installation should occur, to determine cable lengths, to perform engineering, to show the operators options, etc. The augmented reality systems and methods can include visualizing rack placements in shelters or head-end space for small cell applications with and without equipment already in the racks. The augmented reality systems and methods can be used to visualize outdoor small cell equipment, such as small cells 90, cabinets, cages, poles, node placements, etc.

The augmented reality systems and methods can further be used for visual shelter and cell tower placements at new locations. Further, the augmented reality systems and methods can visualize antenna placements on towers, walls, ceiling tiles, building, and other structures. Advantageously, the augmented reality systems and methods can be used to show stakeholders (cell site operators, wireless service providers, building owners, the general public, etc.) the view prior to construction. Since the view is easily manipulable, the stakeholders can use the augmented reality systems and methods to agree on project scope in advance, with very little cost for changes as there are all performed in the virtual environment. This can lead to easier project approval and general satisfaction amongst the stakeholders.

Figure 60:
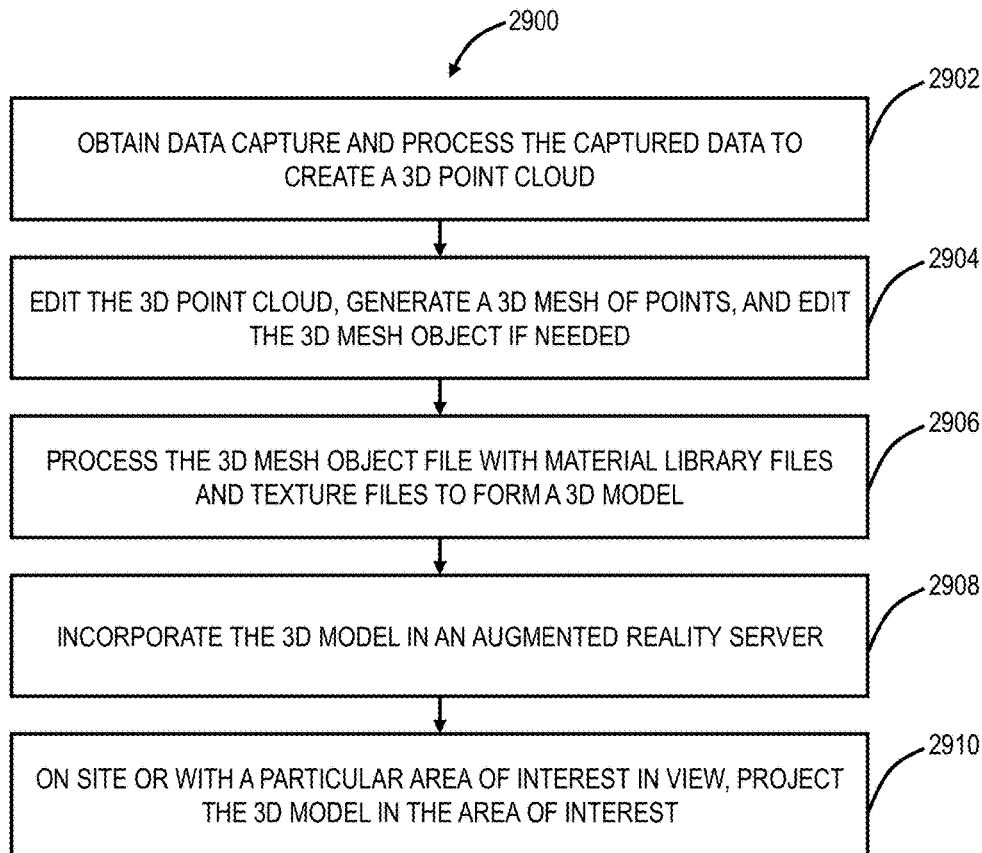
FIG. 60 is a flowchart of a scanning method for incorporating an object in a virtual view.

FIG. 60 is a flowchart of a scanning method 2900 for incorporating an object in a virtual view. The method 2900 enables the creation of a 3D model of a virtual object which can then be placed in a virtual environment for augmented reality. As mentioned above, example use cases for the virtual object can include a cell tower, a shelter, cell site components on the cell tower, power equipment, batteries, or virtually any component that is added to the cell site 10.

The method 2900 includes obtaining data capture and processing the captured data to create a 3D point cloud (step 2902). As described herein, the data capture can use various different techniques including the UAV 50 and the associated aspects. The captured data can include photos and/or digital video, with associated geographic information.

The method 2900 can include editing the 3D point cloud, generating a 3D mesh of point, and editing the 3D mesh object if needed (step 2904). The editing can be performed to adjust the capture data. Once the 3D mesh object is finalized, the method 2900 can include processing the 3D mesh object file (.obj) with material library files (.mtl) and texture files to form a 3D model (step 2906). Steps 2902-2904 include the data capture and data processing to form the 3D model of the virtual object. The virtual object can be defined by the .obj file, mtl file, and texture file together, such as in a folder or .zip file.

Next, the 3D model is incorporated in an augmented reality server (step 2908). Here, the 3D model can be uploaded to the cloud for later retrieval and use. Once on site or at a computer with a particular area of interest in view, the method 2900 can include projecting the 3D model of the virtual object in the area of interest (step 2910). In an embodiment, the mobile device 100 can include an augmented reality app which can be activated and use the camera. The augmented reality app can obtain a virtual object from the cloud and project it to scale in the camera's field of view. In another embodiment, the virtual object can be added to a virtual environment on a computer, etc. including one viewed via a Web browser. Various other approaches are contemplated. This enables planners, installers, engineers, operators, etc. the ability to accurately visualize the virtual object in place before it is installed.

Figure 61:
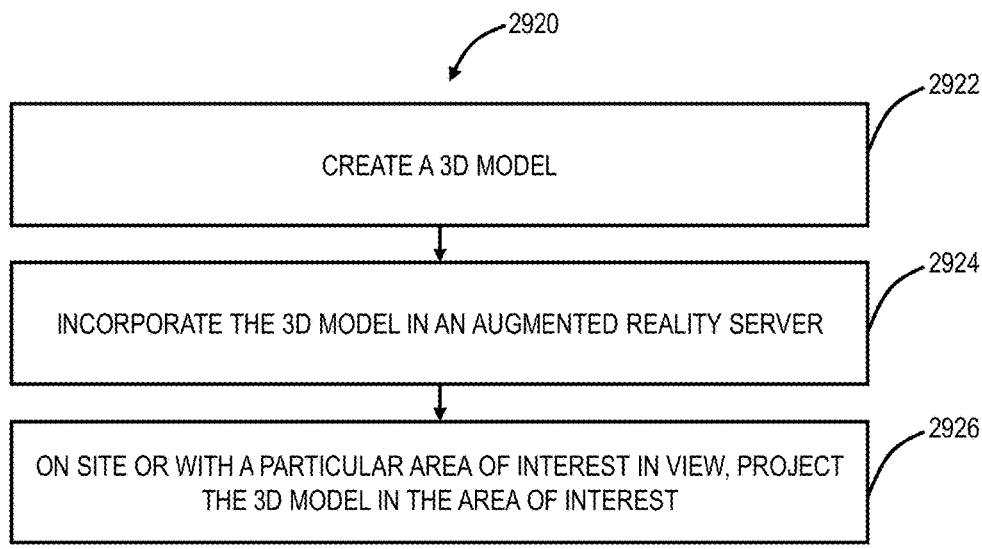
FIG. 61 is a flowchart of a model creation method for incorporating a virtually created object in a virtual view.

FIG. 61 is a flowchart of a model creation method 2920 for incorporating a virtually created object in a virtual view. The model creation method 2920 is similar to the method 2900 except it involves creating the virtual object without data capture. Here, a user can create 3D models using 3D Computer Aided Design (CAD) software or the like. The user is able to either create a new prototype model based on need, or to review spec drawings of an existing object and create a 3D model based thereon. This will be able to provide the user a model, if it is not available to scan. For example, this may be the case in a new cell tower 12, etc.

The method 2920 includes creating a 3D model (step 2922). Again, this can be using 3D CAD software, etc. The 3D model is saved as a .obj file or other 3D model file type. The .obj file can be included with the .mtl file and texture file as above in the method 2900 and stored in the cloud. The method 2902 includes incorporating the 3D model in the augmented reality server (step 2924) and on sire or with the particular are of interest in view, projecting the 3D model in the area of interest (step 2926).

§ 25.1 Augmented Reality with Equipment Add-in

The 3D model can include insertion of 3D models of currently non-existing equipment including, without limitation, radios, power plants, batteries, Over Voltage Protection (OVP) equipment, 5G telecom equipment, antennas, Tower Mounted Antennas (TMAs), Remote Radio Head (RRH) equipment, and the like. The 3D model can include detailed specifications of the added-in equipment such as dimensions, wattage, voltage, current, decibels, etc. These detailed specifications can be brought up such as through a click or touch in the 360-degree view in the 3D model. Advantageously, this can help engineers and planners with planning for future equipment, upgrades, etc.

§ 25.2 Augmented Reality with Auto Detect Features

In an embodiment, the 3D model/360 degree view can auto detect (as well as manual input) site equipment specifications (e.g., routers, switches, radios, cabinets, power plants, etc.) to determine, without limitation, power consumption, wattages of equipment, heating and air conditioning load, voltage, amperage, battery load, etc. The site equipment specifications can be obtained in a database and the equipment can be detected by analyzing the 3D model/360 degree view to match the equipment, to detect serial numbers, etc.

This enables engineers and planners to virtually add equipment and to determine if additional resources are needed (e.g., rectifier add, air conditioning, grounding, HVAC change, powerplant change (e.g., add −48V breakers, add more converters, etc.).

In addition to auto-detect of the site equipment specifications, the system implementing the 3D model/360 degree view can determine costs, pricing, and provide a Bill of Materials (BOM) for equipment installations at the cell sites 10. The virtually installed equipment can be used to automatically generate the BOM (e.g., how many bolts, cabling, lengths of cables/coaxial cables/conduit/etc., mounting hardware kits, labor costs/times, etc. Also, the system can recommend or provide labor quotes, etc. The system can provide valuable insight and engineering time reduction.

The system can include a configuration of the cell site 10, cell tower 12, cell site components 14, etc. (antennas, radios, lines, jumpers, connectors, batteries, power plant, technologies, etc.). This configuration can be used when generating the BOM.

§ 26.0 Satellite Data Capture

Figure 62:
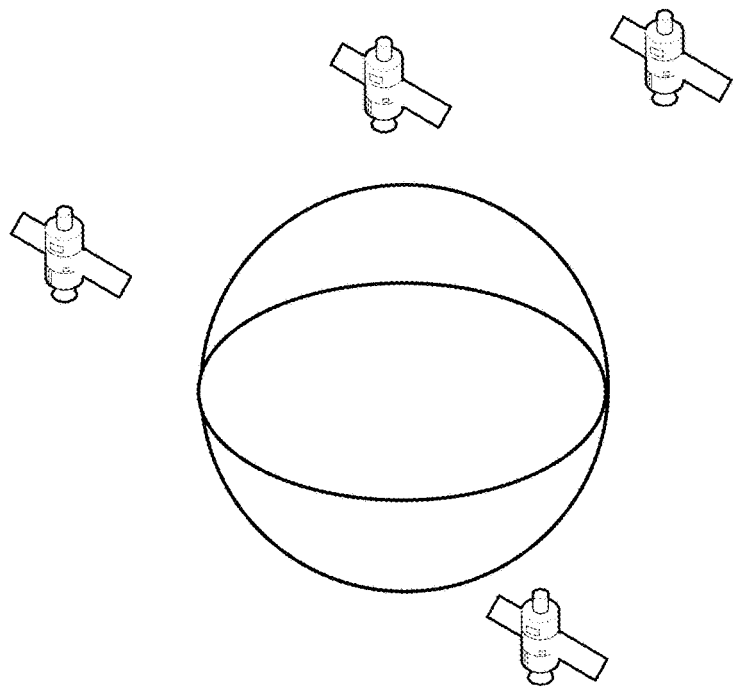
FIG. 62 is a diagram of various satellites in orbit around the Earth for use in data collection for the 3D model.
Figure 63:
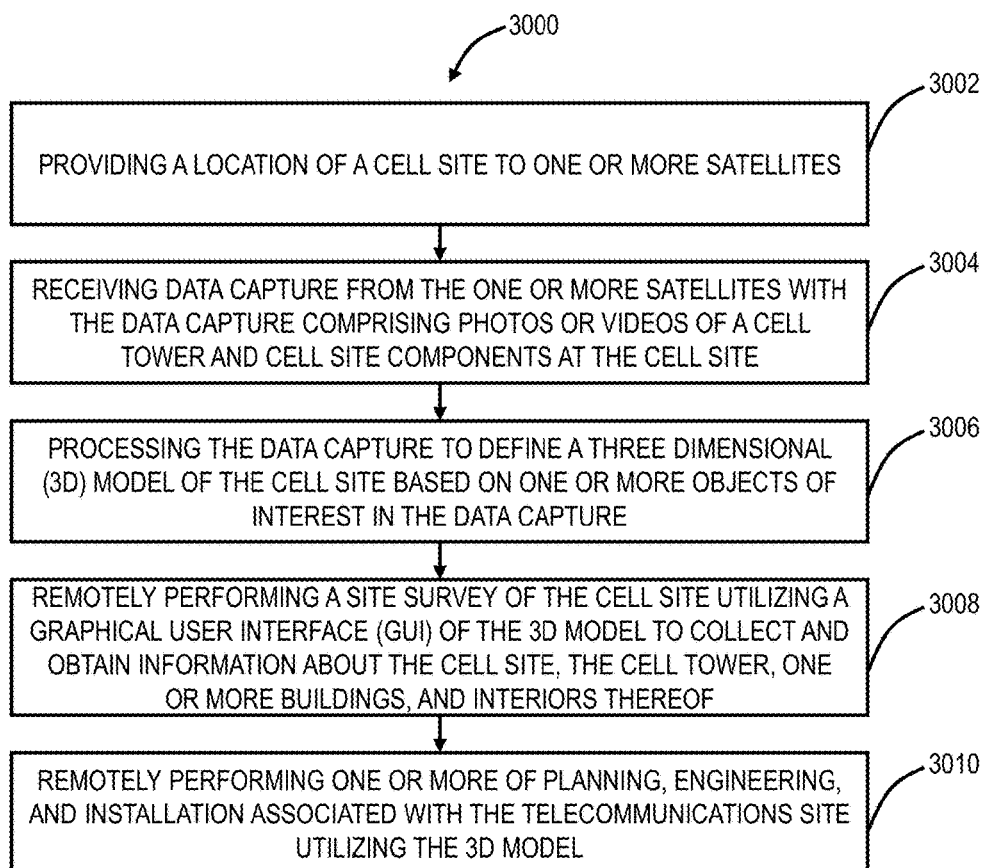
FIG. 63 is a flowchart of a 3D modeling method for capturing data at the cell site, the cell tower, etc. using one or more satellites.

FIG. 62 is a diagram of various satellites in orbit around the Earth for use in data collection for the 3D model. FIG. 63 is a flowchart of a 3D modeling method 3000 for capturing data at the cell site, the cell tower, etc. using one or more satellites. Various descriptions are presented herein for the 3D model creation and use. For the 3D model creation, the various approaches include a data capture step which is performed generally using the UAV 50, ground cameras, etc. In addition to these so-called terrestrial data capture techniques, the systems and methods can also utilize satellite data capture—either by itself or in combination with the various techniques described herein. For example, in an embodiment, the satellite data capture can be used for exterior 3D models of the cell site 10 whereas local data capture can be used for interiors of the shelter or cabinet 52 equipment.

Advantageously, the satellite data capture can provide highly detailed photographs and removes the requirement for site visits which is key given the number of cell sites. The 3D model can be used for various functions related to planning, engineering, installation, and the like. In FIG. 62, there are various providers who have various satellites (e.g., constellations of satellites) which provide coverage of the U.S. for taking high-resolution photos. For example, the providers can have multiple satellites in low-Earth orbit, each having a different angle, orientation, etc. to obtain data capture. For satellite data capture, the satellite provider is given a location of the cell site 10 (e.g., GPS coordinates) and the satellite provider programs the various satellites to obtain various pictures to cover the cell site 10, the cell tower 12, and the cell site components 14. For example, use of different satellites in the constellation provides the same functionality of the UAV 50 orbiting the cell tower 12. That is, each satellite has a different orbit and can capture a different view of the cell site 10. i.e., a different side of the cell tower 12.

One advantage of the satellite data capture is the time savings and labor savings. Again, as described herein, there are hundreds of thousands of cell sites 10 in the U.S. Obtaining the data capture for the cell site 10 from a satellite provider significantly improves the speed and cost of the data capture. Further, the process of capturing data can be done in batches such that each pass of a satellite (a pass being a trajectory over the U.S.) can capture multiple cell sites 10 along the way that are in its trajectory. This approach can reduce the time and cost of the satellite usage.

In FIG. 63, the method 3000 includes providing a location of a cell site to one or more satellites (step 3002); receiving data capture from the one or more satellites with the data capture comprising photos or videos of a cell tower and cell site components at the cell site (step 3004); and processing the data capture to define a three dimensional (3D) model of the cell site based on one or more objects of interest in the data capture (step 3006). The method 3000 can further include remotely performing a site survey of the cell site utilizing a Graphical User Interface (GUI) of the 3D model to collect and obtain information about the cell site, the cell tower, one or more buildings, and interiors thereof (step 3008).

The site survey can include a determination of a down tilt angle of one or more antennas of the cell site components based on measuring three points comprising two defined by each antenna and one by an associated support bar using the 3D model, plumb of the cell tower and/or the one or more antennas, azimuth of the one or more antennas using a location in the 3D model, dimensions of the cell site components, equipment type and serial number of the cell site components, connections between the cell site components, a status of a lightning rod and warning light on the cell tower, and Global Positioning Satellite (GPS) coordinates. The remotely performing the site survey can include determining equipment location on the cell tower; measuring distances between the equipment and within the equipment to determine actual spatial location; and determining connectivity between the equipment based on associated cabling.

The one or more satellites can include a plurality of satellites each with a different angle or orientation for the associated photos or videos. The processing can include stitching the associated photos or videos together to create a 3D point cloud for the 3D model. The method 3000 can further include remotely performing one or more of planning, engineering, and installation associated with the telecommunications site utilizing the 3D model (step 3010).

§ 27.0 Telescoping Apparatus for Data Capture

Figure 64:
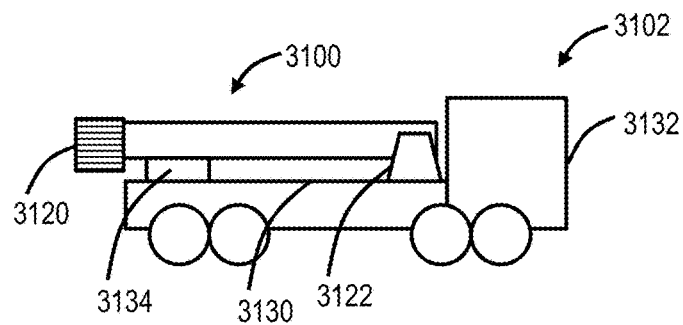
FIG. 64 is a perspective diagram of a mobile unit with a telescoping apparatus for data capture in a transport position.
Figure 65:
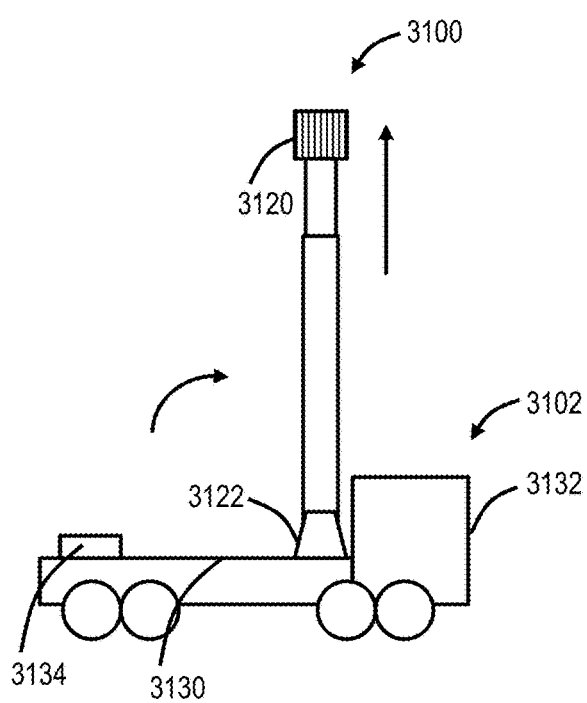
FIG. 65 is a perspective diagram of the mobile unit with the telescoping apparatus in the process of raising in an operating position.
Figure 66:
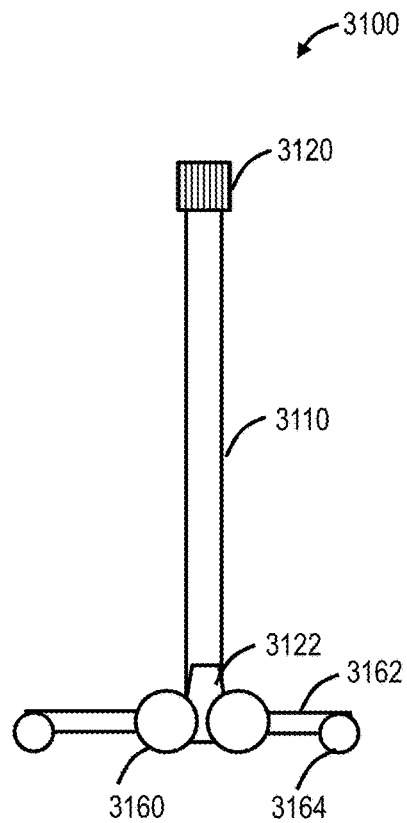
FIG. 66 is a perspective diagram of the telescoping apparatus in a mobile configuration to maneuver at the cell site.
Figure 67:
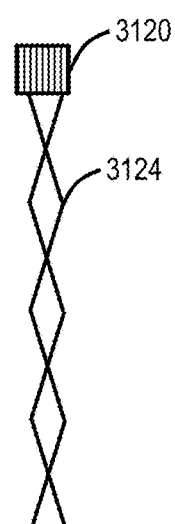
FIG. 67 is a perspective diagram of the telescoping apparatus with a scissor lift mechanism.

FIG. 64 is a perspective diagram of a mobile unit 3102 with a telescoping apparatus 3100 for data capture in a transport position. FIG. 65 is a perspective diagram of the mobile unit 3102 with the telescoping apparatus 3100 in the process of raising in an operating position. FIG. 66 is a perspective diagram of the telescoping apparatus 3100 in a mobile configuration to maneuver at the cell site 10. FIG. 67 is a perspective diagram of the telescoping apparatus 3100 with a scissor lift mechanism.

The telescoping apparatus 3100 includes a telescoping pole 3110 and a camera 3120 at an end of the telescoping pole 3110. The telescoping pole 3110 can extend a couple hundred feet to support heights up to the top of the cell tower 12. For example, about 80% of cell sites 10 are monopoles and about 85% of these are 150' or less. Thus, the telescoping pole 3110 can be about 150' or less and support the vast majority of cell sites 10.

The telescoping pole 3110 is extended by an extension mechanism 3122 which can include any mechanical technique to raise/lower the telescoping pole 3110, such as a motor, a hydraulic motor, an electric motor, a gas powered motor, various gears, etc. Also, the telescoping pole 3110 can be a scissors lift 3124.

The mobile unit 3102 is illustrated with the telescoping apparatus 3100 integrated on a bed 3130 of a truck or the like. The truck can be a flatbed, semi-trailer, or full trailer. The mobile unit 3102 includes a cab 3132 for a driver and an engine or the like. The bed 3130 is attached or connected to the cab 3132. In the transport position, the telescoping platform 3100 can be tens of feet, capable of being transported on roads and highways and can be supported by a support 3134 located on the bed 3130. The telescoping pole 3110 can be locked to the support 3134 in the transport position.

The telescoping pole 3110 includes N sections each of M feet, thereby supporting heights of N×M. In an embodiment, each section is 20' and there are ten sections for 200' height. Other embodiments are also contemplated. The size of the M feet can be based on the mobile unit 102 and considerations associated with transport on road and highways.

Alternatively, the telescoping apparatus 3100 can be part of a trailer which is hitched to another vehicle. In yet another embodiment, the telescoping platform 3100 can be mobile itself with wheels and propulsion. In a further embodiment, the telescoping platform 3100 can be part of or made with a crane. Various other embodiments are also contemplated.

The mobile unit 3102 is configured to drive on roads, highways, gravel, etc. to bring the telescoping platform 3100 to a location proximate to the cell tower 12. Once the mobile unit 3102 is positioned proximate to the cell tower 12, the telescoping apparatus 3100 is configured to deploy. To deploy the telescoping platform 3100 from the transport position to the operating position, first, the telescoping pole 3110 is unlocked from the support 3134. Next, the telescoping pole 3110 with the platform 3120 is raised from a lateral, horizontal position to a vertical position. This movement can be through the extension mechanism 3122. Specifically, the extension mechanism 3122 can rotate the telescoping platform 3100 about ninety degrees from the transport position to the operating position as well as extend each of the N sections of the telescoping pole 3110 vertically to raise or lower the platform 3120.

In an embodiment, a telescoping apparatus 3100 for data capture of a cell tower 12 includes a telescoping pole 3110 adapted to selectively extend vertically via an extension mechanism 3122; a platform 3120 disposed to a top of the telescoping pole 3110 and adapted to support a camera 3120 for taking pictures of the cell tower 12. The telescoping pole 3110 can include N sections each with a length M to provide an extension of the platform to a height of about N×M, wherein N and M are selected based on the one of a bed 3130 and a trailer and a desired height for the cell tower 12. The telescoping pole 3110 and the platform 3120 are configured in a transport position substantially horizontal and an operating position substantially vertical.

In a further embodiment, a mobile unit 3102 with a telescoping platform 3100 for data capture of a cell tower 12 includes one of a bed 3130 and a trailer; a telescoping pole 3110 on the one of the bed 3130 and the trailer, wherein the telescoping pole 3110 is adapted to selectively extend vertically via an extension mechanism 3122; a camera 3120 disposed to a top of the telescoping pole 3110.

FIG. 66 illustrates the telescoping apparatus 100 in a mobile configuration to maneuver at the cell site 10. Specifically, in this embodiment, the telescoping apparatus 100 includes wheels 3160 such that the telescoping apparatus 3100 can maneuver in tight spaces, over gravel, etc. such that it is positioned proximate to the cell tower 12. Here, the telescoping apparatus 3100 can be brought to the cell site 10 via the mobile unit 3102, offloaded and then moved to the cell tower 12.

In an embodiment, the extension mechanism 3122 can include a motor or the like to drive the wheels 3160. The telescoping apparatus 3100 can be controlled via a remote, via a driver, via a mobile device, etc. In another embodiment, the telescoping apparatus 3100 can be pulled by an All-Terrain Vehicle (ATV), a truck, etc. Of note, a crane has difficulties accessing the cell tower 12 based on current deployment practices, i.e., cell towers 12 are deployed typically around trees, with a narrow gravel ingress road, etc. The objective here is for the telescoping apparatus 3100 to maneuver to the cell tower 12 vertically. It is expected that it would be difficult to bring a large truck to the cell tower 12 as well as associated risks.

The telescoping apparatus 3100 can also include stabilizing arms 3162 and wheels 3164 that can be selectively extended or removed to provide stabilization as the telescoping apparatus 3100 is maneuvered to the cell tower 12. The stabilizing arms 3162 and wheels 3164 ensure the telescoping apparatus 3100 does not topple over as it stands vertically during maneuvering. The stabilizing arms 3162 and wheels 3164 can be stored or removed in the transport position.

In another embodiment, the telescoping apparatus 3100 can have the wheels on the telescoping pole 3110 allowing the telescoping platform 3100 to maneuver in the transport position, i.e., the telescoping pole 3110 is horizontal. Here, the extension mechanism 3122 can rotate the telescoping pole 3110 once the telescoping apparatus 3100 is in the desired position. The wheels on the telescoping pole 3110 can be removed or remain in place in the operating position.

§ 28.0 Closing Out Maintenance or Installation Work

Figure 68:
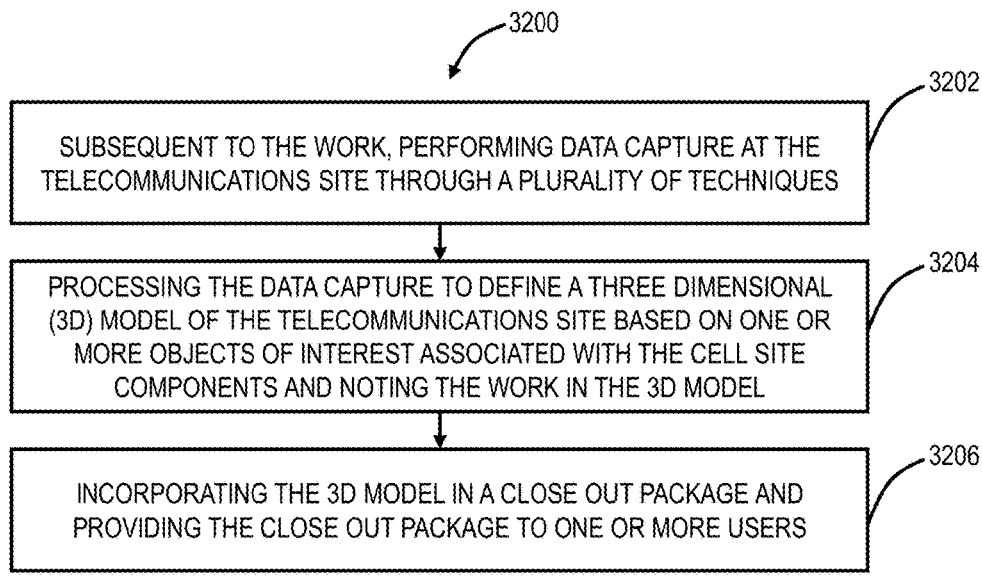
FIG. 68 is a flowchart of a method for closing out maintenance or installation work at a telecommunication site.

FIG. 68 is a flowchart of a method 3200 for closing out maintenance or installation work at a telecommunication site. Again, a close out package (COP) is a document or set of documents which verify and document maintenance and/or installation work at a telecommunication site such as the cell site 10. The various aspects described herein can be used to obtain data for the close out package. The close out package can be a file or other type of electronic document which can be hosted on a server, in the cloud, etc. The close out package can be delivered to a customer via a URL link such as through an email, via a website, embedded in a document (i.e., a spreadsheet, word processor document, etc.), etc. Also, the close out package can be included in a website, as well as with a link to a viewing software. The close out package can be hosted on a third-party server, in-house corporate servers, offsite, in the cloud, etc.

The close out package can be viewed, analyzed, etc. to view the current status of the cell site 10, cell tower 12, etc. The close out package can include a 3D model as described herein. Personnel can use the close out packet for pre/post-installation of the cell site 10. The views/3D model can be used to determine the scope of work performed.

The method 3200 includes, subsequent to the work, performing data capture at the telecommunications site through a plurality of techniques (step 3202); processing the data capture to define a three dimensional (3D) model of the telecommunications site based on one or more objects of interest associated with the cell site components and noting the work in the 3D model (step 3204); and incorporating the 3D model in a close out package and providing the close out package to one or more users (step 3206). The close out package can be hosted on a cloud-based server and the providing comprises one of sending an email, website log in, or a link directed to the close out package. The data capture can include photos or video of the telecommunications site and the work performed there, including a cell tower and cell site components on the cell tower. The 3D model can include a plurality of two-dimensional (2D) photos embedded therein and viewable via clicking or selecting in the 3D model.

The plurality of techniques for the data capture can include the use of an Unmanned Aerial Vehicle (UAV). The plurality of techniques for the data capture can include the use of a satellite. The plurality of techniques for the data capture can include the use of a telescoping pole. The method 3200 can further include utilizing the close out packet for a determination of a down tilt angle of one or more antennas of the cell site components based on measuring three points comprising two defined by each antenna and one by an associated support bar using the 3D model, plumb of the cell tower and/or the one or more antennas, azimuth of the one or more antennas using a location in the 3D model, dimensions of the cell site components, equipment type and serial number of the cell site components, connections between the cell site components, a status of a lightning rod and warning light on the cell tower, and Global Positioning Satellite (GPS) coordinates.

§ 29.0 Torque Mark to Verify Power and Equipment Connections

Figure 69:
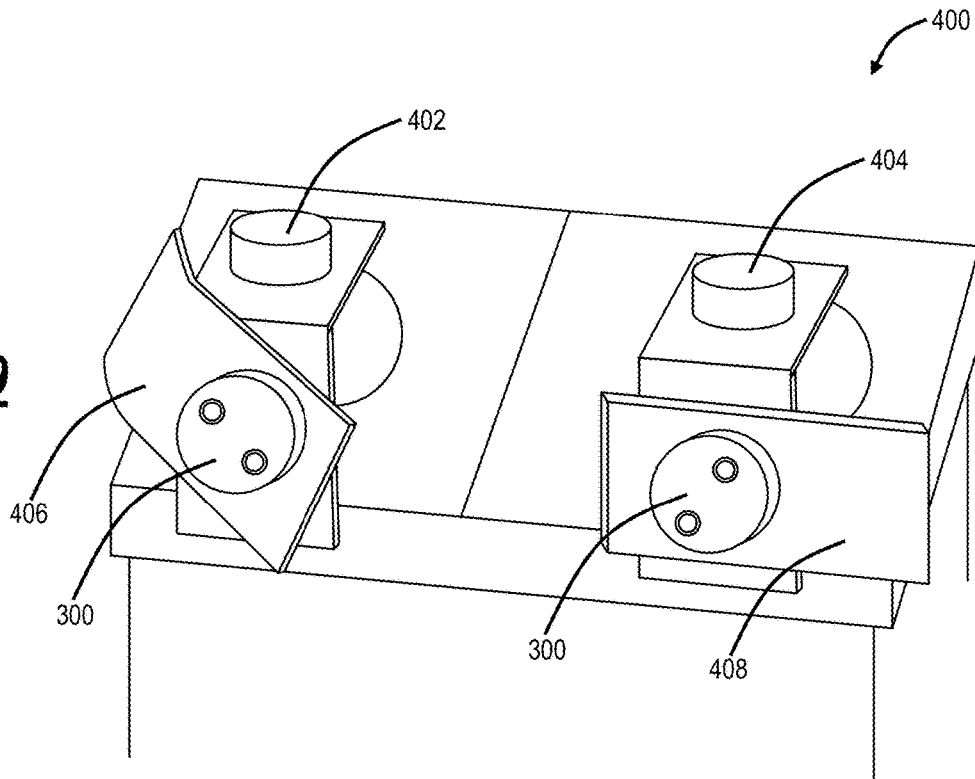
FIG. 69 is a picture of a torque mark on the connection between the terminals and the terminal plates for the battery.

It can be difficult to remotely verify connections such as battery connections, coax connections, etc. The systems and methods described herein provide a mechanism to visually and even remotely verify connection veracity merely by visual inspection. Referring to FIG. 69, in an exemplary embodiment, a picture illustrates a torque mark 850 on the connection between the terminals 402, 404 and the terminal plates 406, 608 for the battery 400. The torque mark 850 can be paint applied between the terminals 402, 404 and the terminal plates 406, 608 once the connections are appropriately torqued after installation. The torque mark 850, when initially made, visually indicates a quality connection. The torque mark 850 paint is any paint that will not negatively interact chemically with the battery 400, and thus fail, fade, etc. In an exemplary embodiment, the torque mark 850 paint is colored for easy visual inspection, such as red, yellow, or some other bright color. Of note, the color of the torque mark 850 paint should be distinct from the color of the underlying equipment (which is typically silver, gray, etc.). If the torque mark 850 is broken, it can visually be determined there is a problem with the connection.

While FIG. 69 illustrates the battery 400, those skilled in the art will recognize the torque mark 850 can be used on any connection, e.g., bolted connection in the shelter 50. For example, the torque mark 850 can be applied to racks/battery cases/power plants to show they have been appropriately anchored to the floor.

Also, the torque mark 850 contemplates any material or the like which can be physically attached to both ends of the connection and which would break or visually show signs of decay based on the connection losing torque. For example, the torque mark 850 can be paint, a marker, cellophane, tape, wax or wax-like compound, silicon, etc. Also, for ease of application, the material for the torque mark 850 can have an adhesive that is removed allowing for quick application. Alternatively, the material for the torque mark 850 can be dispensed through a dispensing apparatus.

The torque mark 850 can be applied across a top of the bolt in a line extending onto the surface of the object the bolt is connected to. If the bolt loosens, the torque mark 850 will break and/or fall off. Thus, simple visual inspection can confirm that the connections are still at the torque they were originally tightened to. Advantageously, the torque mark 850 as paint does not fade as a pen or marker would. Further, the torque mark 850 is easily verified remotely through virtual site surveys as described herein.

Similarly, torque marks 850 are applicable to connections within the small cells 90.

§ 30.0 Obtaining 3D Modeling Data View Intelligent Flight Modes

As described herein, the UAV 50 can be used to obtain data capture for various aspects including the creation of the 3D model. In an embodiment, the UAV 50 can take off towards the top of the cell tower 12. Once at the top of the cell tower 12, the camera 86 is pointed straight down for a top-down view of the cell site 10 and cell tower 12—this is performed to ensure the UAV 50 is directly below the cell tower 12. A Point of Interest (POI) flight mode is started and the GPS coordinate/altitude data is collected at the top of the cell tower 12. Here, the cell tower 12 is the POI and the cell tower 12 is usually at the center of the cell site 10.

The UAV 50 starts increasing altitude and widening the radius away from the cell tower 12. A speed is selected that allows the camera 86 a photo shuttering time for at least a 75% photo overlap. The flight will then take place autonomously. By increasing the radius and altitude, the UAV 50 can be used to create an overall view of the cell site 10 for the 3D model. The altitude and radius can be adjusted while the flight is paused or during the flight. By changing the altitude and radius, the UAV 50 can take inspection photos around each RAD center and other parts of the tower/compound. These photos can be added for the modeling process. By using intelligent flight modes, the UAV 50 can decrease the number of flights, use fewer batteries, and decrease the amount of time spent at the cell site 10.

§ 31.0 Augmented Reality Add-in Process

Figure 70:
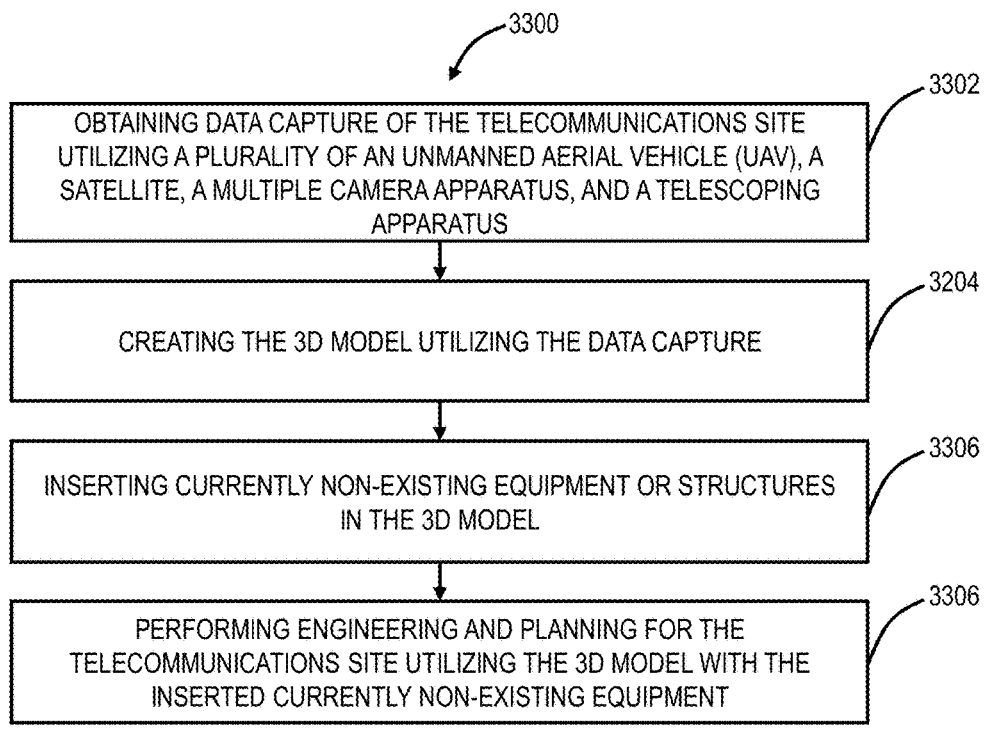
FIG. 70 is a flowchart of a method for creating a 3D model of a telecommunications site and performing an augmented reality add-in of equipment, structures, etc. at the telecommunications site.

FIG. 70 is a flowchart of a method 3300 for creating a 3D model of a telecommunications site and performing an augmented reality add-in of equipment, structures, etc. at the telecommunications site. The method 3300 includes obtaining data capture of the telecommunications site utilizing a plurality of an Unmanned Aerial Vehicle (UAV), a satellite, a multiple camera apparatus, and a telescoping apparatus (step 3302); creating the 3D model utilizing the data capture (step 3304); inserting currently non-existing equipment or structures in the 3D model (step 3306); and performing engineering and planning for the telecommunications site utilizing the 3D model with the inserted currently non-existing equipment (step 3308).

The non-existing equipment or structures can include one or more of radios, power plants, batteries, Over Voltage Protection (OVP) equipment, 5G telecom equipment, antennas, Tower Mounted Antennas (TMAs), and Remote Radio Head (RRH) equipment. The method 3300 can further include determining specifications of the non-existing equipment or structures and incorporating the specifications in the 3D model; and causing display of one or more of the specifications based on a selection in the 3D model. The specifications can include a plurality of dimensions, wattage, voltage, current, cost, and decibels.

The method 3300 can further include determining a necessary change to the telecommunications site based on the specifications of the inserted non-existing equipment or structures. The method 3300 can further include determining a Bill of Materials (BOM) for a plurality of types of the non-existing equipment or structures; and providing a listing of a specific BOM based on the inserted non-existing equipment or structures. The method 3300 can further include utilizing the 3D model for site planning and engineering for a change in the telecommunications site.

§ 32.0 Uploading of Site Audit and 3D Model Documents

The 3D model, close out audit package, etc. is a data package that describes the cell site 10. A typical process involves the creation of this data package by an engineer, installer, planner, etc. and they may be from a separate organization from a consumer (user). For example, the data package may be prepared by an engineering company or department and the user who needs the data package may be at another organization such as an owner/operator of the cell site 10. There is a need for a process to provide the data package between these users.

Figure 71:
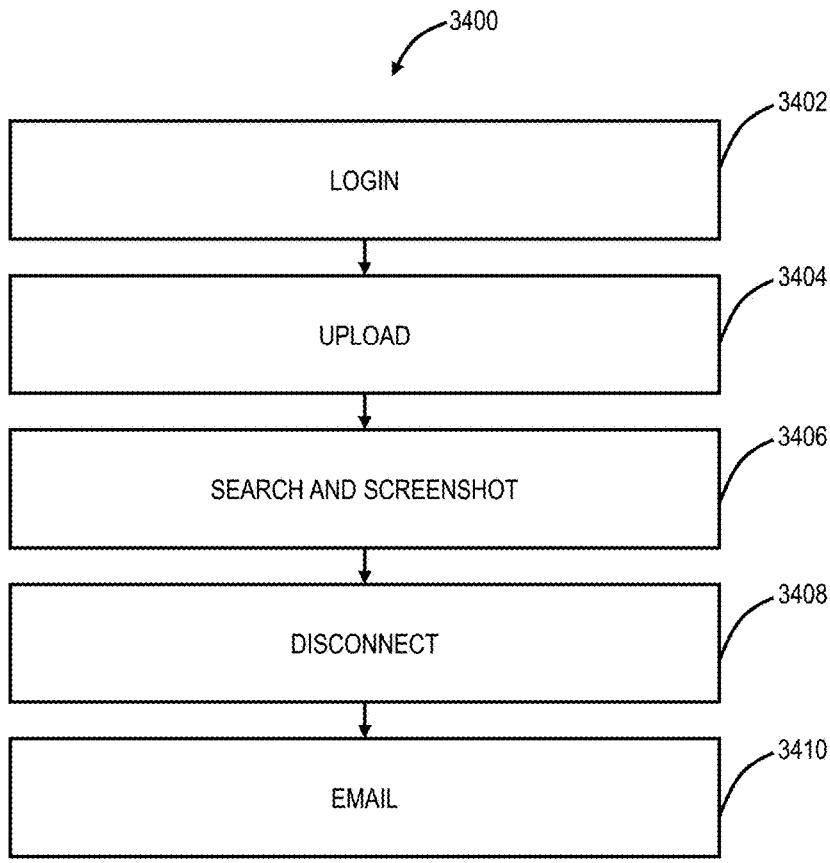
FIG. 71 is a flowchart of a workflow to share a data package (e.g., the 3D model) with an end user.

FIG. 71 is a method 3400 for a workflow to share the data package with an end user. The method 3400 includes login (step 3402), upload (step 3404), search and screenshot (step 3406), disconnect (step 3408), and email (step 3410).

The login can be via a Web browser, an application, etc. utilizing a Virtual Private Network, Hypertext Transfer Protocol Secure (HTTPS), etc. Once logged in, a User Interface (UI) can be provided for the upload. The upload can include data entry/selection such as for vendor, location, document type, upload files, etc.

Figure 72:
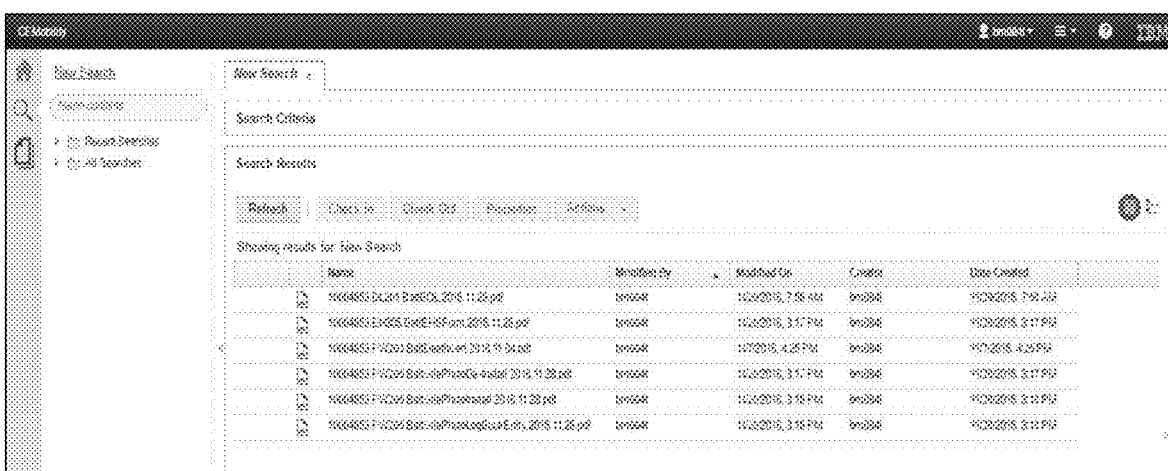
FIG. 72 is a screenshot of a User Interface.

The UI can also provide a search and screenshot for the user to search for documents such as by title, location, vendor, document type, etc. FIG. 72 is a screenshot of the UI. The email can be used to notify one or more users of the uploaded data package and they can log in and retrieve/view the data.

A method for preparing and delivering a data package detailing work performed at a telecommunications site includes, subsequent to the work, performing data capture at the telecommunications site utilizing a plurality of an Unmanned Aerial Vehicle (UAV), a satellite, a multiple camera apparatus, and a telescoping apparatus; processing the data capture to provide a close out audit package for the telecommunications site describing the work; uploading the close out audit package through a User Interface to a server; providing the close out audit package to one or more users via the server; and performing verification of the work via the uploaded close out audit package. The method can further include processing the data capture to define a three dimensional (3D) model of the telecommunications site based on one or more objects of interest associated with the cell site components and noting the work in the 3D model; and incorporating the 3D model in the close out audit package.

The close out audit package can be hosted on a cloud-based server and the providing comprises one of sending an email, website log in, or a link directed to the close out package. The data capture includes photos or video of the telecommunications site and the work performed there, including a cell tower and cell site components on the cell tower. The 3D model can include a plurality of two-dimensional (2D) photos embedded therein and viewable via clicking or selecting in the 3D model. The data capture can include use of the UAV.

The method can further include utilizing the close out packet for a determination of a down tilt angle of one or more antennas of the cell site components based on measuring three points comprising two defined by each antenna and one by an associated support bar using the 3D model, plumb of the cell tower and/or the one or more antennas, azimuth of the one or more antennas using a location in the 3D model, dimensions of the cell site components, equipment type and serial number of the cell site components, connections between the cell site components, a status of a lightning rod and warning light on the cell tower, and Global Positioning Satellite (GPS) coordinates.

§ 33.0 PIM Mitigation Audit

Figure 73:
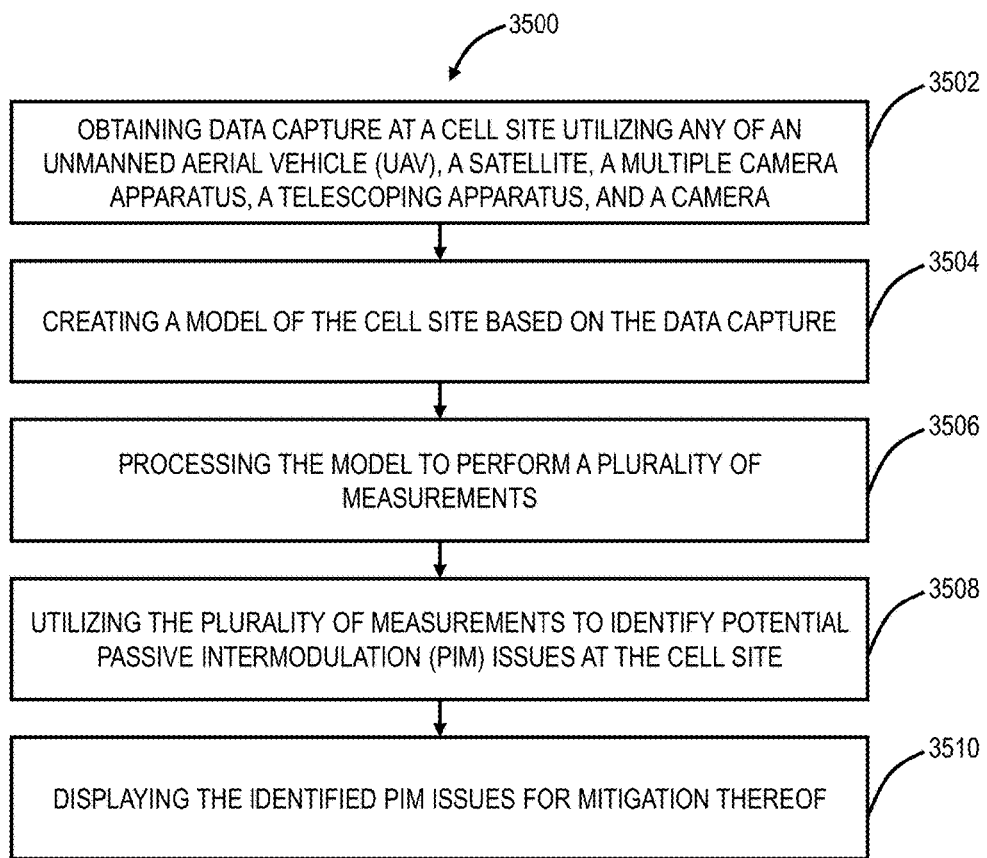
FIG. 73 is a flowchart of a method for performing a PIM mitigation audit.

FIG. 73 is a flowchart of a method 3500 for performing a PIM mitigation audit. Again, PIM impacts performance of a cell site 10. The conventional approach is to perform PIM testing on-site. The present disclosure includes the PIM mitigation audit which can be performed prior to on-site physical PIM testing to identify the cell sites 10 that are more likely to have PIM issues. As such, the physical on-site testing can be optimized to the cell sites 10 that are more likely to have PIM issues, as opposed to testing every cell site 10 which is inefficient, time-consuming, costly, etc. Again, the PIM mitigation audit can be performed based on various measurements that can be obtained via data capture through an Unmanned Aerial Vehicle (UAV) ("drones"), satellite data capture, plane data capture, ground-based data capture, etc. along with a three-dimensional (3D) model. That is, the PIM mitigation audit contemplates all of the various data capture techniques described herein along with the use of the 3D modeling described herein.

Specifically, the present disclosure includes a method, an apparatus, and instructions embodied in a non-transitory computer-readable medium to perform various measurements to determine PIM likelihood. In an embodiment, the present disclosure utilizes a 3D model. For example, the present disclosure can create an antenna mount detail to perform various measurements such as, for example:

Measurements between existing antennas
Measurements between existing antennas and other equipment installed (Remote Radio Head (RRH), radio, Tower Mounted Amplifier (TMA) or filters)
Measurement between antennas and adjacent sectors
Centerline confirmation
Measurements of existing pipe mounts
Measurement of existing antenna platform
Vertical measurements above and below existing installed equipment
Sector face azimuths or skew angle These various measurements can provide indications of potential for PIM issues.

Additionally, the present disclosure can determine, for example:
Line of sight viewpoint at rad center at each sector of the cell tower 12
Identification of line of sight obstacles
Sector labeled photos including compass showing North direction Additionally, the present disclosure can determine issues arising from arise from antenna placement (i.e., an antenna out in front of an adjacent antenna and creating signal issues). Also, the audit can to locate stray (not design) metal in front of the antenna radiation path. With respect to the measurements, the audit is to measure the distance between antennas (side to side, above, below, and antenna to building parapet).

The data capture can use any of the aforementioned techniques described herein. Also, the data capture can include photos/video of existing antenna installations with compound and property view. The present disclosure can both utilize the 3D model and provide details in the 3D model of potential PIM issues/locations. This can include the compound and ground based installed equipment, a ground equipment photo package, a detailed compound layout plan, and a detailed equipment room layout plan.

The method 3500 includes obtaining data capture at a cell site utilizing any of an Unmanned Aerial Vehicle (UAV), a satellite, a multiple camera apparatus, a telescoping apparatus, and a camera (step 3502); creating a model of the cell site based on the data capture (step 3504); processing the model to perform a plurality of measurements (step 3506); utilizing the plurality of measurements to identify potential Passive Intermodulation (PIM) issues at the cell site (step 3508); and displaying the identified PIM issues for mitigation thereof (step 3510).

The model can be a three dimensional (3D) model of the cell site based on one or more objects of interest associated with the cell site components. The data capture can be based on photos and/or video from the UAV. The cell site can be a first cell site, and the method 3500 can further include obtaining data capture for a plurality of cell sites; and performing the creating, the processing, the utilizing, and the displaying for the plurality of cell sites. The method 3500 can further include ranking the first cell site and the plurality of cell sites based on the PIM issues. The mitigation can include physical on-site testing based on the ranking. The measurements can include a plurality of measurements between existing antennas, measurements between existing antennas and other equipment installed, measurements between antennas and adjacent sectors, centerline confirmation, measurements of existing pipe mounts, measurement of existing antenna platform, vertical measurements above and below installed equipment, and sector face azimuths or skew angle.

§ 34.0 Small Cell Coordination and Vetting

Figure 74:
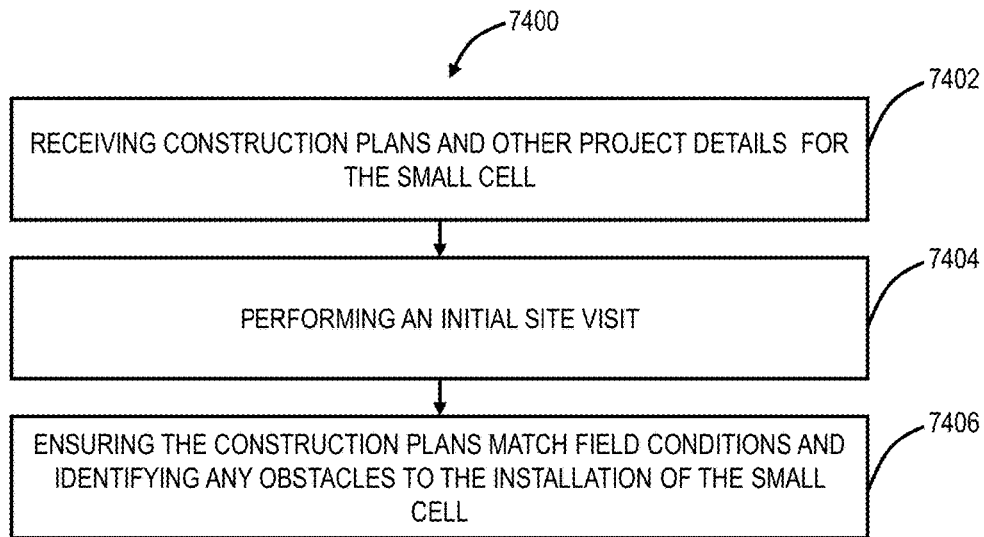
FIG. 74 is a flowchart of a method for coordinating initiation of a small cell.

FIG. 74 is a flowchart of a method 7400 for coordinating initiation of a small cell 90. The method 7400 includes receiving construction plans and other project details for the small cell 90 at step 7402. The method also includes performing an initial site visit at step 7404. In embodiments, the initial site visit includes performing the data capture of a site using one or more of the methods disclosed herein. In embodiments, the initial site visit is performed using the UAV 50 for the data capture. The data capture including one or more of photos and videos of the site and any existing infrastructure thereon, and in particular, the infrastructure selected to receive and interface with the small cell 90.

The method further includes ensuring the construction plans match field conditions and identifying any obstacles to the installation of the small cell 90 at step 7406. In embodiments, step 7406 includes generating a model of the site, as disclosed herein, and comparing the generated model to the construction plans to identify any differences. Furthermore, the captured photos and videos are analyzed for current conditions of the existing infrastructure, including structural flaws in the structure, the color, shape, and size of the existing infrastructure. In embodiments, the small cell 90 is modeled based off of the construction plans and inserted into the model for validation thereof.

Figure 75:
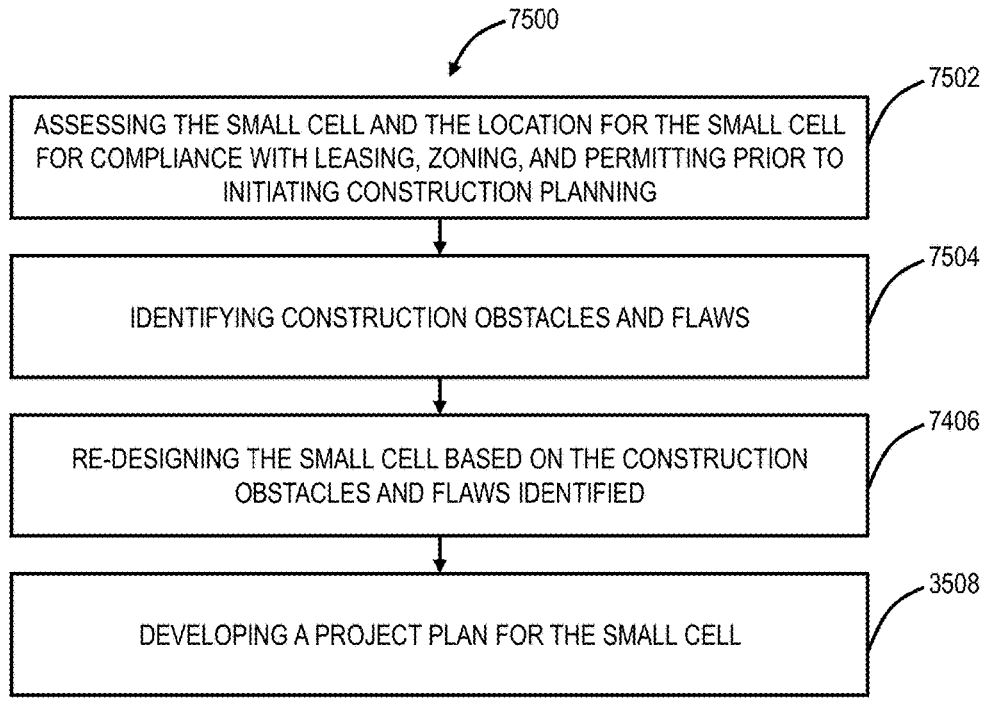
FIG. 75 is a flowchart of a method for preparing and vetting a small cell for implementation.

FIG. 75 is a flowchart of a method 7500 for preparing and vetting a small cell 90 for implementation. The method includes assessing the small cell 90 and the location for the small cell 90 for compliance with leasing, zoning, and permitting prior to initiating construction planning at step 7502. In embodiments, the leasing is for a location on infrastructure to mount the small cell 90 thereon. The infrastructure can be new or existing infrastructure. In embodiments, the location and/or options for the location on infrastructure are assessed/vetted by modeling the existing infrastructure using a UAV 50 using one or more of the methods disclosed herein and selecting the best location based on the model, an availability of the space for leasing, and applicable zoning. In embodiments, step 7502 includes identifying missing compliance items and parties responsible for those items.

In embodiments, the method includes providing data necessary to remedy the compliance items to the parties responsible for those items. In embodiments, the data captured during the modeling of the infrastructure, such as photos and videos are provided from the UAV 50 for addressing the missing compliance items.

The method 7500 also includes identifying construction obstacles and flaws at step 7504. In embodiments, step 7504 includes one or more of the steps of the method 7400, and in particular, performing a site visit using the UAV 50 for data capture, generating a model including the small cell 90 to verify construction plans for the small cell 90. In embodiments, the modeling includes determining existing utilities and facilities that are available to interface with the small cell 90 and any utilities and facilities that are obstacles to construction of the small cell 90.

The method 7500 further includes re-designing the small cell 90 based on the construction obstacles and flaws identified at step 7506. In embodiments, re-designing the small cell 90 utilizes the data captured by the UAV 50 and the model generated based thereon to re-configure the model of the small cell and modify the construction documents based on the re-configured model.

In some embodiments, the method 7500 includes engaging sub-contractors to identify construction tasks, division thereof and to identify any further re-configurations required for the small cell 90. In embodiments, construction documents, the data captured by the UAV 50, and the model generated using the data captured by the UAV 50 is provided to the sub-contractors. This engagement can occur before or after step 7506. The data captured by the UAV 50 and the model can be provided to the sub-contractors via method 3400 and the like. In embodiments, engaging the sub-contractors includes requesting feedback from the sub-contractors, revising the model based on the feedback, and revising the construction documents based on the revised model.

In some embodiments, the method 7500 includes vetting the sub-contractors based on the feedback, quality, and price for the identified construction tasks.

The method yet further includes developing a project plan for the small cell 90 at step 7508. In embodiments, step 7508 is developed based on the data captured by the UAV 50, the model, and the construction documents developed therefrom along with the identified construction tasks. Step 7508 can include providing the project plan is provided to the customer along with the model and construction documents.

§ 34.1 Small Cell Scheduling

Figure 76:
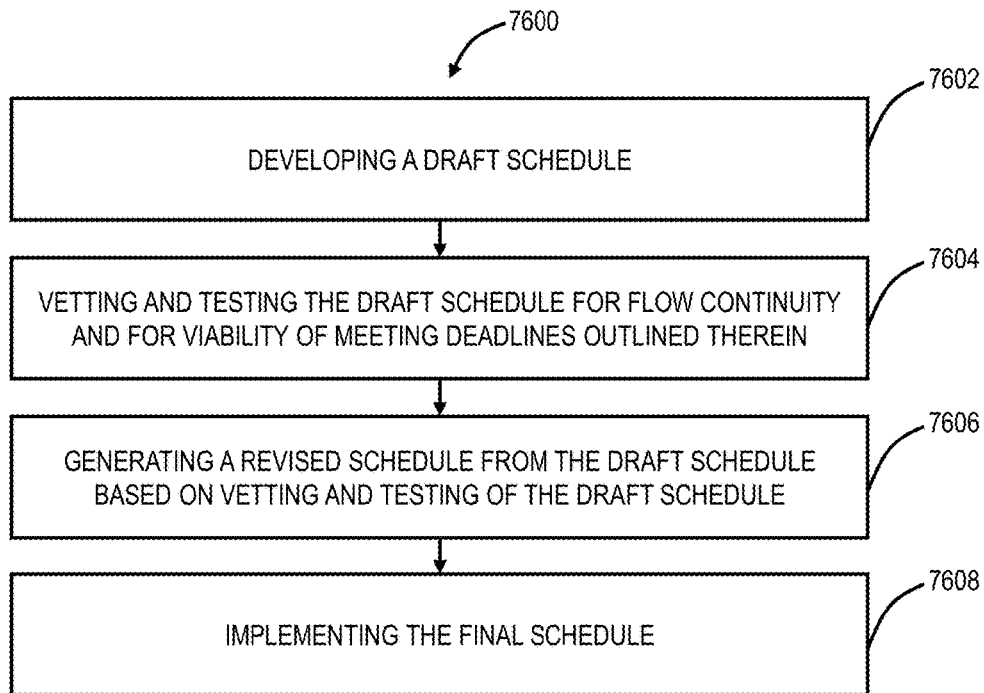
FIG. 76 is a flowchart of a method for scheduling construction of a small cell.

FIG. 76 is a flowchart of a method 7600 for scheduling construction of a small cell 90. The method includes developing a draft schedule at step 7602. In embodiments, the draft schedule is a matrix comprising an order of when each task for construction of the small cell 90 is to be completed. The method 7600 also includes vetting and testing the draft schedule for flow continuity and for viability of meeting deadlines outlined therein at step 7604. In embodiments, a model of the infrastructure and small cell 90, developed based on data captured by the UAV 50 as disclosed herein, is used with construction documents to vet and test the draft schedule. In particular, the model can be used to vet the schedule order and the timing of each task.

The method 7600 further includes generating a revised schedule from the draft schedule based on vetting and testing of the draft schedule at step 7606. In embodiments, the revised schedule is based on schedule order conflicts and timing conflicts identified using the model and the tests thereon. In some embodiments, one of the draft schedule and the revised schedule is provided to one or more of the client and the sub-contractors for further feedback and or testing. In further embodiments, steps 7604 and 7606 include engaging the municipality and ensuring the revised schedule meets municipal requirements. In one embodiment, the schedule is revised iteratively between testing, feedback from the client, feedback from the sub-contractors, and municipal requirements; and is repeated until a final schedule is reached. In embodiments, the iterative process includes revising the model based on the revisions and vetting and testing the revised schedule against the revised model at each iteration.

The method 7600 yet further includes implementing the final schedule at step 7608. In embodiments, final schedule is implemented based on the testing, feedback, and model revisions of steps 7604 and 7606.

§ 34.2 Small Cell Implementation

Figure 77:
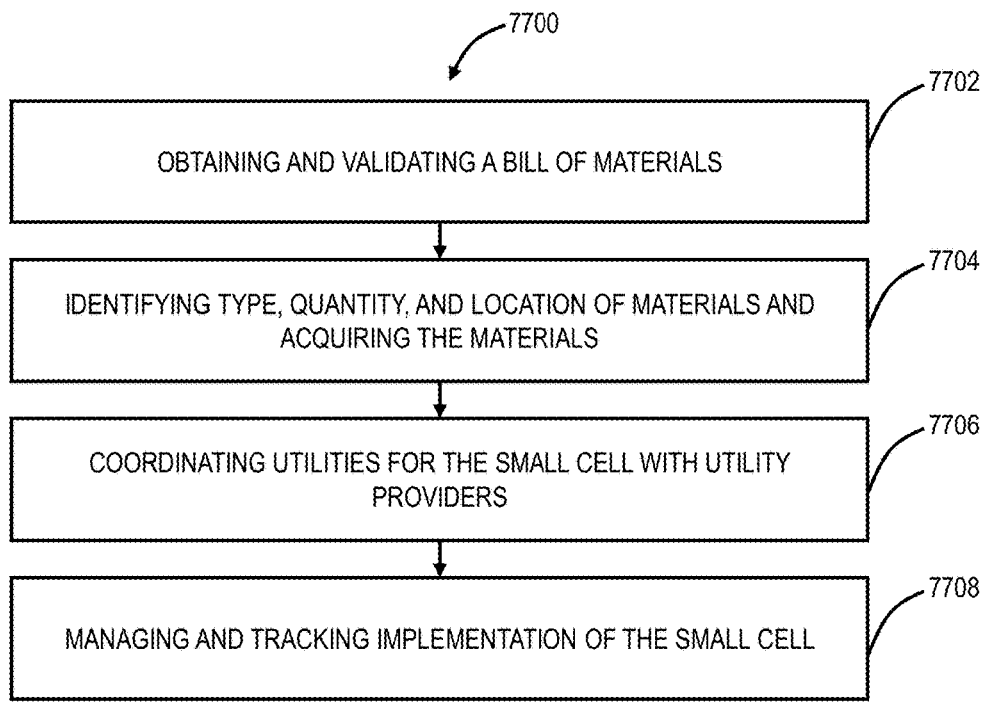
FIG. 77 is a flowchart of a method for constructing and implementing a small cell

FIG. 77 is a flowchart of a method 7700 for constructing and implementing a small cell 90. The method 7700 includes obtaining and validating a bill of materials at step 7702. In embodiments, the bill of materials is obtained from the customer and validated against one of a model generated from the data captured by the UAV 50, by one of the methods disclosed herein, and construction documents validated against the model. The method 7700 also includes identifying type, quantity, and location of materials and acquiring the materials at step 7704. In some embodiments, step 7704 includes building a logistics plan for acquiring the materials and allocating the materials to the sub-contractors.

The method 7700 further includes coordinating utilities for the small cell 90 with utility providers at step 7706. In embodiments, coordinating the utilities for the small cell 90 with utility providers includes validating the utility connection points and requirements against one of the model and construction documents validated against the model. In embodiments, the validation is performed as part of one of the other methods disclosed herein, such as methods 7400, 7500, and 7600, which in these embodiments, are incorporated as part of the method 7700.

The method yet further includes managing and tracking implementation of the small cell 90 at step 7708. In some embodiments, managing and tracking implementation of the small cell 90 includes performing audits of the small cell 90 with the UAV 50 using one or more of the methods disclosed herein. In one embodiment, each audit includes generating a model of the current implementation of the small cell 90 based on data collected by the UAV 50. In embodiments, a panel 91 of the small cell 90 is opened during the audit by one of the UAV 50 mechanically interfacing with the small cell 90 to open the panel and the small cell 90 causing the panel 91 to open based on detection of or command signals received from the UAV 50. In further embodiments, the audit includes capturing one of photos and video of components of the small cell 90 to generate a 3D model and verifying that a torque mark is present at each connection of the components based on the 3D model. In embodiments, other hardware configurations are also verified including the configuration of the antennas of the small cell 90. In some embodiments, the audit includes utilizing the UAV 50 to test and validate wireless communication, such as signal strength, of the small cell 90.

§ 35.0 Power Plant Implementation

As illustrated in FIGS. 3 and 9, telecommunications sites include power plants 53, which provide power to the telecommunications equipment. Power plants 53 include a main distribution frame and all of the power distribution equipment and cabling associated therewith. As described above, such as in §§ 23, 25, 29, and 31 above, one of a 360 degree view and model of existing telecommunications equipment can be used and augmented with a model of a power plant 53 to plan, implement, and vet installation of a power plant 53 at a telecommunications site. The methods of which are described in detail below.

Figure 78:
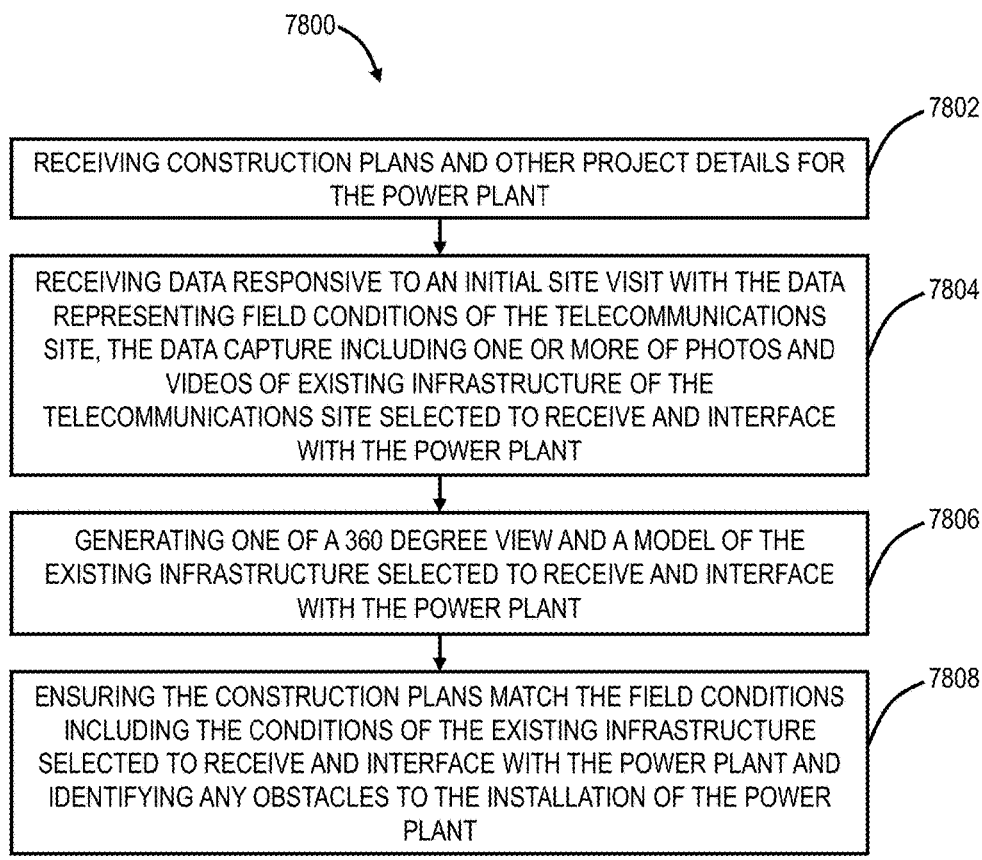
FIG. 78 is a flowchart of a method for coordinating initiation of a power plant at a telecommunication site.

FIG. 78 is a flowchart of a method 7800 for coordinating initiation of a power plant 53 at a telecommunication site. The method 7800 includes receiving construction plans and other project details for the power plant 53 at step 7802. The method 7800 also includes receiving data responsive to an initial site visit with the data representing field conditions of the telecommunications site, the data capture including one or more of photos and videos of existing infrastructure of the telecommunications site selected to receive and interface with the power plant 53 at step 7804. In embodiments, the initial site visit includes capturing the photos and videos of the existing site using one or more of the methods disclosed herein. In embodiments, the location for the power plant 53 is in at least one of a shelter, a cabinet housing, and supporting telecommunications equipment.

The method 7800 further includes generating one of a 360 degree view and a model of the existing infrastructure selected to receive and interface with the power plant 53 at step 7806. Generating a 360 degree view/model of the existing infrastructure can be performed using any of the methods disclosed herein.

The method 7800 further includes ensuring the construction plans match the field conditions including the conditions of the existing infrastructure selected to receive and interface with the power plant 53 and identifying any obstacles to the installation of the power plant 53 at step 7808. In embodiments, ensuring the construction plans match field conditions and identifying any obstacles to the installation of the power plant 53 includes one or more of comparing the generated one of the 360 degree view and the model to the construction plans to identify any differences and analyzing the data captured for current conditions of the existing infrastructure including at least structural flaws in the existing infrastructure. In embodiments, the power plant 53 is modeled based on the construction plans and inserted into the generated one of the 360 degree view and the model prior to comparing the generated one of the 360 degree view and the model to the construction plans.

In some embodiments, a project plan is generated based at least partially on the model, where the project plan includes project scheduling, coordination, material acquisition, and the like.

Specifically, the present disclosure includes a method, an apparatus, and instructions embodied in a non-transitory computer-readable medium to generate the project plan. The apparatus and the non-transitory computer-readable medium can include any of the apparatuses and the non-transitory computer-readable medium disclosed herein.

Figure 79:
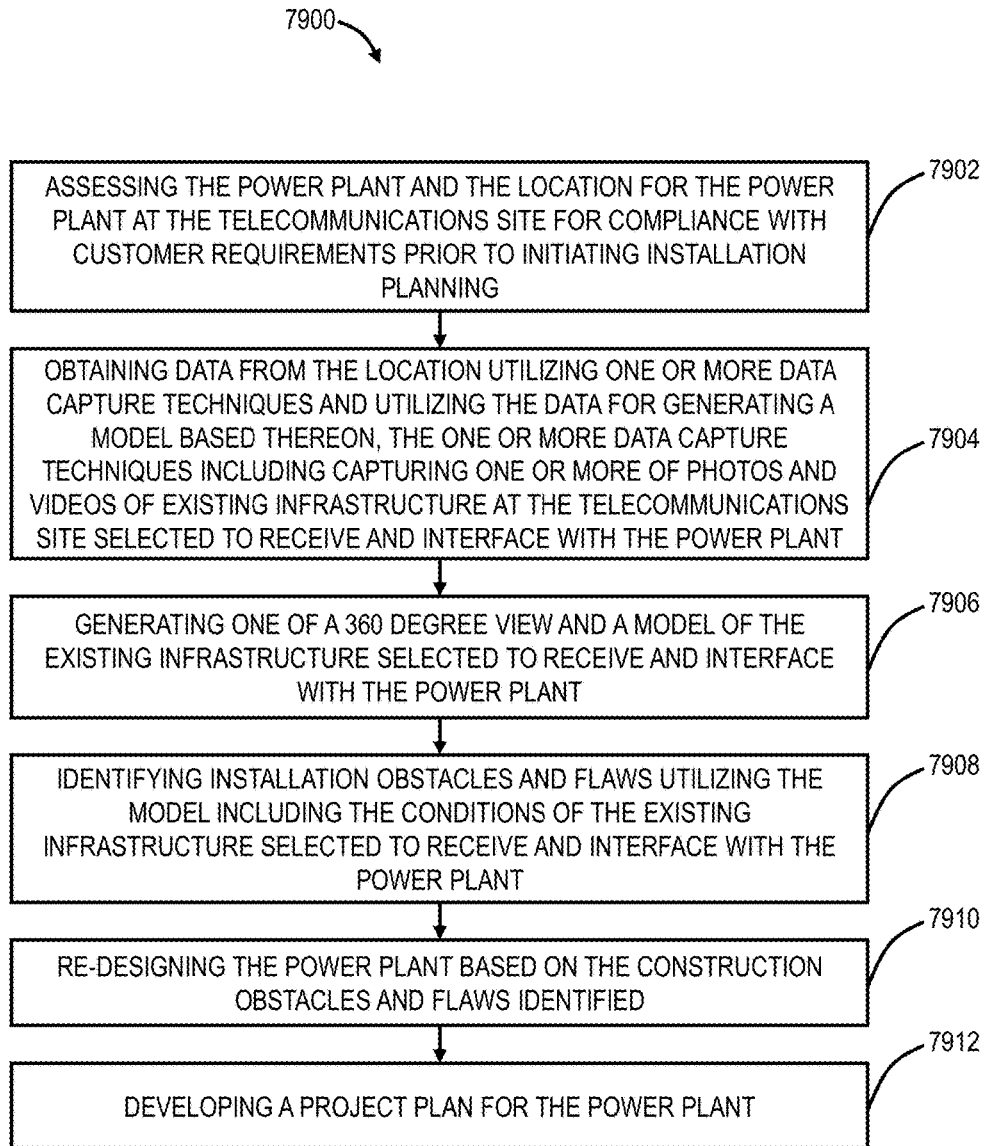
FIG. 79 is a flowchart of a method for preparing and vetting a power plant for implementation at a telecommunications site.

FIG. 79 is a flowchart of a method 7900 for preparing and vetting a power plant 53 for implementation at a telecommunications site. The method 7900 includes assessing the power plant 53 and the location for the power plant 53 at the telecommunications site for compliance with customer requirements prior to initiating installation planning at step 7902. In embodiments, the location for the power plant 53 is in a shelter or cabinet housing or supporting telecommunications equipment.

The method 7900 also includes obtaining data from the location utilizing one or more data capture techniques, the one or more data capture techniques including capturing one or more of photos and videos of existing infrastructure at the telecommunications site selected to receive and interface with the power plant 53 at step 7904. Any of the data capture techniques disclosed herein can be used for obtaining the data at the telecommunications site.

The method 7900 further includes generating one of a 360 degree view and a model of the existing infrastructure selected to receive and interface with the power plant 53 at step 7906. The one of the 360 degree view and the model can be generated utilizing any of the techniques disclosed herein. In embodiments, the modeling includes determining existing utilities and facilities that are available to interface with the power plant 53 at the telecommunications site.

The method 7900 yet further includes identifying installation obstacles and flaws utilizing the model including the conditions of the existing infrastructure selected to receive and interface with the power plant 53 at step 7908. In embodiments, step 7908 includes one or more of the steps of the method 7800.

The method 7900 further includes re-designing the power plant 53 based on the construction obstacles and flaws identified at step 7910. In some embodiments, the power plant is modeled based on the construction plans and inserted into the generated one of the 360 degree view and the model. In these embodiments, re-designing the power plant 53 can include utilizing the model of the power plant 53 inserted into the one of the 360 degree view and the model to reconfigure the power plant 53.

In some embodiments, identifying obstacles and flaws includes identifying missing installation materials or items based on the one or more of the 360 degree view and the model and identifying parties responsible for those materials or items. In these embodiments, the method 7900 further includes providing data necessary to remedy the missing materials or items to the parties identified. In some embodiments, the data provided to the parties identified includes the one or more of the 360 degree view and the model of the telecommunications site.

In some embodiments, the method 7900 also includes identifying installation tasks, division thereof, reconfiguring the power plant 53 based thereon, and validating the power plant 53 with the reconfigurations by reconfiguring the model therewith. In some of these embodiments, at least some of the data captured, and the model are provided to sub-contractors identified for performing the installation tasks. The data captured can be provided to the sub-contractors via method 3400 and the like. Further, in some embodiments, identifying the installation tasks includes requesting feedback from the sub-contractors, revising the model based on the feedback, and revising the installation documents based on the model revised based on the feedback.

In some embodiments, the method 7900 includes vetting the sub-contractors based on the feedback, quality, and price for the identified construction tasks.

The method 7900 also includes developing a project plan for the power plant 53 at step 7912. In embodiments, step 7912 is developed based at least partially on the model.

§ 34.1 Power Plant Scheduling

Figure 80:
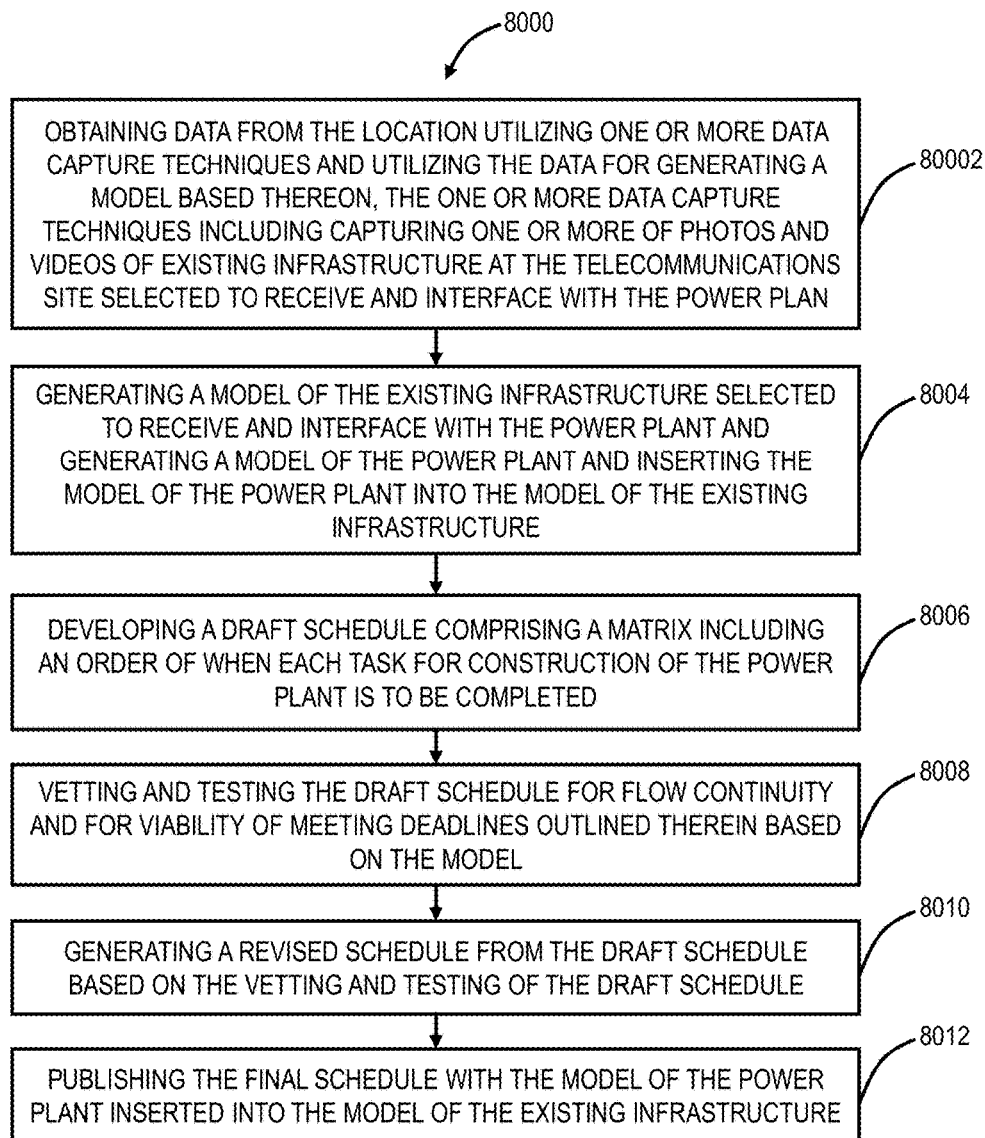
FIG. 80 is a flowchart of a method for scheduling construction of a power plant at a telecommunications site.

FIG. 80 is a flowchart of a method 8000 for scheduling construction of a power plant 53 at a telecommunications site. The method 8000 includes obtaining data from the location utilizing one or more data capture techniques and utilizing the data for generating a model based thereon, the one or more data capture techniques including capturing one or more of photos and videos of existing infrastructure at the telecommunications site selected to receive and interface with the power plant 53 at step 8002. The method 8000 also includes generating a model of the existing infrastructure selected to receive and interface with the power plant 53 and generating a model of the power plant 53 and inserting the model of the power plant 53 into the model of the existing infrastructure at step 804.

The method 8000 further includes developing a draft schedule comprising a matrix including an order of when each task for construction of the power plant 53 is to be completed at step 806. In embodiments, the draft schedule is a matrix comprising an order of when each task for construction of the power plant 53 is to be completed.

The method 8000 yet further includes vetting and testing the draft schedule for flow continuity and for viability of meeting deadlines outlined therein based on the model at step 808. In embodiments, the model is used to vet the schedule order and the timing of each task.

The method 8000 further includes generating a revised schedule from the draft schedule based on the vetting and testing of the draft schedule at step 8010. In embodiments, the revised schedule is based on schedule order conflicts and timing conflicts identified using the model and the tests thereon. In some embodiments, one of the draft schedule and the revised schedule is provided to one or more of the client and the sub-contractors for further feedback and or testing. In further embodiments, steps 8008 and 8010 include engaging the owner of the telecommunications site and ensuring the revised schedule meets the owner's requirements. In one embodiment, the schedule is revised iteratively between testing, feedback from the client and feedback from the sub-contractors and is repeated until a final schedule is reached. In embodiments, the iterative process includes revising the model based on the revisions and vetting and testing the revised schedule against the revised model at each iteration.

The method 8000 yet further includes publishing the final schedule with the model of the power plant 53 inserted into the model of the existing infrastructure at step 8012. In embodiments, the final schedule is implemented based on the testing, feedback, and model revisions of steps 8008 and 8010.

§ 34.2 Power Plant Implementation

Figure 81:
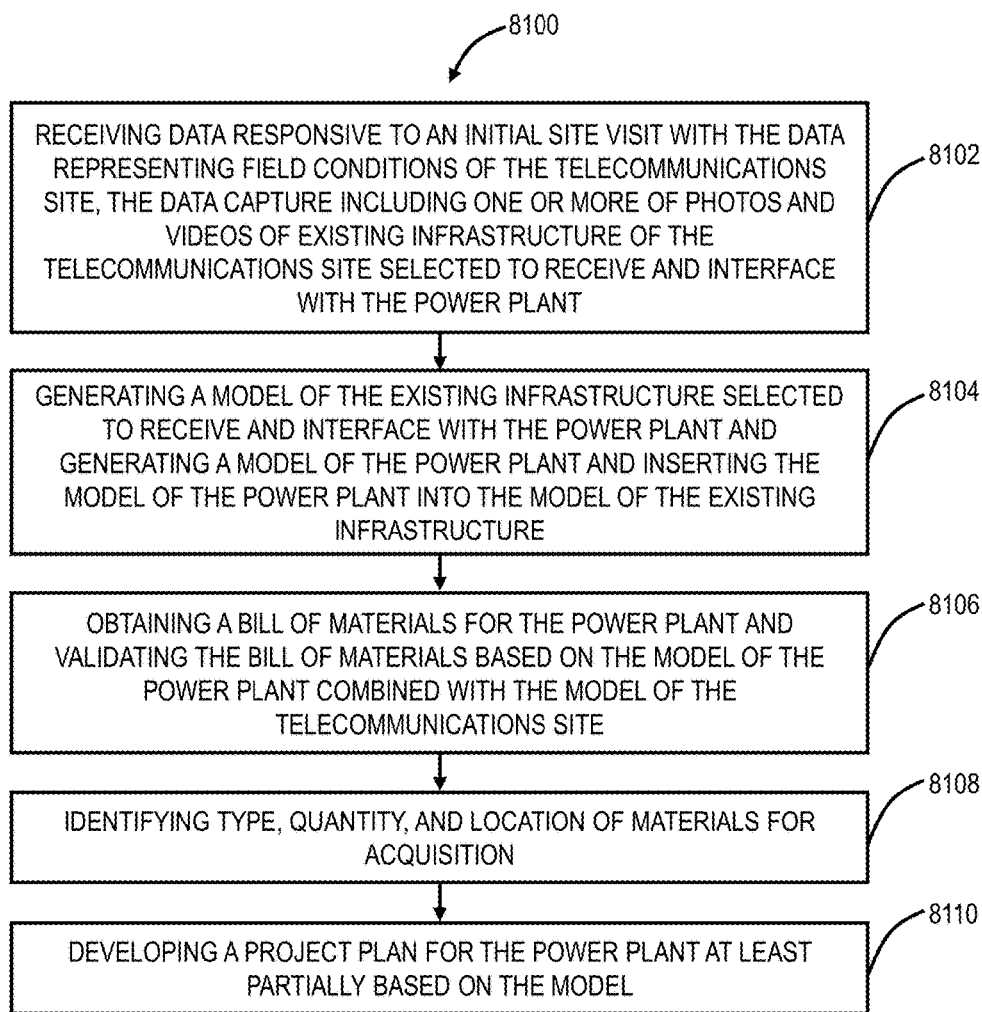
FIG. 81 is a flowchart of a method for constructing and implementing a power plant at a telecommunications site.

FIG. 81 is a flowchart of a method 8100 for constructing and implementing a power plant 53 at a telecommunications site. The method 8100 includes receiving data responsive to an initial site visit with the data representing field conditions of the telecommunications site, the data capture including one or more of photos and videos of existing infrastructure of the telecommunications site selected to receive and interface with the power plant 53 at step 8102. The method 8100 also includes generating a model of the existing infrastructure selected to receive and interface with the power plant 53 and generating a model of the power plant 53 and inserting the model of the power plant 53 into the model of the existing infrastructure at step 8104. Any of the methods for data capture and model generation disclosed herein can be used in steps 8102 and 8104.

The method 8100 further includes obtaining a bill of materials for the power plant 53 and validating the bill of materials based on the model of the power plant combined with the model of the telecommunications site at step 8106. In embodiments, the bill of materials is obtained from the customer and validated against one of the model of the existing infrastructure with the model of the power plant 53 and construction documents validated against the model of the existing infrastructure with the model of the power plant 53.

The method 8100 also includes identifying type, quantity, and location of materials for acquisition at step 8108. In some embodiments, step 8108 includes building a logistics plan for acquiring the materials and allocating the materials to the sub-contractors.

The method yet further includes developing a project plan for the power plant 53 at least partially based on the model at step 8110.

In some embodiments, the method 8100 further includes performing audits of the power plant 53. In embodiments, each audit includes generating a 3D model of a current implementation of the power plant 53 based on data collected by that includes one or more of photos and video of the power plant 53. In some embodiments, the one or more audits includes verifying that a torque mark is present at each connection of components of the power plant 53 based on the 3D model. Further, in some embodiments, the one or more audits includes verifying a hardware configuration of components of the power plant 53 based on the 3D model.

In some embodiments, the method 8100 further includes coordinating utilities for the power plant 53 with utility providers. In embodiments, coordinating the utilities for the power plant 53 with the utility providers includes validating the utility connection points and requirements against one of the model of the existing infrastructure with the model of the power plant 53 and construction documents validated against the model of the existing infrastructure with the model of the power plant 53. In embodiments, the validation is performed as part of one of the other methods disclosed herein, such as methods 7800, 7900, and 8000, which in these embodiments, are incorporated as part of the method 8100.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method for constructing and implementing a power plant at a telecommunications site, the method comprising:
   receiving data responsive to an initial site visit with the data representing field conditions of the telecommunications site, the data capture including utilizing one or more of an Unmanned Aerial Vehicle (UAV), a satellite, a camera apparatus, and a telescoping apparatus for capturing one or more of photos and videos of existing infrastructure of the telecommunications site selected to receive and interface with the power plant;
   generating a digital model of the existing infrastructure selected to receive and interface with the power plant;
   generating a digital model of the power plant and inserting the digital model of the power plant into the digital model of the existing infrastructure;
   obtaining a bill of materials for the power plant and validating the bill of materials based on the digital model of the power plant combined with the digital model of the telecommunications site;
   identifying type, quantity, and location of materials for acquisition; and
   developing a project plan for the power plant at least partially based on the digital model.

2. The method of claim 1, wherein the data is associated with a location for the power plant within the telecommunications site, and wherein the location is in at least one of a shelter, a cabinet housing, and supporting telecommunications equipment of the telecommunications site.

3. The method of claim 1, wherein identifying the type, the quantity, and the location of materials and acquiring the materials includes building a logistics plan for acquiring the materials and allocating the materials to sub-contractors.

4. The method of claim 1, wherein coordinating the utilities for the power plant with the utility providers includes validating the utility connection points and requirements against one of the model of the existing infrastructure with the model of the power plant and construction documents validated against the model of the existing infrastructure with the model of the power plant.

5. The method of claim 1, further includes performing one or more audits of the power plant.

6. The method of claim 5, wherein each audit includes generating a digital 3D model of a current implementation of the power plant based on data that includes one or more of photos and video of the power plant.

7. The method of claim 6, wherein the one or more audits includes verifying that a torque mark is present at each connection of components of the power plant based on the 3D model.

8. The method of claim 6, wherein the one or more audits includes verifying a hardware configuration of components of the power plant based on the 3D model.

9. A non-transitory computer-readable storage medium having computer readable code stored thereon for programming a computer for a power plant via steps comprising:
  receiving data responsive to an initial site visit with the data representing field conditions of the telecommunications site, the data capture including utilizing one or more of an Unmanned Aerial Vehicle (UAV), a satellite, a camera apparatus, and a telescoping apparatus for capturing one or more of photos and videos of existing infrastructure of the telecommunications site selected to receive and interface with the power plant;
  generating a digital model of the existing infrastructure selected to receive and interface with the power plant;
  generating a digital model of the power plant and inserting the model of the power plant into the model of the existing infrastructure;
  obtaining a bill of materials for the power plant and validating the bill of materials based on the digital model of the power plant combined with the digital model of the telecommunications site;
  identifying type, quantity, and location of materials for acquisition; and
  developing a project plan for the power plant at least partially based on the digital model.

10. The non-transitory computer-readable storage medium of claim 9, wherein the data is associated with a location for the power plant within the telecommunications site, and wherein the location is in at least one of a shelter, a cabinet housing, and supporting telecommunications equipment of the telecommunications site.

11. The non-transitory computer-readable storage medium of claim 9, identifying the type, the quantity, and the location of materials and acquiring the materials includes building a logistics plan for acquiring the materials and allocating the materials to sub-contractors.

12. The non-transitory computer-readable storage medium of claim 9, wherein coordinating the utilities for the power plant with the utility providers includes validating the utility connection points and requirements against one of the model of the existing infrastructure with the model of the power plant and construction documents validated against the model of the existing infrastructure with the model of the power plant.

13. The non-transitory computer-readable storage medium of claim 9, further includes performing one or more audits of the power plant.

14. The non-transitory computer-readable storage medium of claim 13, wherein each audit includes generating a digital 3D model of a current implementation of the power plant based on data that includes one or more of photos and video of the power plant.

15. The non-transitory computer-readable storage medium of claim 14, wherein the one or more audits includes verifying that a torque mark is present at each connection of components of the power plant based on the 3D model.

16. The non-transitory computer-readable storage medium of claim 14, wherein the one or more audits includes verifying a hardware configuration of components of the power plant based on the 3D model.

\* \* \* \* \*